(12) United States Patent
Asao

(10) Patent No.: US 7,091,539 B2
(45) Date of Patent: *Aug. 15, 2006

(54) MAGNETIC RANDOM ACCESS MEMORY

(75) Inventor: Yoshiaki Asao, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 30 days.

This patent is subject to a terminal disclaimer.

(21) Appl. No.: 10/971,096

(22) Filed: Oct. 25, 2004

(65) Prior Publication Data

US 2005/0087786 A1    Apr. 28, 2005

Related U.S. Application Data

(62) Division of application No. 10/796,061, filed on Mar. 10, 2004, now Pat. No. 6,844,204, which is a division of application No. 10/327,910, filed on Dec. 26, 2002, now Pat. No. 6,737,691.

(30) Foreign Application Priority Data

Oct. 16, 2002    (JP)    ............................. 2002-301940

(51) Int. Cl.
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |

(52) U.S. Cl. ................ 257/295; 257/421; 257/E27.006
(58) Field of Classification Search ..................... None
See application file for complete search history.

(56) References Cited

U.S. PATENT DOCUMENTS

| 5,659,499 | A | * | 8/1997 | Chen et al. ................. 365/158 |
| 5,956,267 | A | * | 9/1999 | Hurst et al. ................. 365/158 |
| 6,174,737 | B1 | * | 1/2001 | Durlam et al. ................. 438/3 |
| 6,211,090 | B1 | * | 4/2001 | Durlam et al. ............. 438/692 |
| 6,417,561 | B1 | * | 7/2002 | Tuttle ......................... 257/659 |

(Continued)

FOREIGN PATENT DOCUMENTS

JP        2002-110938        4/2002

OTHER PUBLICATIONS

R. Scheuerlein, et al., ISSCC 2000/Session 7/TD: Emerging Memory Device and Technologies/Paper TA 7.2, pp. 128-129, 94-95, 409-410, "A 10ns Read and Write Non-Volatile Memory Array Using a Magnetic Tunnel Junction and FET Switch in Each Cell", 2000.

*Primary Examiner*—Andy Huynh
*Assistant Examiner*—Hoang-Quan Ho
(74) *Attorney, Agent, or Firm*—Oblon, Spivak, McClelland, Maier & Neustadt, P.C.

(57) ABSTRACT

A data selection line (write line) is disposed right on a MTJ element. Upper and side surfaces of the data selection line are coated with yoke materials which have a high permeability. The yoke materials are separated from each other by a barrier layer. Similarly, a write word line is disposed right under the MTJ element. The lower and side surfaces of the write word line are also coated with the yoke materials which have the high permeability. The yoke materials on the lower and side surfaces of the write word line are also separated from each other by the barrier layer.

20 Claims, 37 Drawing Sheets

U.S. PATENT DOCUMENTS

| | | | |
|---|---|---|---|
| 6,525,957 B1 * | 2/2003 | Goronkin et al. | 365/158 |
| 6,548,849 B1 * | 4/2003 | Pan et al. | 257/296 |
| 6,555,858 B1 * | 4/2003 | Jones et al. | 257/295 |
| 6,737,691 B1 * | 5/2004 | Asao | 257/295 |
| 6,765,821 B1 * | 7/2004 | Saito et al. | 365/158 |
| 6,868,002 B1 * | 3/2005 | Saito et al. | 365/158 |
| 6,958,503 B1 * | 10/2005 | Motoyoshi | 257/295 |
| 6,965,138 B1 * | 11/2005 | Nakajima et al. | 257/295 |

* cited by examiner

MTJ (MAGNETIC TUNNEL JUNCTION) ELEMENT

PARALLEL
(LOW RESISTANCE)

ANTI-PARALLEL
(HIGH RESISTANCE)

TMR EFFECT

TMR CURVE    EASY-AXIS FIELD (Oe)

ASTROID CURVE

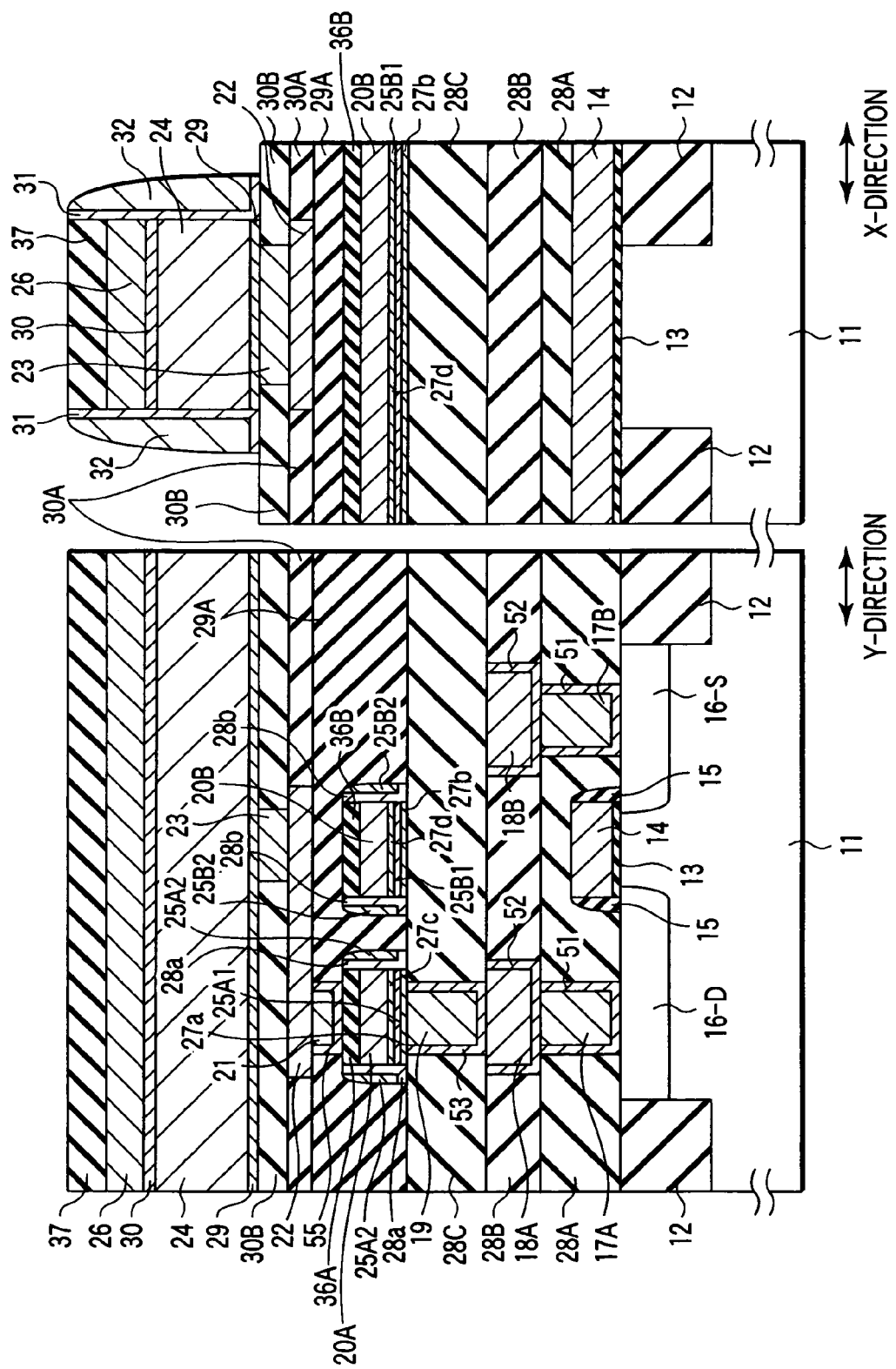
F I G. 34

X-DIRECTION

MAGNETIC RANDOM ACCESS MEMORY

CROSS-REFERENCE TO RELATED APPLICATIONS

This application is a division of and claims the benefit of priority under 35 USC §120 from U.S. Ser. No. 10/796,061, filed Mar. 10, 2004 now U.S. Pat. No. 6,844,204, which is a division of Ser. No. 10/327,910 filed on Dec. 26, 2002, now U.S. Pat. No. 6,737,691, issued May 18, 2004, and is based upon and claims the benefit of priority under 35 USC §119 from the prior Japanese Patent Application No. 2002-301940, filed Oct. 16, 2002, the entire contents of which are incorporated herein by reference.

BACKGROUND OF THE INVENTION

1. Field of the Invention

The present invention relates to a magnetic random access memory (MRAM) in which a MTJ (Magnetic Tunnel Junction) element for storing "1", "0"-information by a TMR effect is used to constitute a memory cell.

2. Description of the Related Art

In recent years, a large number of memories in which information is stored by a new principle have been proposed. Among the memories, there is a memory which uses a tunneling magneto resistive (hereinafter referred to as TMR) effect proposed by Roy Scheuerlein et al. (refer to ISSCC2000 Technical Digest p. 128 "A 10 ns Read and Write Non-Volatile Memory Array Using a Magnetic Tunnel Junction and FET Switch in each Cell").

In a magnetic random access memory, a MTJ element stores "1", "0"-information. As shown in FIG. 1, the MTJ element includes a structure in which an insulating layer (tunneling barrier) is held by two magnetic layers (ferromagnetic layers). The information to be stored in the MTJ element is judged by judging whether or not directions of spin of two magnetic layers are parallel or anti-parallel.

Here, as shown in FIG. 2, "parallel" means that the directions of spin of two magnetic layers (direction of magnetization) are the same, and "anti-parallel" means that the directions of spin of two magnetic layers are opposite to each other (the directions of arrows indicate the directions of spin).

It is to be noted that an anti-ferromagnetic layer is usually disposed in one of two magnetic layers. The anti-ferromagnetic layer is a member for fixing the spin direction of one magnetic layer and changing only the spin direction of the other magnetic layer to easily rewrite the information.

The magnetic layer whose spin direction is fixed is referred to as a fixed or pinned layer. Moreover, the magnetic layer whose spin direction can freely be changed in accordance with write data is referred to as a free or storage layer.

As shown in FIG. 2, when the spin directions of two magnetic layers are parallel to each other, tunnel resistance of the insulating layer (tunneling barrier) held between two magnetic layers is lowest. This state is a "1"-state. Moreover, when the spin directions of two magnetic layers are anti-parallel, the tunnel resistance of the insulating layer (tunneling barrier) held between two magnetic layers is highest. This state is a "0"-state.

A write operation principle with respect to the MTJ element will next briefly be described with reference to FIG. 3.

The MTJ element is disposed in an intersection of a write word line and data selection line (read/write bit line) which intersect with each other. Moreover, the write is achieved by passing a current into the write word line and data selection line, and using a magnetic field formed by the current flowing through both wires to set the spin direction of the MTJ element to be parallel or anti-parallel.

For example, when a magnetization easy axis of the MTJ element is an X-direction, the write word line extends in the X-direction, and the data selection line extends in a Y-direction crossing at right angles to the X-direction, a current directed in one direction is passed through the write word line at a write time, and a current directed in one or the other direction is passed through the data selection line in accordance with the write data.

When the current directed in one direction is passed through the data selection line, the spin direction of the MTJ element becomes parallel ("1"-state). On the other hand, when the current directed in the other direction is passed through the data selection line, the spin direction of the MTJ element becomes anti-parallel ("0"-state).

A mechanism in which the spin direction of the MTJ element changes is as follows.

When a magnetic field Hx is applied in a long-side (easy-axis) direction of the MTJ element as shown by a TMR curve of FIG. 4, the resistance value of the MTJ element changes, for example, by about 17%. This change ratio, that is, a ratio of the resistance values before and after the change is referred to as an MR ratio.

It is to be noted that the MR ratio changes by properties of the magnetic layer. At present, the MTJ element whose MR ratio is about 50% is obtained.

A synthetic magnetic field of the magnetic field Hx of an easy-axis direction and magnetic field Hy of a hard-axis direction is applied to the MTJ element. As shown by a solid line of FIG. 5, the size of the magnetic field Hx of the easy-axis direction necessary for changing the resistance value of the MTJ element also changes by the size of the magnetic field Hy of the hard-axis direction. This phenomenon can be used to write data only into the MTJ element which exists in the intersection of the selected write word line and data selection line among memory cells arranged in an array form.

This state will further be described with reference to Astroid curve of FIG. 5.

The Astroid curve of the MTJ element is shown, for example, by a solid line of FIG. 5. That is, when the size of the synthetic magnetic field of the magnetic field Hx of the easy-axis direction and the magnetic field Hy of the hard-axis direction is outside the Astroid curve (solid line) (e.g., in positions of black circles), the spin direction of the magnetic layer can be reversed.

Conversely, when the size of the synthetic magnetic field of the magnetic field Hx of the easy-axis direction and the magnetic field Hy of the hard-axis direction is inside the Astroid curve (solid line) (e.g., in positions of white circles), the spin direction of the magnetic layer cannot be reversed.

Therefore, when the sizes of the magnetic field Hx of the easy-axis direction and the magnetic field Hy of the hard-axis direction are changed, and the position of the size of the synthetic magnetic field in an Hx-Hy plane is changed, the write of the data with respect to the MTJ element can be controlled.

A read operation can easily be performed by passing a current through the selected MTJ element, and detecting the resistance value of the MTJ element.

For example, a switch element is connected in series to the MTJ element, and only the switch element connected to a selected read word line is turned on to form a current path.

As a result, since the current flows only through the selected MTJ element, the data of the MTJ element can be read out.

In the magnetic random access memory, as described above, the data write is performed by passing the write current through the write word line and data selection line (read/write bit line) and allowing a synthetic magnetic field Hx+Hy generated thereby to act on the MTJ element.

Therefore, to efficiently perform the data write, it is important to efficiently apply the synthetic magnetic field Hx+Hy to the MTJ element. When the synthetic magnetic field Hx+Hy is efficiently applied to the MTJ element, reliability of the write operation is enhanced, further a write current is reduced, and low power consumption can be realized.

However, an effective device structure for allowing the synthetic magnetic field Hx+Hy generated by the write currents flowing through the write word line and data selection line to efficiently act on the MTJ element has not been sufficiently studied. That is, for the device structure, it naturally needs to be studied whether the synthetic magnetic field Hx+Hy is actually efficiently applied to the MTJ element. Furthermore, in a manufacturing process aspect, it needs to be studied whether or not the structure can easily be manufactured.

In recent years, as a technique of efficiently applying the magnetic fields Hx, Hy to the MTJ element, the device structure has been studied in which a yoke material having a function of suppressing spread of the magnetic field is disposed around a write line (refer to U.S. Pat. No. 6,174,737).

The yoke material has high permeability, and magnetic flux has a property of being concentrated on a material which has the high permeability. Therefore, when the yoke material is used as a traction material of a magnetic force line, the magnetic fields Hx, Hy generated by the write current flowing through the write line can efficiently be concentrated on the MTJ element at a write operation time.

The yoke material has a function of suppressing the spread of the magnetic field as described above. This is based on a prerequisite that film thickness and magnetic domain of the yoke material are accurately controlled. That is, when dispersion is generated in the film thickness of the yoke material arranged around the write line, and the magnetic domain is not orderly aligned, an effect of the yoke material in bunching a magnetic force line is reduced, and it becomes impossible to efficiently apply the magnetic fields Hx, Hy to the MTJ element.

BRIEF SUMMARY OF THE INVENTION

According to one aspect of the present invention, there is provided a magnetic random access memory comprising: a memory cell which uses a magneto resistive effect to store data; a first write line which is disposed right on the memory cell and which extends in a first direction; a second write line which is disposed right under the memory cell and which extends in a second direction intersecting with the first direction; a first yoke material with which an upper surface of the first write line is coated; a second yoke material with which a side surface of the first write line is coated; and a first barrier layer which is disposed between the first yoke material and first write line and between the second yoke material and first write line and which separates the first yoke material from the second yoke material.

According to another aspect of the present invention, there is provided a magnetic random access memory comprising: a memory cell which uses a magneto resistive effect to store data; a first write line which is disposed right on the memory cell and which extends in a first direction; a second write line which is disposed right under the memory cell and which extends in a second direction intersecting with the first direction; a first yoke material with which a lower surface of the second write line is coated; a second yoke material with which a side surface of the second write line is coated; and a first barrier layer which is disposed between the first yoke material and first write line and between the second yoke material and first write line and which separates the first yoke material from the second yoke material.

According to further aspect of the present invention, there is provided a manufacturing method of a magnetic random access memory, comprising: a step of forming a first yoke material on an insulating layer on a semiconductor substrate; a step of forming a conductive material on the first yoke material; a step of patterning the conductive material and first yoke material to form a write line whose lower surface is coated with the first yoke material; a step of forming a first barrier layer with which the write line is coated; a step of forming a second yoke material with which the write line is coated on the first barrier layer; a step of etching the first barrier layer and second yoke material to allow the first barrier layer and second yoke material to remain on the side surface of the write line; and a step of forming a memory cell which uses a magneto resistive effect to store data right on the first write line.

According to still further aspect of the present invention, there is provided a manufacturing method of a magnetic random access memory, comprising: a step of forming a memory cell which uses a magneto resistive effect to store data on an insulating layer on a semiconductor substrate; a step of forming a conductive material right on the memory cell; a step of forming a first yoke material on the conductive material; a step of patterning the first yoke material and conductive material to form a write line whose upper surface is coated with the first yoke material; a step of forming a first barrier layer with which the write line is coated; a step of forming a second yoke material with which the write line is coated on the first barrier layer; and a step of etching the first barrier layer and second yoke material to allow the first barrier layer and second yoke material to remain on the side surface of the write line.

BRIEF DESCRIPTION OF THE SEVERAL VIEWS OF THE DRAWING

FIG. 34 is a sectional view showing one step of the manufacturing method of the memory according to the third embodiment;

DETAILED DESCRIPTION OF THE INVENTION

A magnetic random access memory according to embodiments of the present invention will be described hereinafter in detail with reference to the drawings.

1. FIRST REFERENCE EXAMPLE

A device structure as a prerequisite of the present invention will first be described before the magnetic random access memory according to an example of the present invention.

It is to be noted that the device structure is described for ease of understanding of the embodiment of the present invention, and the present invention is not limited to the device structure.

Figure 6:
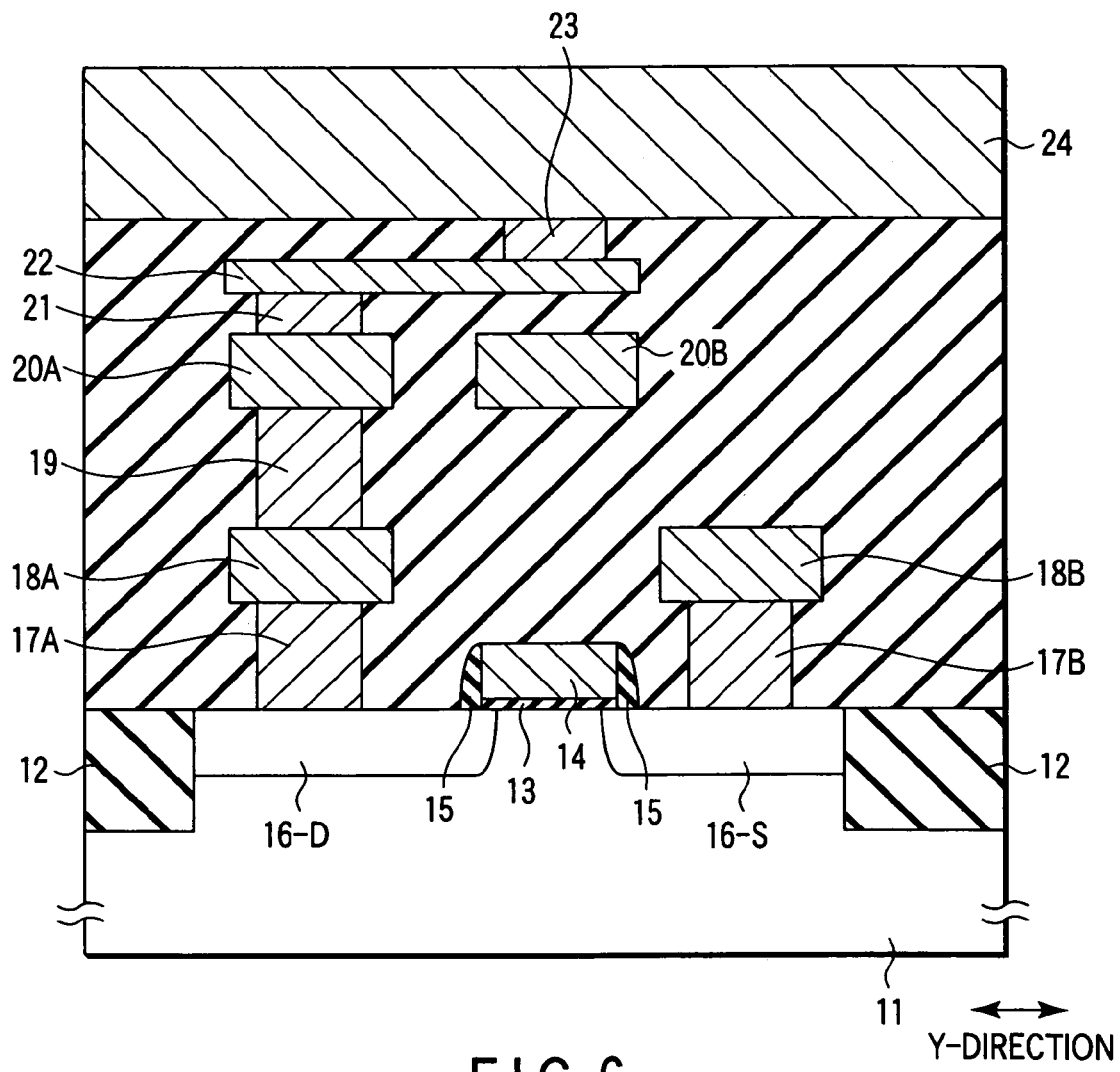
FIG. 6 is a sectional view of the magnetic random access memory according to a first reference example.
Figure 7:
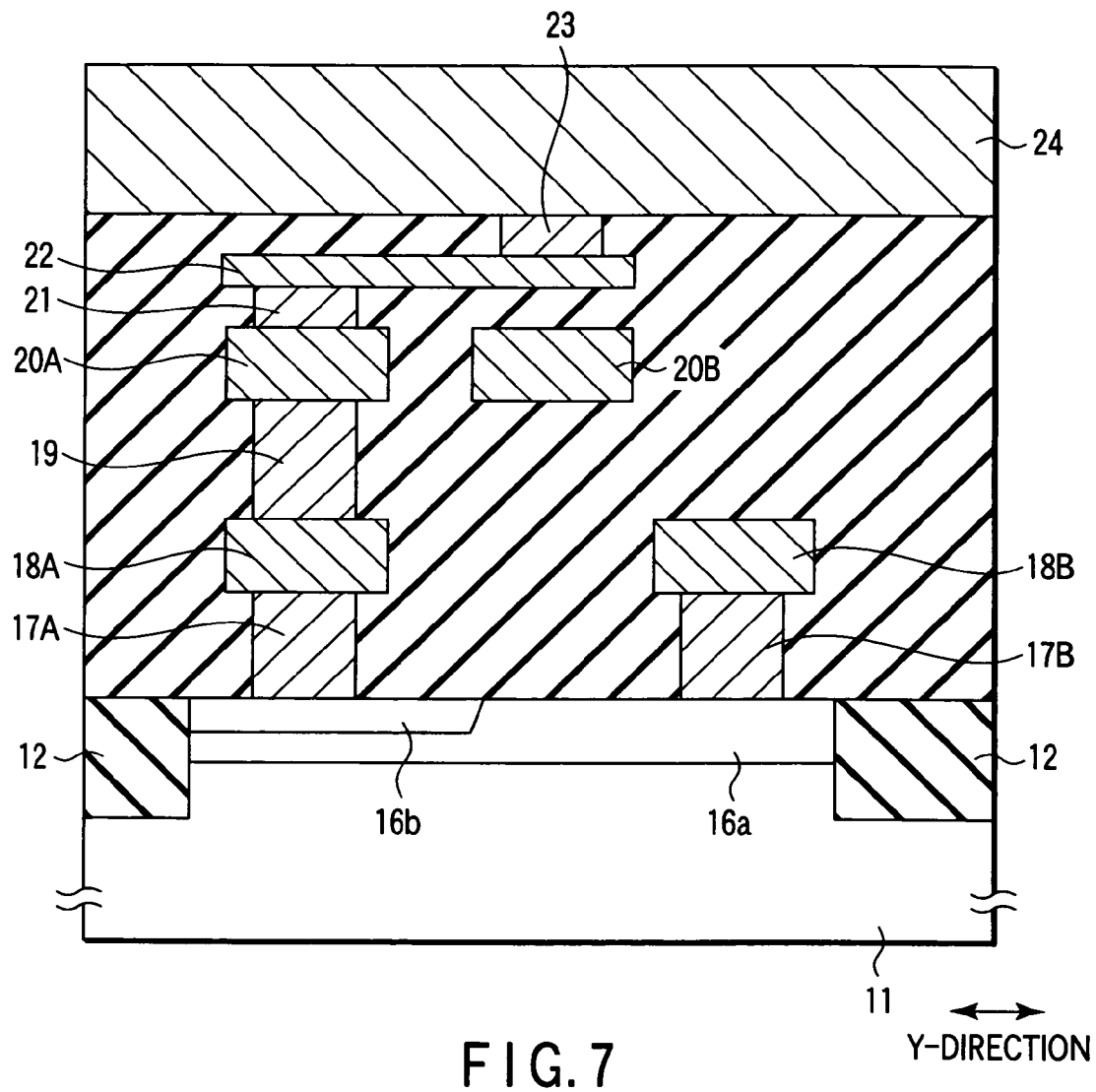
FIG. 7 is a sectional view of the magnetic random access memory according to the first reference example.

FIGS. 6 and 7 show the device structure as the prerequisite of the example of the present invention.

Element separation insulating layers 12 including a shallow trench isolation (STI) structure are formed in a semiconductor substrate (e.g., a p-type silicon substrate, p-type well region, and the like) 11. A region surrounded with the element separation insulating layers 12 is an element region in which a read selection switch (e.g., MOS transistor, diode, and the like) is formed.

In the device structure of FIG. 6, the read selection switch is constituted of an MOS transistor (n-channel type MOS transistor). A gate insulating layer 13, gate electrode 14, and side wall insulating layers 15 are formed on the semiconductor substrate 11. The gate electrode 14 extends in an X-direction, and functions as a read word line for selecting a read cell (MTJ element) at a read operation time.

A source region (e.g., n-type diffusion layer) 16-S and drain region (e.g., n-type diffusion layer) 16-D are formed in the semiconductor substrate 11. The gate electrode (read word line) 14 is disposed in a channel region between the source region 16-S and drain region 16-D.

In the device structure of FIG. 7, the read selection switch is constituted of the diode. A cathode region (e.g., n-type diffusion layer) 16a and anode region (e.g., p-type diffusion layer) 16b are formed in the semiconductor substrate 11.

One of metal layers constituting a first metal wiring layer functions as an intermediate layer 18A for vertically stacking a plurality of contact plugs, and another layer functions as a source line 18B (in FIG. 6) or read word line 18B (in FIG. 7).

In the device structure of FIG. 6, the intermediate layer 18A is electrically connected to the drain region 16-D of the read selection switch (MOS transistor) by a contact plug 17A. The source line 18B is electrically connected to the source region 16-S of the read selection switch via a contact plug 17B. The source line 18B extends in an X-direction similarly as the gate electrode (read word line) 14.

In the device structure of FIG. 7, the intermediate layer 18A is electrically connected to the anode region 16b of the read selection switch (diode) by the contact plug 17A. The read word line 18B is electrically connected to the cathode region 16*a* of the read selection switch via the contact plug 17B. The read word line 18B extends in the X-direction.

One of metal layers constituting a second metal wiring layer functions as an intermediate layer 20A for vertically stacking a plurality of contact plugs, and another layer functions as a read word line 20B. The intermediate layer 20A is electrically connected to the intermediate layer 18A by a contact plug 19. The read word line 20B extends, for example, in the X-direction.

One of metal layers constituting a third metal wiring layer functions as a lower electrode 22 of a MTJ element 23. The lower electrode 22 is electrically connected to the intermediate layer 20A by a contact plug 21. The MTJ element 23 is mounted on the lower electrode 22. Here, the MTJ element 23 is disposed right on the write word line 20B, and formed in a rectangular shape long in the X-direction (magnetization easy axis is the X-direction).

One of metal layers constituting a fourth metal wiring layer functions as a data selection line (read/write bit line) 24. The data selection line 24 is electrically connected to the MTJ element 23, and extends in a Y-direction.

Figure 1:
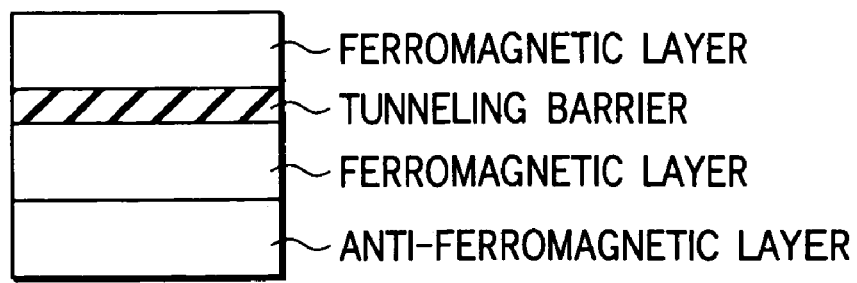
FIG. 1 is a diagram showing a structure example of a MTJ element.
Figure 2:
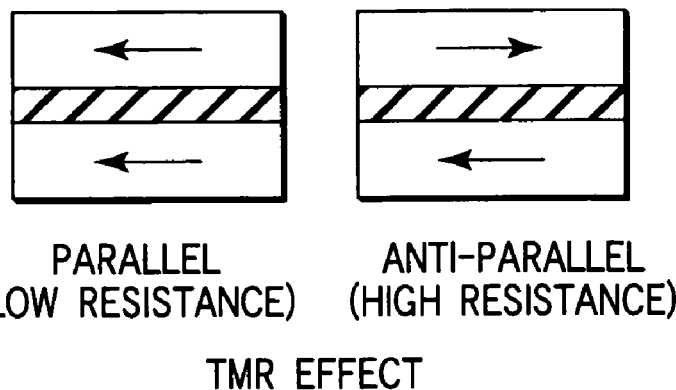
FIG. 2 is a diagram showing two states of the MTJ element.
Figure 3:
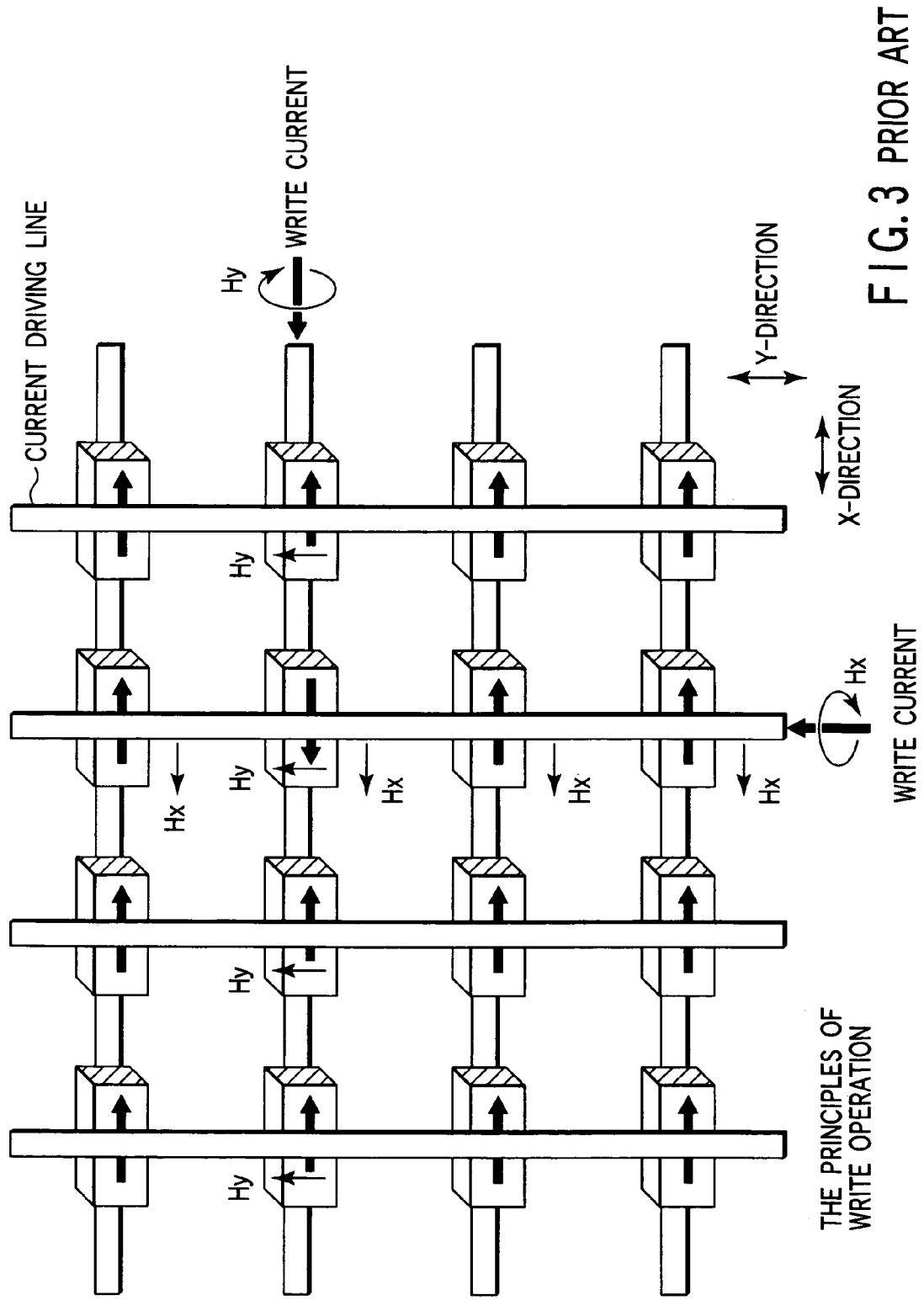
FIG. 3 is a diagram showing a write operation principle of a magnetic random access memory.
Figure 4:
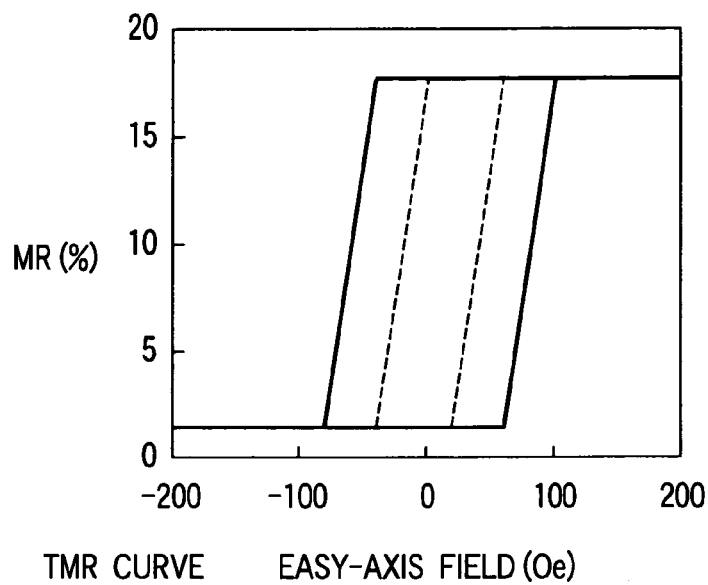
FIG. 4 is a diagram showing a TMR curve.
Figure 5:
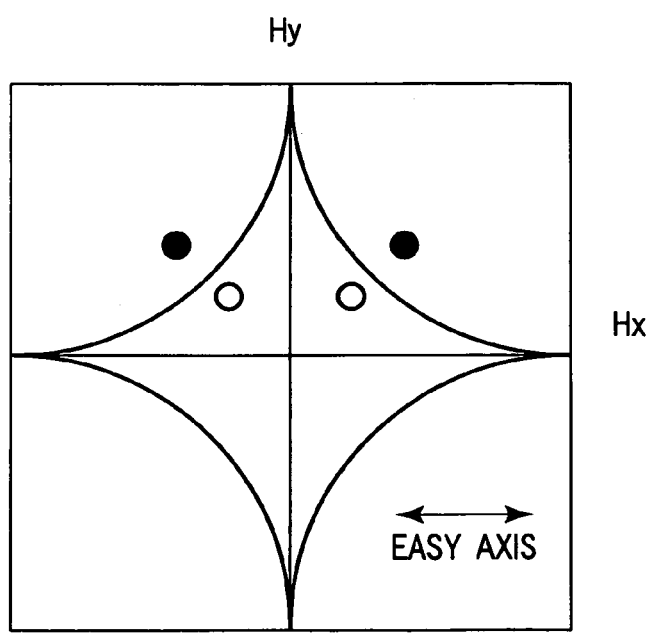
FIG. 5 is a diagram showing an Astroid curve.

It is to be noted that the structure of the MTJ element 23 is not especially limited. The structure may be the structure shown in FIG. 1 or any other structure. Moreover, the MTJ element 23 may also be of a multi-valued storage type in which data of a plurality of bits can be stored.

A ferromagnetic layer of the MTJ element 23 is not especially limited, and examples of a usable material include Fe, Co, Ni or an alloy of these metals, magnetite in spin polarization ratio, oxides such as $CrO_2$, $RXMnO_{3-y}$ (R: rare earth metals, X: Ca, Ba, Sr), and Heusler alloys such as NiMnSb, PtMnSb.

Even with the ferromagnetic layer which contains some amount of nonmagnetic elements such as Ag, Cu, Au, Al, Mg, Si, Bi, Ta, B, C, O, N, Pd, Pt, Zr, Ir, W, Mo, Nb, as long as ferromagnetism is not lost, there is not any problem.

If the ferromagnetic layer becomes excessively thin, super-paramagnetism results. To solve the problem, the ferromagnetic layer needs to have a thickness to such an extent that at least the super-paramagnetism does not result. Concretely, the thickness of the ferromagnetic layer is set to 0.1 nm or more, preferably in a range of 0.4 nm to 100 nm.

As an anti-ferromagnetic layer of the MTJ element 23, for example, Fe—Mn, Pt—Mn, Pt—Cr—Mn, Ni—Mn, Ir—Mn, NiO, $Fe_2O_3$, and the like can be used.

As an insulating layer (tunneling barrier) of the MTJ element 23, dielectric materials such as $Al_2O_3$, $SiO_2$, MgO, AlN, $Bi_2O_3$, $MgF_2$, $CaF_2$, $SrTiO_2$, and $AlLaO_3$ can be used. Even when there is oxygen loss, nitrogen loss, or fluorine loss in these materials, there is no problem.

The thickness of the insulating layer (tunneling barrier) is preferably as small as possible, but there is not especially a determined limitation for realizing the function. Additionally, the thickness of the insulating layer is set to 10 nm or less in a manufacturing process.

2. SECOND REFERENCE EXAMPLE

A device structure proposed with respect to the device structure of the first reference example in order to efficiently concentrate the magnetic field on the MTJ element will next be described.

Figure 8:
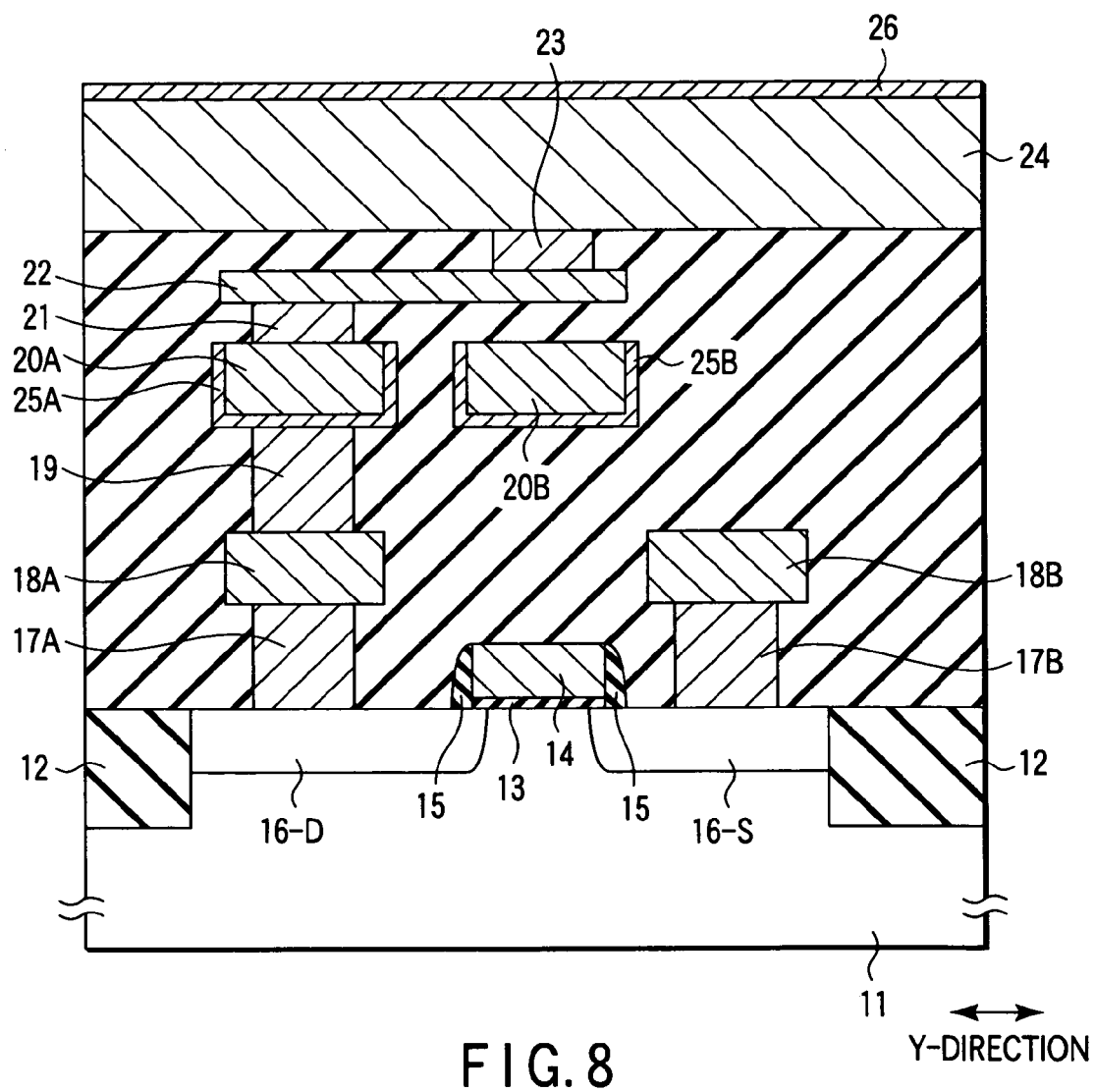
FIG. 8 is a sectional view of the magnetic random access memory according to a second reference example.
Figure 9:
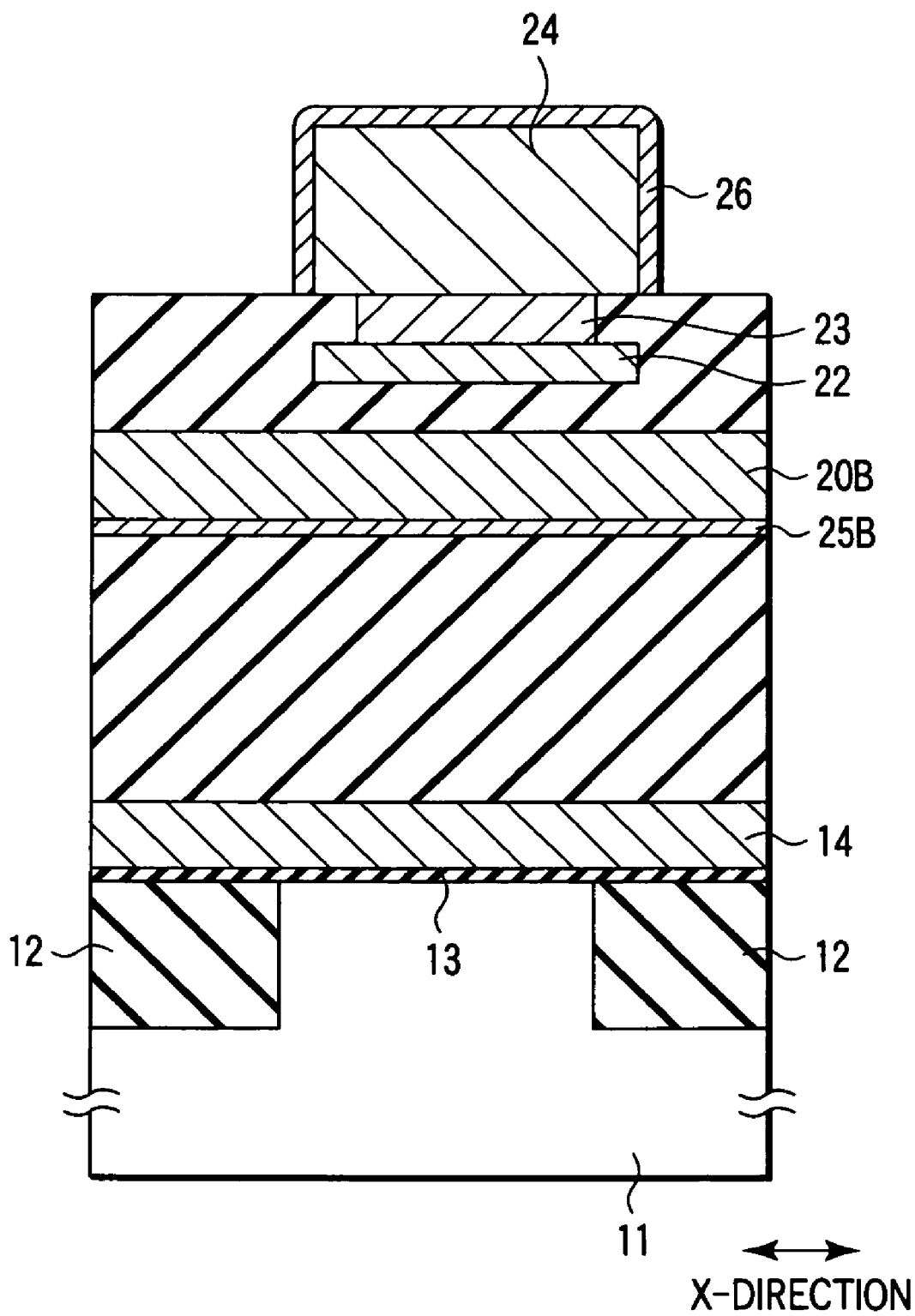
FIG. 9 is a sectional view of the magnetic random access memory according to the second reference example.

FIGS. 8 and 9 show the device structure as the prerequisite of the example of the present invention. It is to be noted that FIG. 8 shows a section of the Y-direction, and FIG. 9 shows a section of the X-direction of a MTJ element portion of FIG. 8. The X-direction crosses at right angles to the Y-direction.

The element separation insulating layers 12 including the STI structure are formed in the semiconductor substrate (e.g., the p-type silicon substrate, p-type well region, and the like) 11. The region surrounded with the element separation insulating layers 12 is the element region in which the read selection switch (e.g., MOS transistor) is formed.

In the device structure of the example, the read selection switch is constituted of the MOS transistor (n-channel type MOS transistor). The gate insulating layer 13, gate electrode 14, and side wall insulating layers 15 are formed on the semiconductor substrate 11. The gate electrode 14 extends in the X-direction, and functions as the read word line for selecting the read cell (MTJ element) at the read operation time.

The source region (e.g., n-type diffusion layer) 16-S and drain region (e.g., n-type diffusion layer) 16-D are formed in the semiconductor substrate 11. The gate electrode (read word line) 14 is disposed on the channel region between the source region 16-S and drain region 16-D.

One of the metal layers constituting the first metal wiring layer functions as the intermediate layer 18A for vertically stacking a plurality of contact plugs, and another layer functions as the source line 18B.

The intermediate layer 18A is electrically connected to the drain region 16-D of the read selection switch (MOS transistor) by the contact plug 17A. The source line 18B is electrically connected to the source region 16-S of the read selection switch via the contact plug 17B. The source line 18B extends in the X-direction similarly as the gate electrode (read word line) 14.

One of the metal layers constituting the second metal wiring layer functions as the intermediate layer 20A for vertically stacking a plurality of contact plugs, and another layer functions as the write word line 20B. The intermediate layer 20A is electrically connected to the intermediate layer 18A by the contact plug 19. The write word line 20B extends, for example, in the X-direction similarly as the gate electrode (read word line) 14.

In the device structure of the present example, the lower and side surfaces of the intermediate layer 20A and write word line 20B are coated with the material having the high permeability, that is, yoke materials 25A, 25B. The yoke materials 25A, 25B for use herein are limited to the materials which have conductivity.

A magnetic flux has a property of being concentrated on the material which has the high permeability. Therefore, when the material having the high permeability is used as a traction material of a magnetic force line, a magnetic field Hy generated by a write current flowing through the write word line 20B can efficiently be concentrated on the MTJ element 23 at a write operation time.

The present object can sufficiently be achieved, when the lower and side surfaces of the write word line 20B are coated with the yoke material. Additionally, in actual, the yoke materials are formed on the lower and side surfaces of the intermediate layer 20A. This is because the intermediate layer 20A and write word line 20B are simultaneously formed as the second metal wiring layer.

One of the metal layers constituting the third metal wiring layer functions as the lower electrode 22 of the MTJ element 23. The lower electrode 22 is electrically connected to the intermediate layer 20A by the contact plug 21. The MTJ element 23 is mounted on the lower electrode 22. Here, the MTJ element 23 is disposed right on the write word line 20B, and formed in the rectangular shape long in the X-direction (magnetization easy axis is the X-direction).

One of the metal layers constituting the fourth metal wiring layer functions as the data selection line (read/write bit line) 24. The data selection line 24 is electrically connected to the MTJ element 23, and extends in the Y-direction.

In the device structure of the present example, the upper and side surfaces of the data selection line 24 are coated with the material having the high permeability, that is, a yoke material 26. As shown in FIGS. 8 and 9, the yoke material 26 for use herein can be constituted of a material which has conductivity, or may also be constituted of a material which has insulation property.

The yoke material 26 can be constituted of, for example, NiFe, CoFe, amorphous-CoZrNb, FeAlSi, FeNx, and the like.

As described above, the magnetic flux has the property of being concentrated on the material which has the high permeability. Therefore, when the material having the high permeability is used as the traction material of the magnetic force line, a magnetic field Hx generated by the write current flowing through the data selection line 24 can efficiently be concentrated on the MTJ element 23 at the write operation time.

It is to be noted that the structure of the MTJ element 23 is not especially limited. The structure may be the structure shown in FIG. 1 or any other structure. Moreover, the MTJ element 23 may also be of the multi-valued storage type in which data of a plurality of bits can be stored.

In this device structure, the yoke material 25B is formed on the lower and side surfaces of the write word line 20B disposed right under the MTJ element 23. Moreover, the yoke material 26 is formed on the upper and side surfaces of the data selection line (read/write bit line) 24 disposed right on the MTJ element 23.

However, in this case, the yoke material 25B around the write word line 20B is also formed in a lower corner portion, and the yoke material 26 around the data selection line 24 is also formed in an upper corner portion.

For the yoke materials 25B, 26 of the corner portions of the write word line 20B and data selection line 24, it is very difficult to control the film thickness in a manufacturing time (e.g., sputtering time), and this causes disorder in arrangement of magnetic domain of the yoke materials 25B, 26. As a result, convergence effect of the magnetic field by the yoke materials 25B, 26 is reduced, and it becomes impossible to efficiently supply the magnetic field to the MTJ element.

3. FIRST EMBODIMENT

Embodiments of the present invention will next be described based on the above-described first and second reference examples. The embodiment of the present invention relates to the device structure of the magnetic random access memory in which the magnetic domain of the yoke material disposed around the write line can easily be controlled and the magnetic field can efficiently be concentrated on the MTJ element.

(1) Structure

Figure 10:
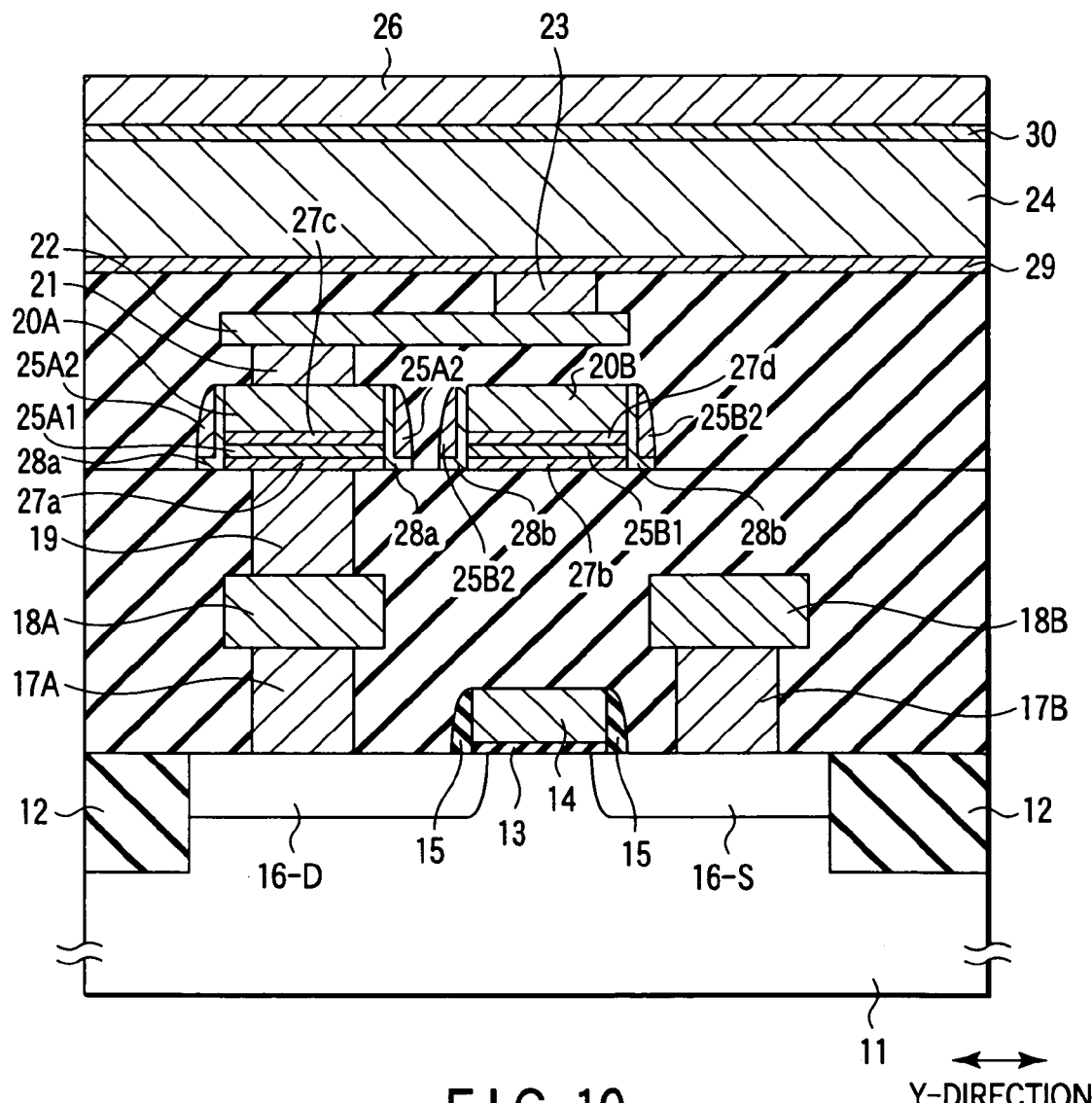
FIG. 10 is a sectional view of the magnetic random access memory according to a first embodiment.
Figure 11:
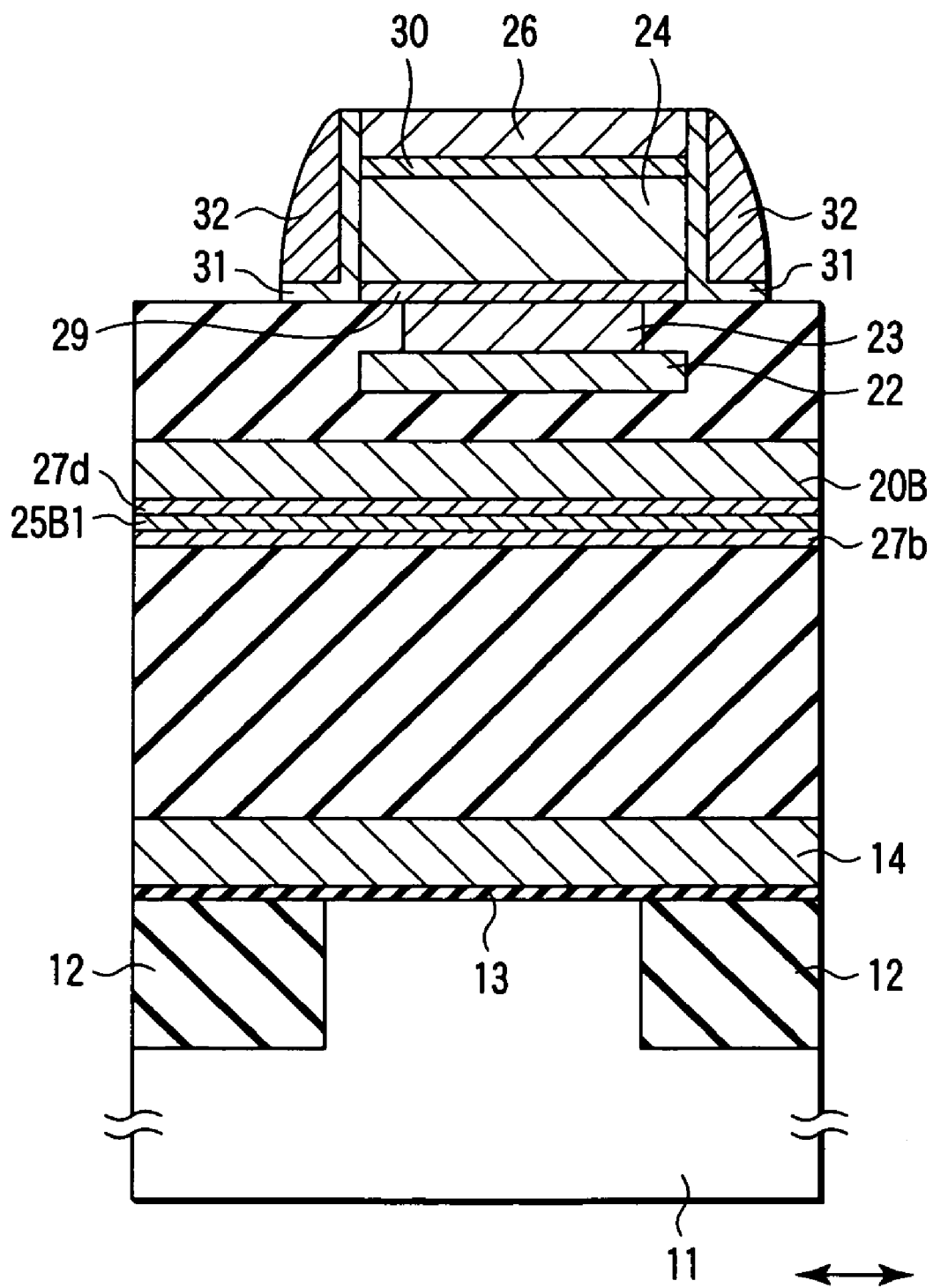
FIG. 11 is a sectional view of the magnetic random access memory according to the first embodiment.

FIGS. 10 and 11 show the device structure of the magnetic random access memory according to a first embodiment of the present invention. It is to be noted that FIG. 10 shows the section of the Y-direction, and FIG. 11 shows the section of the X-direction of the MTJ element portion of FIG. 10. The X-direction crosses at right angles to the Y-direction.

The device structure of the present embodiment is characterized in that the yoke material disposed on the lower or upper surface of the write line is separated from the yoke material disposed on the side surface of the write line by a barrier layer and the yoke material extending to the side surface from the lower or upper surface is prevented from being formed on the corner portion of the write line.

That is, the magnetic domain control of the yoke material disposed on the lower or upper surface of the write line and the magnetic domain control of the yoke material disposed on the side surface of the write line are separately performed, thereby the magnetic domain control of the yoke material around the write line is facilitated, and the application efficiency of the magnetic field with respect to the MTJ element is enhanced.

The element separation insulating layers 12 including the STI structure are formed in the semiconductor substrate (e.g., the p-type silicon substrate, p-type well region, and the like) 11. The region surrounded with the element separation insulating layers 12 is the element region in which the read selection switch is formed.

The read selection switch is constituted of the MOS transistor (n-channel type MOS transistor). The gate insulating layer 13, gate electrode 14, and side wall insulating layers 15 are formed on the semiconductor substrate 11. The gate electrode 14 extends in the X-direction, and functions as the read word line for selecting the read cell (MTJ element) at the read operation time.

The source region (e.g., n-type diffusion layer) 16-S and drain region (e.g., n-type diffusion layer) 16-D are formed in the semiconductor substrate 11. The gate electrode (read word line) 14 is disposed on the channel region between the source region 16-S and drain region 16-D.

One of the metal layers constituting the first metal wiring layer functions as the intermediate layer 18A for vertically stacking a plurality of contact plugs, and another layer functions as the source line 18B.

The intermediate layer 18A is electrically connected to the drain region 16-D of the read selection switch (MOS transistor) by the contact plug 17A. The source line 18B is electrically connected to the source region 16-S of the read selection switch via the contact plug 17B. The source line 18B extends in the X-direction, for example, similarly as the gate electrode (read word line) 14.

One of the metal layers constituting the second metal wiring layer functions as the intermediate layer 20A for vertically stacking a plurality of contact plugs, and another layer functions as the write word line 20B. The intermediate layer 20A is electrically connected to the intermediate layer 18A by the contact plug 19. The write word line 20B extends, for example, in the X-direction similarly as the gate electrode (read word line) 14.

The lower surfaces of the intermediate layer 20A and write word line 20B are coated with the material having the high permeability, that is, yoke materials 25A1, 25B1. The yoke materials 25A1, 25B1 for use herein are limited to the materials which have conductivity.

Barrier metals (e.g., Ti, TiN or a lamination of these) 27a, 27b are formed right under the yoke materials 25A1, 25B1, and barrier metals (e.g., Ti, TiN or the lamination of these) 27c, 27d are formed right on the barrier metals. That is, the yoke materials 25A1, 25B1 are held between the barrier metals 27a, 27b, 27c, 27d.

The barrier metals 27a, 27b, 27c, 27d prevent atoms constituting the yoke materials 25A1, 25B1 from being diffused.

Moreover, the side surfaces of the intermediate layer 20A and read word line 20B are also coated with the materials which have high permeability, that is, yoke materials 25A2, 25B2. Here, the yoke materials 25A2, 25B2 for use herein may have either conductivity or insulation property.

When the yoke materials 25A1, 25B1, 25A2, 25B2 are used as the traction material of the magnetic force line, the magnetic field Hy generated by the write current flowing through the write word line 20B can efficiently be concentrated on the MTJ element 23.

Barrier layers 28a, 28b (e.g., Ti, TiN or the lamination of these, or Ta, TaN or the lamination of these) are formed on the side surfaces of the intermediate layer 20A and write word line 20B. The barrier layers 28a, 28b separate the yoke materials 25A1, 25B1 with which the lower surfaces of the intermediate layer 20A and write word line 20B are coated from the yoke materials 25A2, 25B2 with which the side surfaces are coated.

The barrier layers 28a, 28b may have either the conductivity or insulation property. Moreover, the barrier layers 28a, 28b may have the same functions as those of the barrier metals 27a, 27b. In this case, since the barrier layers 28a, 28b sufficiently fulfill a diffusion prevention function of atoms, each of the layers preferably has a thickness of at least about 20 nm.

One of the metal layers constituting the third metal wiring layer functions as the lower electrode 22 of the MTJ element 23. The lower electrode 22 is electrically connected to the intermediate layer 20A by the contact plug 21. The MTJ element 23 is mounted on the lower electrode 22. Here, the MTJ element 23 is disposed right on the write word line 20B, and formed in the rectangular shape long in the X-direction (magnetization easy axis is the X-direction).

One of the metal layers constituting the fourth metal wiring layer functions as the data selection line (read/write bit line) 24. The data selection line 24 is electrically connected to the MTJ element 23, and extends in the Y-direction.

The upper surface of the data selection line 24 is coated with the material having the high permeability, that is, the yoke material 26. The yoke material 26 for use herein may have either conductivity or insulation property.

A barrier metal (e.g., Ti, TiN or the lamination of these) 29 for preventing the atoms from being diffused is formed on the lower surface of the data selection line 24, and a barrier layer (e.g., Ti, TiN or the lamination of these, or Ta, TaN or the lamination of these) 30 is formed on the upper surface of the data selection line.

Moreover, the side surface of the data selection line 24 is also coated with the material which has the high permeability, that is, yoke materials 32. The yoke material 32 for use herein may have either conductivity or insulation property.

When the yoke materials 26, 32 are used as the traction material of the magnetic force line, the magnetic field Hx generated by the write current flowing through the data selection line 24 can efficiently be concentrated on the MTJ element 23.

Barrier layers 31 (e.g., Ti, TiN or the lamination of these, or Ta, TaN or the lamination of these) are formed on the side surfaces of the data selection line 24. The barrier layers 31 separate the yoke material 26 with which the upper surface of the data selection line 24 is coated from the yoke materials 32 with which the side surfaces of the data selection line are coated.

The barrier layers 30, 31 may have either the conductivity or insulation property. Moreover, the barrier layers 30, 31 may have the same functions as those of the barrier metal 29.

Since the barrier layers 30, 31 sufficiently fulfill the diffusion prevention function of atoms, each of the layers preferably has a thickness of at least about 20 nm.

It is to be noted that the structure of the MTJ element 23 is not especially limited. The structure may be the structure shown in FIG. 1 or any other structure. Moreover, the MTJ element 23 may also be of the multi-valued storage type in which data of a plurality of bits can be stored.

(2) Manufacturing Method

A manufacturing method of the magnetic random access memory according to the first embodiment of the present invention will next be described.

Figure 12:
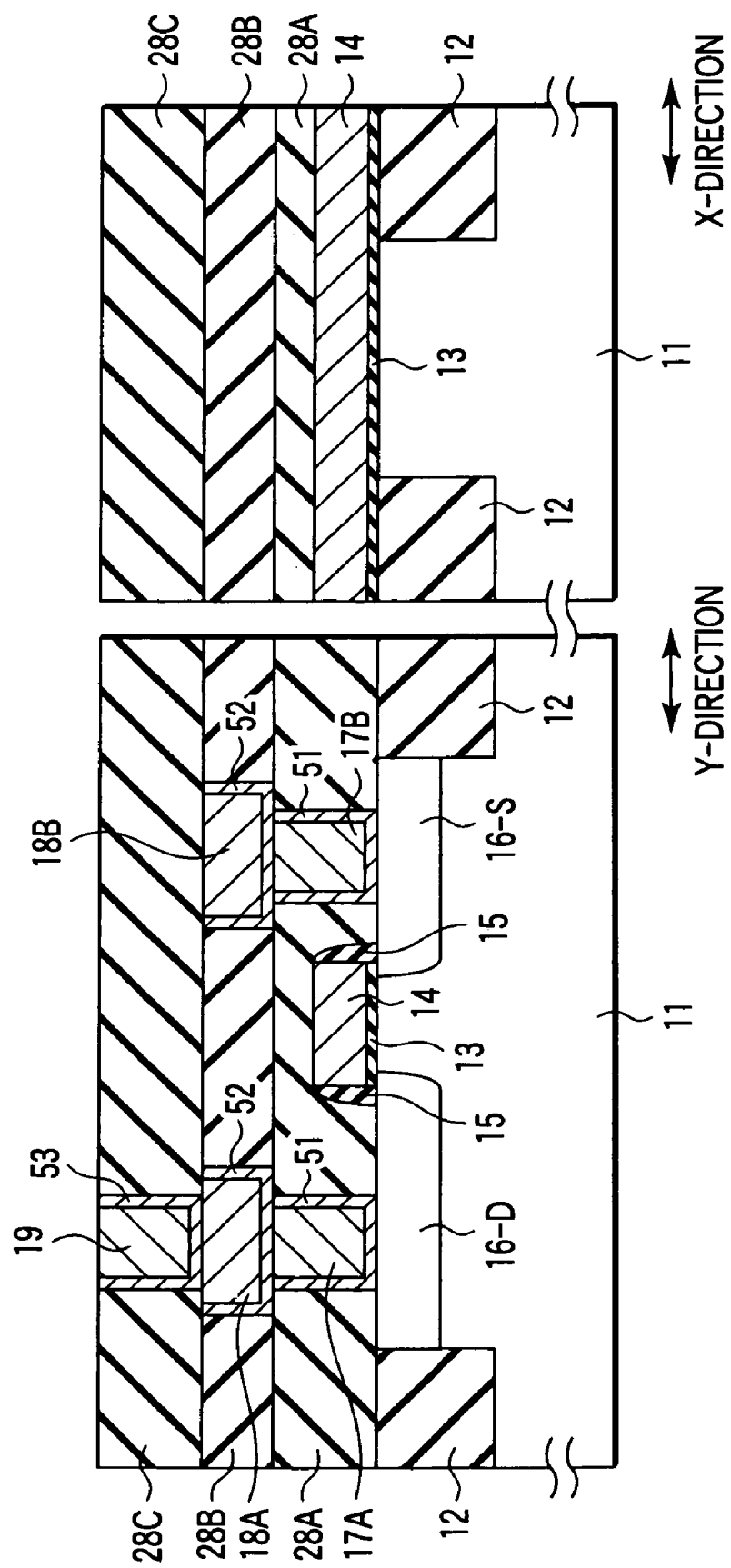
FIG. 12 is a sectional view showing one step of a manufacturing method of the memory according to the first embodiment.

First, as shown in FIG. 12, known methods such as a photo engraving process (PEP) method, chemical vapour deposition (CVD) method, and chemical mechanical polishing (CMP) process are used to form the element separation insulating layer 12 including the STI structure in the semiconductor substrate 11.

Moreover, the MOS transistor as the read selection switch is formed in the element region surrounded with the element separation insulating layer 12.

After forming the gate insulating layer 13 and gate electrode (read word line) 14 by CVD method, PEP method, and reactive ion etching (RIE) method, the source region 16-S and drain region 16-D are formed by an ion implantation method, so that the MOS transistor can easily be formed. It is to be noted that the side wall insulating layers 15 may also be formed on side wall portions of the gate electrode 14 by the CVD and RIE methods.

Thereafter, an insulating layer 28A with which the MOS transistor is completely coated is formed by the CVD method. Moreover, the surface of the insulating layer 28A is flatted using the CMP method. Contact holes reaching the source region 16-S and drain region 16-D of the MOS transistor are formed in the insulating layer 28A using the PEP and RIE methods.

Barrier metals (e.g., Ti, TiN, or the lamination of these) 51 are formed on the insulating layer 28A and on the inner surfaces of the contact holes by a sputter method. Subsequently, conductive materials (e.g., a conductive polysilicon film including impurities, metal film, and the like) with which the contact holes are completely filled are formed on the insulating layer 28A by the sputter method. Moreover, by the CMP method, the conductive materials and barrier metals 51 are polished, and the contact plugs 17A, 17B are formed.

An insulating layer 28B is formed on the insulating layer 28A using the CVD method. The PEP and RIE methods are used to form wiring trenches in the insulating layer 28B. The sputter method is used to form barrier metals (e.g., Ti, TiN, or the lamination of these) 52 on the insulating layer 28B and on the inner surfaces of the wiring trenches. Subsequently, the conductive materials (e.g., metal films such as aluminum and copper) with which the wiring trenches are completely filled are formed on the insulating layer 28B by the sputter method. Thereafter, by the CMP method, the conductive materials and barrier metals 52 are polished, and the intermediate layer 18A and source line 18B are formed.

Subsequently, the CVD method is used to form an insulating layer 28C on the insulating layer 28B. The PEP and RIE methods are used to form via holes in the insulating layer 28C. By the sputter method, barrier metals (e.g., Ti, TiN, or the lamination of these) 53 are formed on the insulating layer 28C and on the inner surfaces of the via holes. Subsequently, by the sputter method, the conductive materials (e.g., the metal films such as aluminum and copper) with which the via holes are completely filled are formed on the insulating layer 28C. Thereafter, by the CMP method, the conductive materials and barrier metals 53 are polished, and a via plug 19 is formed.

Figure 13:
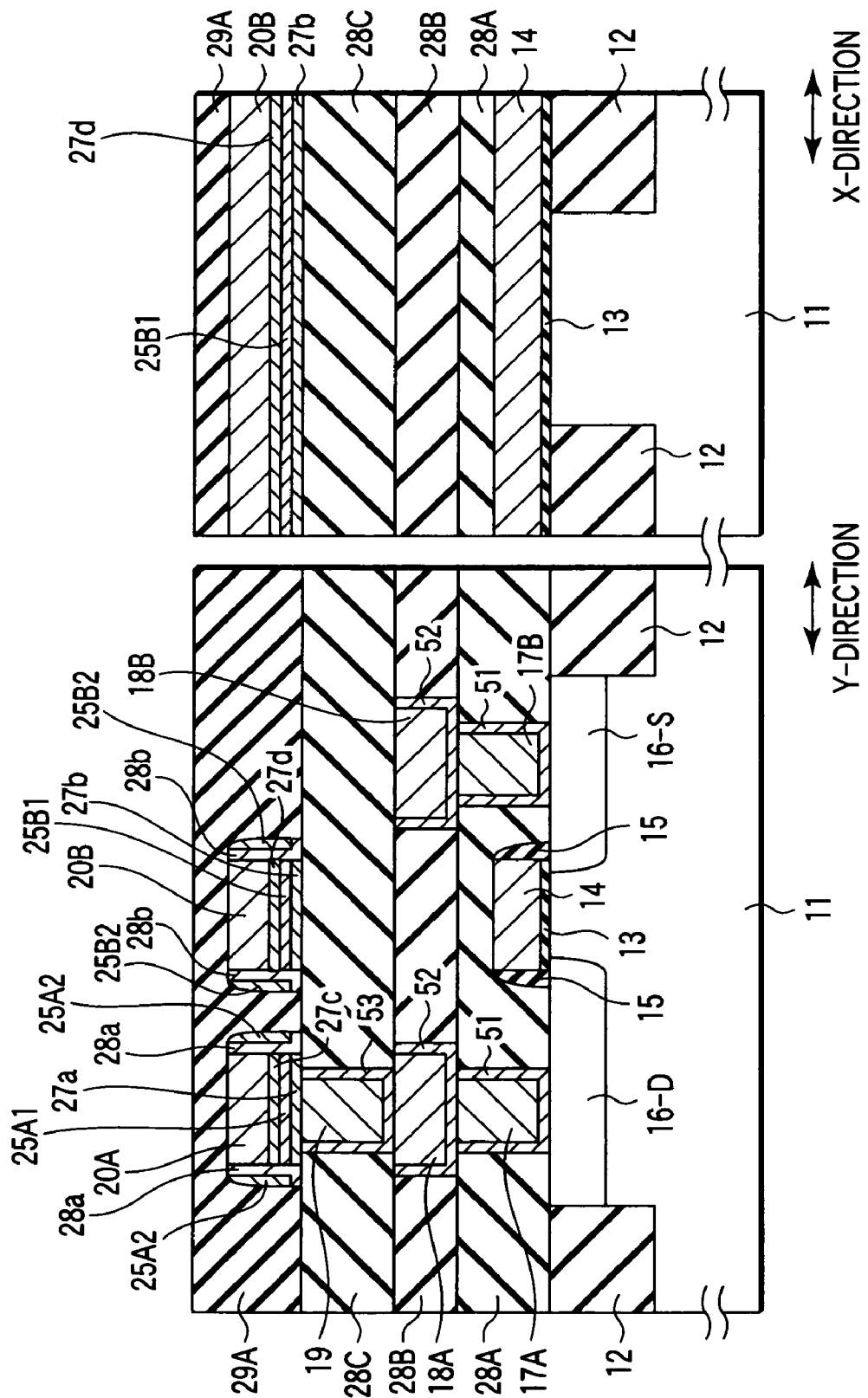
FIG. 13 is a sectional view showing one step of the manufacturing method of the memory according to the first embodiment.

Subsequently, as shown in FIG. 13, by the sputter method, the barrier metals (e.g., a lamination of Ti (10 nm) and TiN (10 nm)) 27a, 27b are formed on the insulating layer 28C. Subsequently, the sputter method is used to form the yoke materials (e.g., NiFe) 25A1, 25B1 which have the high permeability in a thickness of about 50 nm on the barrier metals 27a, 27b. Moreover, the sputter method is used to form barrier metals (e.g., the lamination of Ti (10 nm) and TiN (10 nm)) 27c, 27d on the yoke materials 25A1, 25B1.

Furthermore, the sputter method is continuously used to form the conductive material (e.g., AlCu) in a thickness of about 250 nm on the barrier metals 27c, 27d. Thereafter, the PEP and RIE methods are used to etch the conductive materials, yoke materials 25A1, 25B1, and barrier metals 27a, 27b, 27c, 27d, so that the intermediate layer 20A and write word line 20B are formed.

Additionally, the sputter method is used to form the barrier layers (e.g., a lamination of Ta (10 nm) and TaN (10 nm)) 28a, 28b with which the intermediate layer 20A and write word line 20B are coated. The sputter method is continuously used to form the yoke materials (e.g., NiFe) 25A2, 25B2 which have the high permeability in a thickness of about 50 nm on the barrier layers 28a, 28b.

Moreover, by the RIE method, the yoke materials 25A2, 25B2 and barrier layers 28a, 28b are etched, so that the yoke materials 25A2, 25B2 and barrier layers 28a, 28b remain only on the side wall portions of the intermediate layer 20A and write word line 20B.

Thereafter, the CVD method is used to form an insulating layer 29A with which the intermediate layer 20A and write word line 20B are completely coated on the insulating layer 28C. Moreover, the surface of the insulating layer 29A is flatted, for example, by the CMP method.

Figure 14:
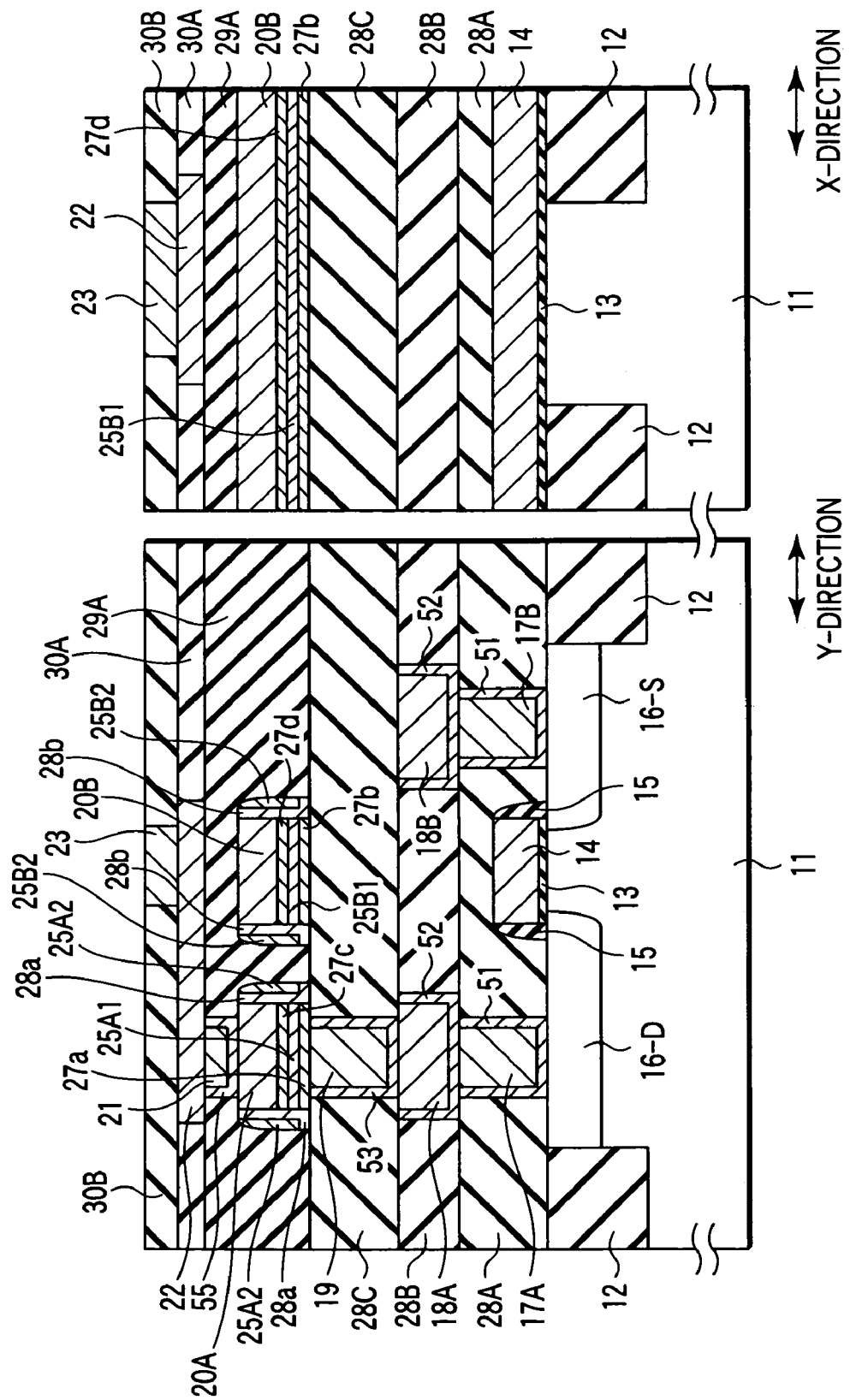
FIG. 14 is a sectional view showing one step of the manufacturing method of the memory according to the first embodiment.

Subsequently, as shown in FIG. 14, the PEP and RIE methods are used to form the via holes which reach the intermediate layer 20A in the insulating layer 29A. By the sputter method, barrier metals (e.g., Ti, TiN, or the lamination of these) 55 are formed on the insulating layer 29A and on the inner surfaces of the via holes in a thickness of about 10 nm. Subsequently, the conductive materials (e.g., the metal film such as tungsten) with which the via holes are completely filled are formed on the insulating layer 29A by the CVD method. Thereafter, by the CMP method, the conductive materials and barrier metals 55 are polished, and a via plug 21 is formed.

The CVD method is used to form an insulating layer 30A on the insulating layer 29A. The PEP and RIE methods are used to form the wiring trenches in the insulating layer 30A. By the sputter method, the conductive materials (e.g., the metal films such as Ta) with which the wiring trenches are completely filled are formed on the insulating layer 30A in a thickness of about 30 nm. Thereafter, by the CMP, the conductive materials are polished, and a local interconnect line (lower electrode of the MTJ element) 22 is formed.

The CVD method is used to successively deposit a plurality of layers on the local interconnect line 22, and these plurality of layers are further patterned to form the MTJ elements 23.

The MTJ element 23 is constituted of a lamination film including, for example, Ta (about 40 nm), NiFe (about 10 nm), $Al_2O_3$ (about 2 nm), CoFe (about 10 nm), and IrMn (about 10 nm), or a lamination film including NiFe (about 5 nm), IrMn (about 12 nm), CoFe (about 3 nm), AlOx (about 1.2 nm), CoFe (about 5 nm), and NiFe (about 15 nm).

Moreover, the CVD method is used to form an insulating layer 30B with which the MTJ element 23 is coated, and subsequently, the insulating layer 30B on the MTJ element 23 is removed, for example, by the CMP method. As a result, a topmost layer of the MTJ element 23 is exposed, and only the side surface of the MTJ element 23 is coated with the insulating layer 30B.

It is to be noted that to constitute the topmost layer of the MTJ element 23 by Ta or W, the topmost layer of the MTJ element 23 is exposed, and subsequently the data selection line described later can directly be formed.

Figure 15:
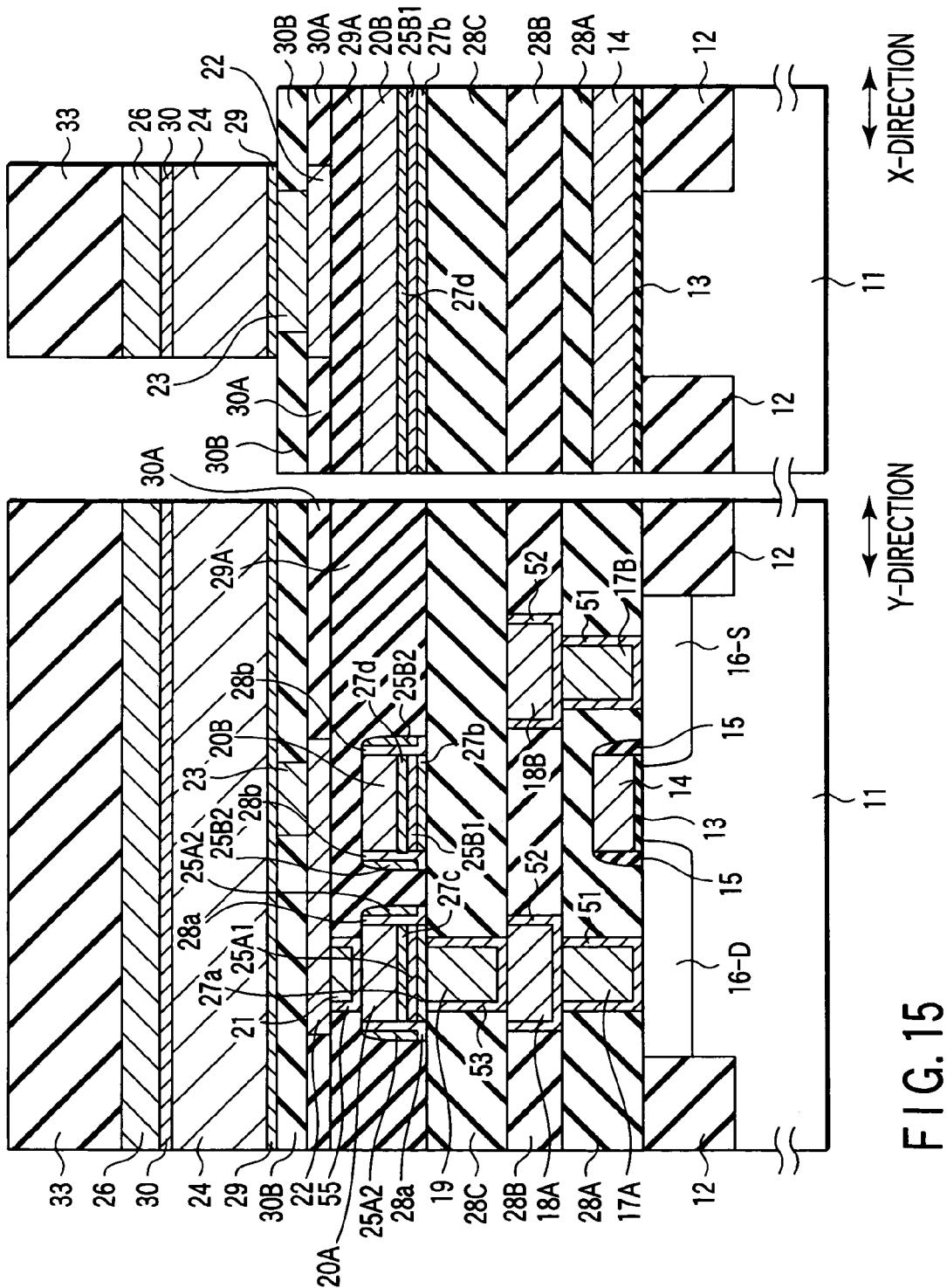
FIG. 15 is a sectional view showing one step of the manufacturing method of the memory according to the first embodiment.

Subsequently, as shown in FIG. 15, the barrier metal (e.g., the lamination of Ti (10 nm) and TiN (10 nm)) 29 is formed on the insulating layer 30B by the sputter method. Continuously, the conductive material (such as AlCu) is formed in a thickness of about 400 nm on the barrier metal 29 by the sputter method. Continuously, the barrier layer (e.g., the lamination of Ta (10 nm) and TaN (10 nm)) 30 is formed on the conductive material by the sputter method.

Furthermore, the yoke material (such as NiFe) 26 which has the high permeability is continuously formed in a thickness of about 50 nm on the barrier layer 30 by the sputter method. Thereafter, the PEP method is used to form a resist pattern 33.

Additionally, the RIE method is used, and the resist pattern 33 is used as a mask to etch the yoke material 26, barrier layer 30, conductive material, and barrier metal 29, so that the data selection line (read/write bit line) 24 is formed.

Thereafter, the resist pattern 33 is removed.

Figure 16:
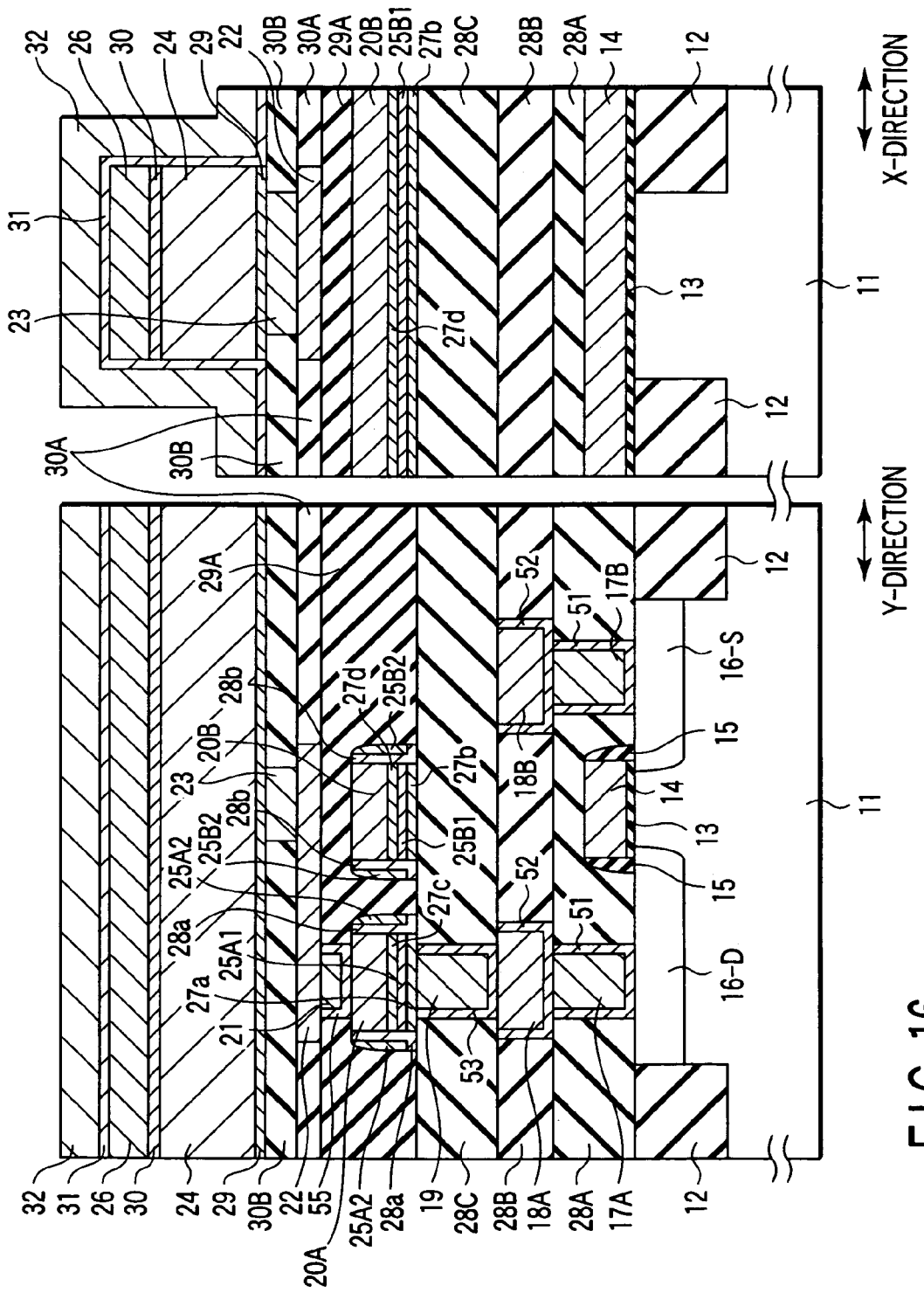
FIG. 16 is a sectional view showing one step of the manufacturing method of the memory according to the first embodiment.

Subsequently, as shown in FIG. 16, the barrier layer (e.g., the lamination of Ta (10 nm) and TaN (10 nm)) 31 with which the data selection line 24 is coated is formed on the insulating layer 30B by the sputter method. Continuously, the yoke material (such as NiFe) 32 which has the high permeability is formed in a thickness of about 50 nm on the barrier layer 31 by the sputter method.

Figure 17:
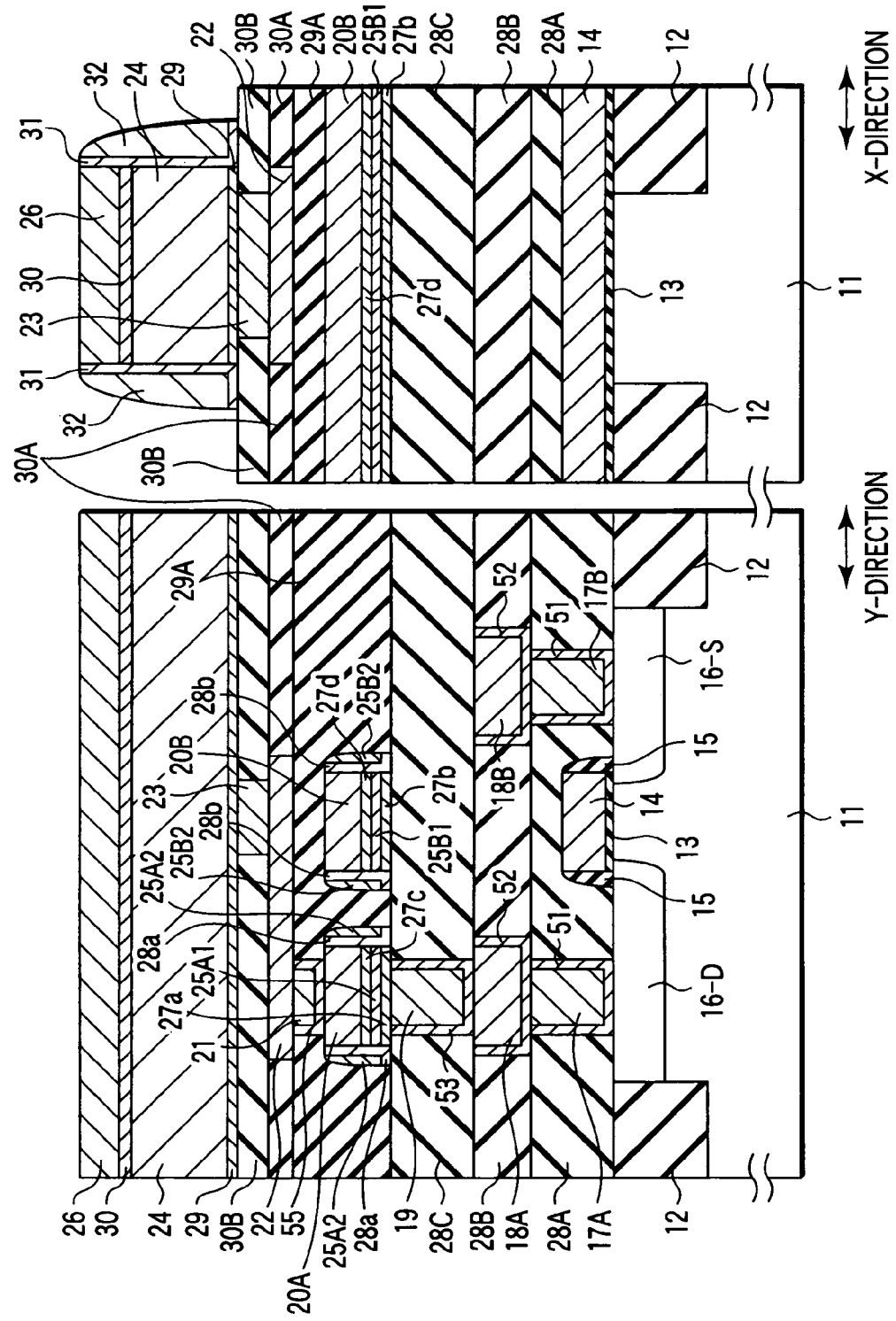
FIG. 17 is a sectional view showing one step of the manufacturing method of the memory according to the first embodiment.

Moreover, when the yoke material 32 and barrier layer 31 are etched by the RIE method, as shown in FIG. 17, the yoke material 32 and barrier layer 31 remain only on the side wall portion of the data selection line 24.

The magnetic random access memory of the first embodiment (FIGS. 10 and 11) is completed by the above-described steps.

(3) Conclusion

As described above, according to the first embodiment, the lower surface of the write word line 20B is coated with the yoke material 25B1, and the side surface of the line is coated with the yoke material 25B2. Moreover, since the yoke materials 25B1, 25B2 are separated from each other by the barrier layer 28b, the yoke material covering the lower and side surfaces of the write word line is not formed in the lower corner portion of the write word line 20B.

Therefore, the magnetic domains of the yoke materials 25B1, 25B2 are easily controlled, and the magnetic field Hy generated by the write current flowing through the write word line 20B can efficiently be exerted onto the MTJ element 23.

Moreover, according to the first embodiment, the upper surface of the data selection line 24 is coated with the yoke material 26, and the side surface of the data selection line is coated with the yoke material 32. Furthermore, since the yoke materials 26, 32 are separated from each other by the barrier layer 31, the yoke material covering the upper and side surfaces of the data selection line is not formed in the upper corner portion of the data selection line 24.

Therefore, the magnetic domains of the yoke materials 26, 32 are easily controlled, and the magnetic field Hx generated by the write current flowing through the data selection line 24 can efficiently be exerted onto the MTJ element 23.

4. SECOND EMBODIMENT

Figure 18:
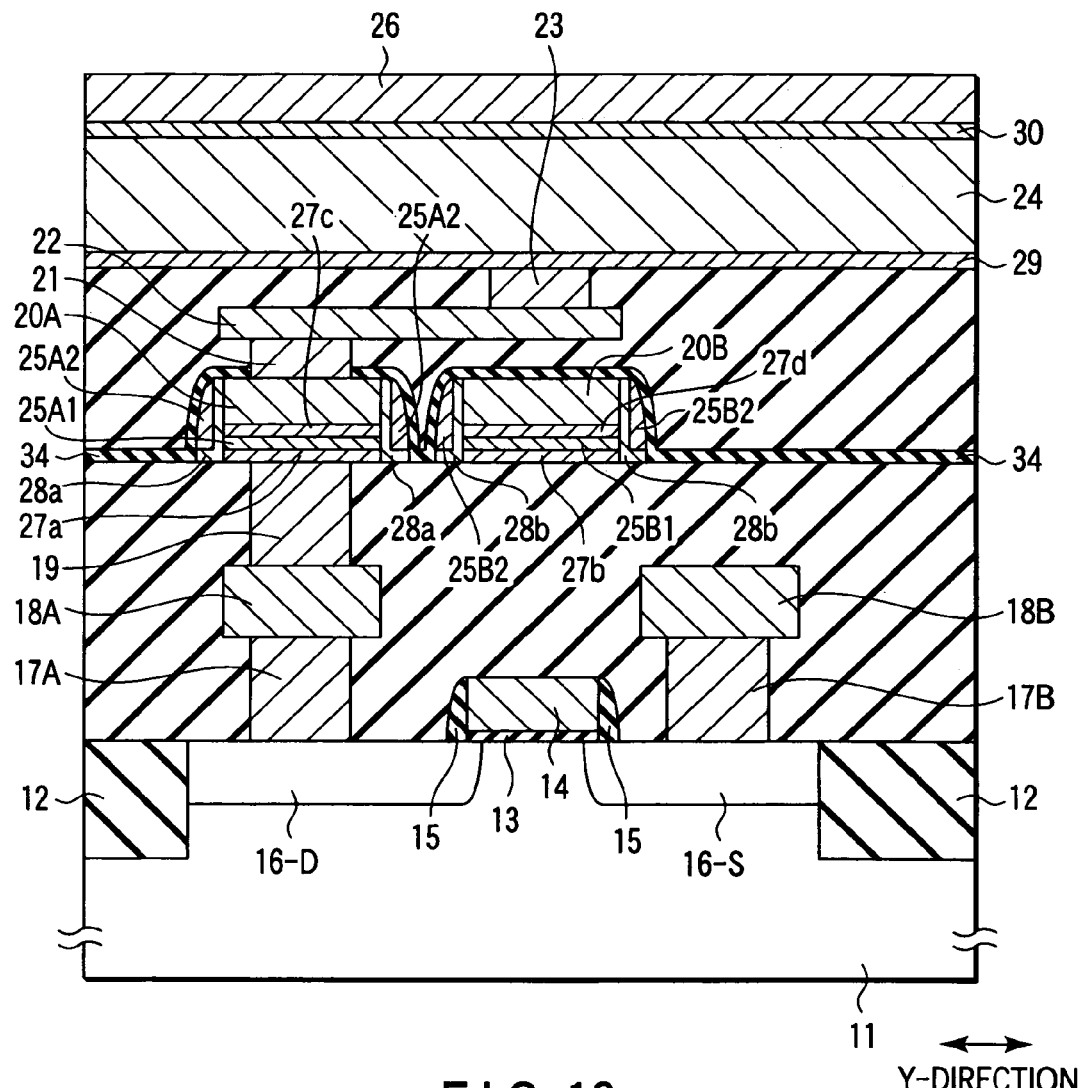
FIG. 18 is a sectional view of the magnetic random access memory according to a second embodiment.
Figure 19:
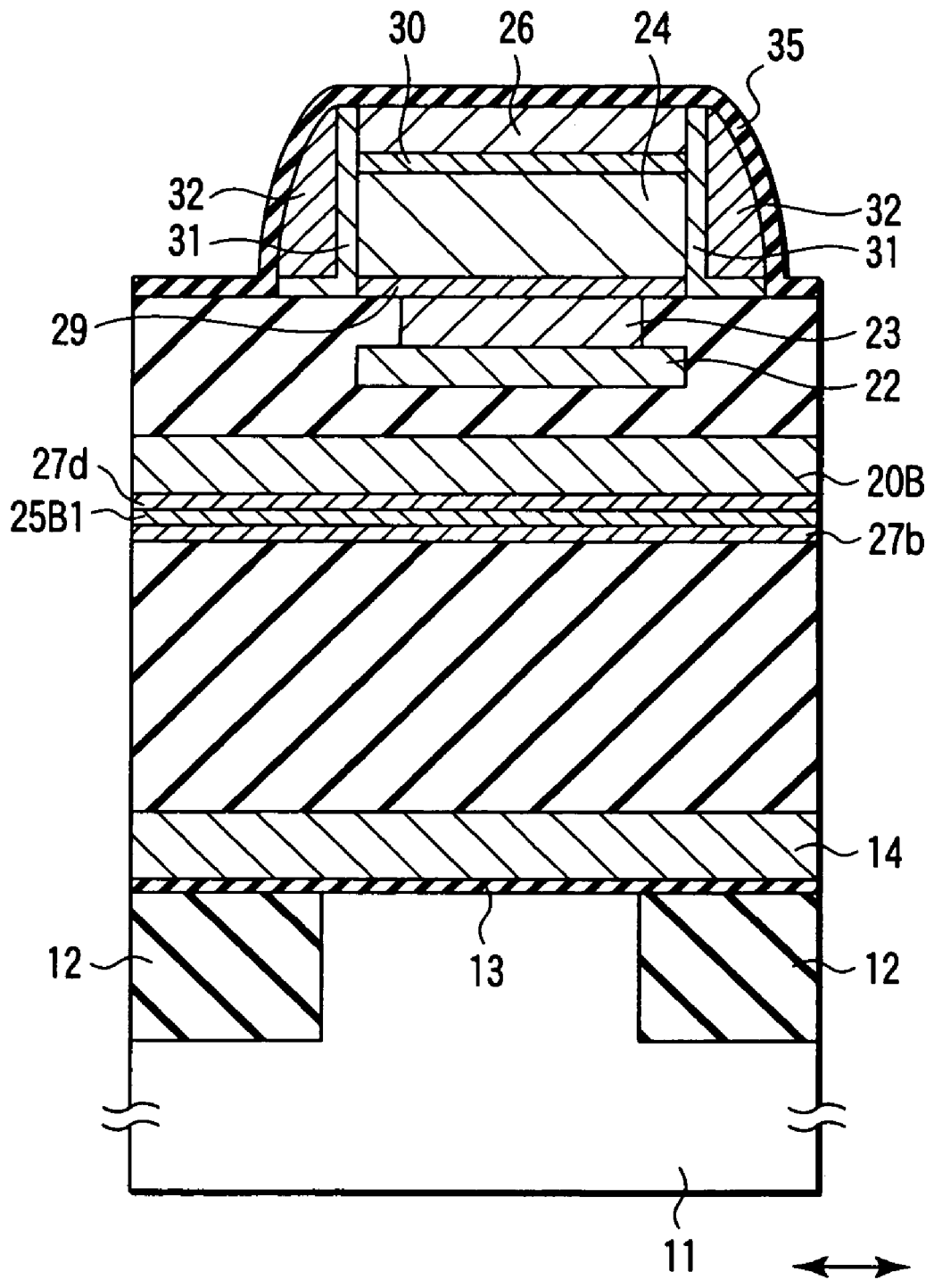
FIG. 19 is a sectional view of the magnetic random access memory according to the second embodiment.

FIGS. 18 and 19 show the device structure of the magnetic random access memory according to a second embodiment of the present invention. It is to be noted that FIG. 18 shows the section of the Y-direction, and FIG. 19 shows the section of the X-direction of the MTJ element portion of FIG. 18. The X-direction crosses at right angles to the Y-direction.

The device structure of the present embodiment is characterized in that the yoke material covering the lower and side surfaces of the write line is coated with the barrier layer having a function of preventing the diffusion of the atoms and the yoke material covering the upper and side surfaces of the data selection line is further coated with the barrier layer having the function of preventing the diffusion of atoms.

The element separation insulating layers 12 including the STI structure are formed in the semiconductor substrate (such as the p-type silicon substrate and p-type well region) 11. The region surrounded with the element separation insulating layers 12 is the element region in which the read selection switch is formed.

The read selection switch is constituted of the MOS transistor (n-channel type MOS transistor). The gate insulating layer 13, gate electrode 14, and side wall insulating layers 15 are formed on the semiconductor substrate 11. The gate electrode 14 extends in the X-direction, and functions as the read word line for selecting the read cell (MTJ element) at the read operation time.

The source region (e.g., n-type diffusion layer) 16-S and drain region (e.g., n-type diffusion layer) 16-D are formed in the semiconductor substrate 11. The gate electrode (read word line) 14 is disposed on the channel region between the source region 16-S and drain region 16-D.

One of the metal layers constituting the first metal wiring layer functions as the intermediate layer 18A for vertically stacking a plurality of contact plugs, and another layer functions as the source line 18B.

The intermediate layer 18A is electrically connected to the drain region 16-D of the read selection switch (MOS transistor) by the contact plug 17A. The source line 18B is electrically connected to the source region 16-S of the read selection switch via the contact plug 17B. The source line 18B extends in the X-direction, for example, similarly as the gate electrode (read word line) 14.

One of the metal layers constituting the second metal wiring layer functions as the intermediate layer 20A for vertically stacking a plurality of contact plugs, and another layer functions as the write word line 20B. The intermediate layer 20A is electrically connected to the intermediate layer 18A by the contact plug 19. The write word line 20B extends, for example, in the X-direction similarly as the gate electrode (read word line) 14.

The lower surfaces of the intermediate layer 20A and write word line 20B are coated with the material having the high permeability, that is, yoke materials 25A1, 25B1.

The barrier metals (e.g., Ti, TiN, or the lamination of these) 27a, 27b are formed right under the yoke materials 25A1, 25B1, and the barrier metals (e.g., Ti, TiN, or the lamination of these) 27c, 27d are formed right on the barrier metals. That is, the yoke materials 25A1, 25B1 are held between the barrier metals 27a, 27b, 27c, 27d.

Moreover, the side surfaces of the intermediate layer 20A and write word line 20B are also coated with the materials which have high permeability, that is, yoke materials 25A2, 25B2.

When the yoke materials 25A1, 25B1, 25A2, 25B2 are used as the traction material of the magnetic force line, the magnetic field Hy generated by the write current flowing through the write word line 20B can efficiently be concentrated on the MTJ element 23.

The barrier layers 28a, 28b (e.g., Ti, TiN, or the lamination of these, or Ta, TaN, or the lamination of these) are formed on the side surfaces of the intermediate layer 20A and write word line 20B. The barrier layers 28a, 28b separate the yoke materials 25A1, 25B1 with which the lower surfaces of the intermediate layer 20A and write word line 20B are coated from the yoke materials 25A2, 25B2 with which the side surfaces are coated.

The barrier layers 28a, 28b may have either the conductivity or insulation property. Moreover, the barrier layers 28a, 28b may have the same functions as those of the barrier metals 27a, 27b.

Additionally, when the atoms of the materials constituting the yoke materials 25A1, 25B1, 25A2, 25B2 reach the semiconductor substrate 11 by the diffusion, the characteristics of the read selection switch (MOS transistor) formed on the surface region of the semiconductor substrate 11 are sometimes adversely affected.

To solve the problem, in the second embodiment, the yoke materials 25A1, 25B1, 25A2, 25B2 are coated with the barrier layer (such as SiN) 34 which has the function of preventing the diffusion of atoms. Thereby, the diffusion of the atoms of the materials constituting the yoke materials 25A1, 25B1, 25A2, 25B2 is suppressed.

It is to be noted that the barrier layer 34 is constituted of an insulating material. Additionally, the barrier layer 34 may also be constituted of the conductive material, if the problem of short-circuit between the wires disposed adjacent to each other can be solved.

One of the metal layers constituting the third metal wiring layer functions as the lower electrode 22 of the MTJ element 23. The lower electrode 22 is electrically connected to the intermediate layer 20A by the contact plug 21. The MTJ element 23 is mounted on the lower electrode 22. Here, the MTJ element 23 is disposed right on the write word line 20B, and formed in the rectangular shape long in the X-direction (magnetization easy axis is the X-direction).

One of the metal layers constituting the fourth metal wiring layer functions as the data selection line (read/write bit line) 24. The data selection line 24 is electrically connected to the MTJ element 23, and extends in the Y-direction.

The upper surface of the data selection line 24 is coated with the material having the high permeability, that is, the yoke material 26. The barrier metal (e.g., Ti, TiN, or the lamination of these) 29 is formed on the lower surface of the data selection line 24, and the barrier layer (e.g., Ti, TiN, or the lamination of these, or Ta, TaN, or the lamination of these) 30 is formed on the upper surface of the data selection line.

Moreover, the side surface of the data selection line 24 is also coated with the material which has the high permeability, that is, the yoke materials 32.

When the yoke materials 26, 32 are used as the traction material of the magnetic force line, the magnetic field Hx generated by the write current flowing through the data selection line 24 can efficiently be concentrated on the MTJ element 23.

The barrier layers 31 (e.g., Ti, TiN, or the lamination of these, or Ta, TaN, or the lamination of these) are formed on the side surfaces of the data selection line 24. The barrier layers 31 separate the yoke material 26 with which the upper surface of the data selection line 24 is coated from the yoke materials 32 with which the side surfaces of the data selection line are coated.

The barrier layers 30, 31 may have either the conductivity or insulation property. Moreover, the barrier layers 30, 31 may have the same functions as those of the barrier metal 29.

Also with respect to the yoke materials 26, 32, similarly as the yoke materials 25A1, 25B1, 25A2, 25B2 with which the write word line 20B is coated, when the atoms of the materials constituting the yoke materials reach the semiconductor substrate 11 by the diffusion, the characteristics of the read selection switch (MOS transistor) formed in the surface region of the semiconductor substrate 11 are sometimes adversely affected.

To solve the problem, the yoke materials 26, 32 are coated with barrier layer (such as SiN) 35 which has the function of preventing the diffusion of atoms. Thereby, the diffusion of the atoms of the materials constituting the yoke materials 26, 32 is suppressed.

It is to be noted that the barrier layer 35 is constituted of the insulating material. Additionally, the barrier layer 35 may also be constituted of the conductive material, if the problem of short-circuit between the wires disposed adjacent to each other can be solved.

(2) Manufacturing Method

The manufacturing method of the magnetic random access memory according to the second embodiment of the present invention will next be described.

Figure 20:
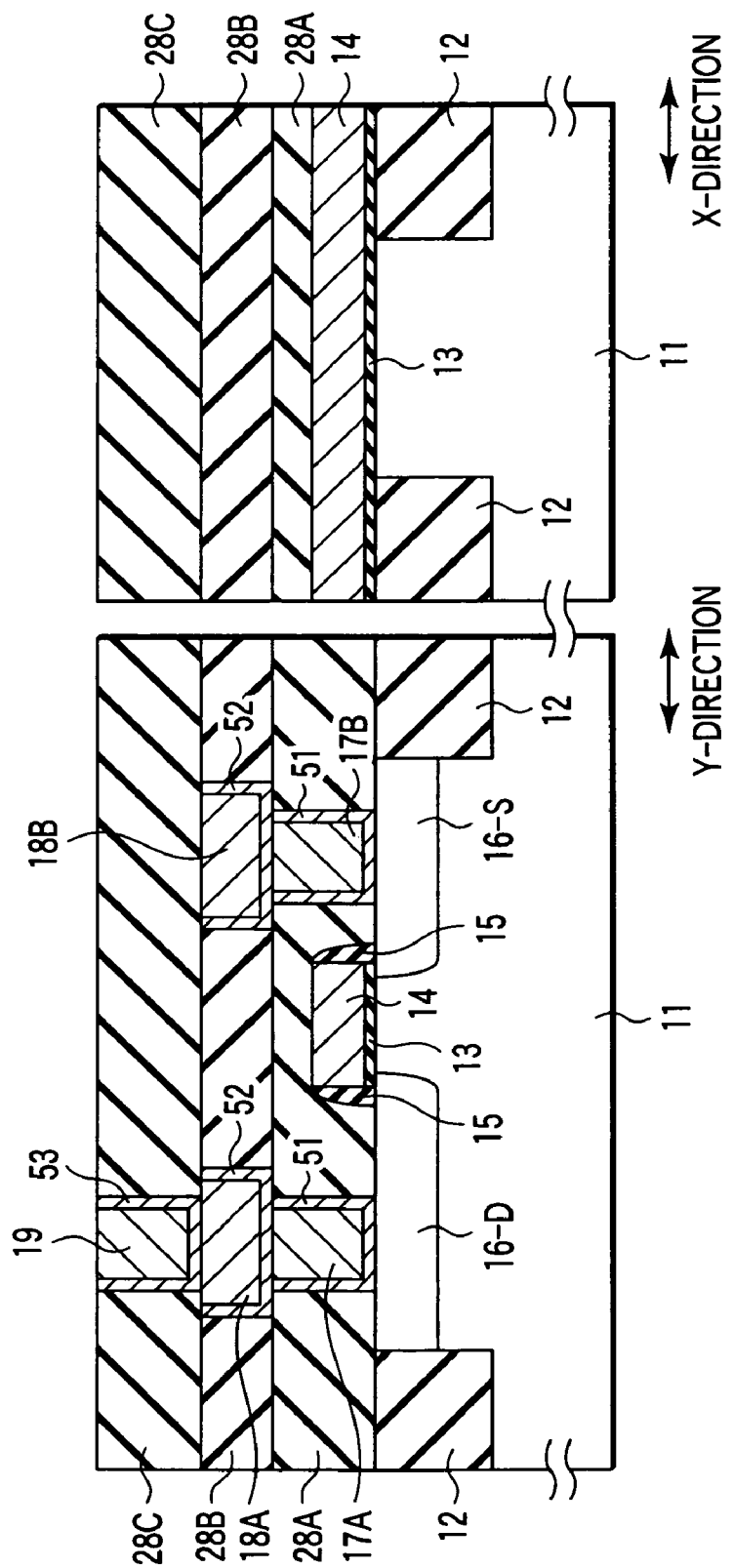
FIG. 20 is a sectional view showing one step of the manufacturing method of the memory according to the second embodiment.

First, as shown in FIG. 20, the methods such as the PEP, CVD, and CMP methods are used to form the element separation insulating layer 12 including the STI structure in the semiconductor substrate 11.

Moreover, the MOS transistor as the read selection switch is formed in the element region surrounded with the element separation insulating layer 12.

After forming the gate insulating layer 13 and gate electrode (read word line) 14 by the CVD, PEP, and RIE methods, the source region 16-S and drain region 16-D are formed by an ion implantation method, so that the MOS transistor can easily be formed. The side wall insulating layers 15 may also be formed on side wall portions of the gate electrode 14 by the CVD and RIE methods.

Thereafter, the insulating layer 28A with which the MOS transistor is completely coated is formed by the CVD method. Moreover, the surface of the insulating layer 28A is flatted using the CMP method. The contact holes reaching the source region 16-S and drain region 16-D of the MOS transistor are formed in the insulating layer 28A using the PEP and RIE methods.

The barrier metals (e.g., Ti, TiN, or the lamination of these) 51 are formed on the insulating layer 28A and on the inner surfaces of the contact holes by the sputter method. Continuously, the conductive materials (e.g., the conductive polysilicon film including the impurities, metal film, and the like) with which the contact holes are completely filled are formed on the insulating layer 28A by the sputter method. Moreover, by the CMP method, the conductive materials and barrier metals 51 are polished, and the contact plugs 17A, 17B are formed.

The insulating layer 28B is formed on the insulating layer 28A using the CVD method. The PEP and RIE methods are used to form the wiring trenches in the insulating layer 28B. The sputter method is used to form the barrier metals (e.g., Ti, TiN, or the lamination of these) 52 on the insulating layer 28B and on the inner surfaces of the wiring trenches. Continuously, the conductive materials (e.g., the metal films such as aluminum and copper) with which the wiring trenches are completely filled are formed on the insulating layer 28B by the sputter method. Thereafter, by the CMP, the conductive materials and barrier metals 52 are polished, and the intermediate layer 18A and source line 18B are formed.

Subsequently, the CVD method is used to form the insulating layer 28C on the insulating layer 28B. The PEP and RIE methods are used to form the via holes in the insulating layer 28C. By the sputter method, the barrier metals (e.g., Ti, TiN, or the lamination of these) 53 are formed on the insulating layer 28C and on the inner surfaces of the via holes. Continuously, by the sputter method, the conductive materials (e.g., the metal films such as aluminum and copper) with which the via holes are completely filled are formed on the insulating layer 28C. Thereafter, by the CMP method, the conductive materials and barrier metals 53 are polished, and the via plug 19 is formed.

Figure 21:
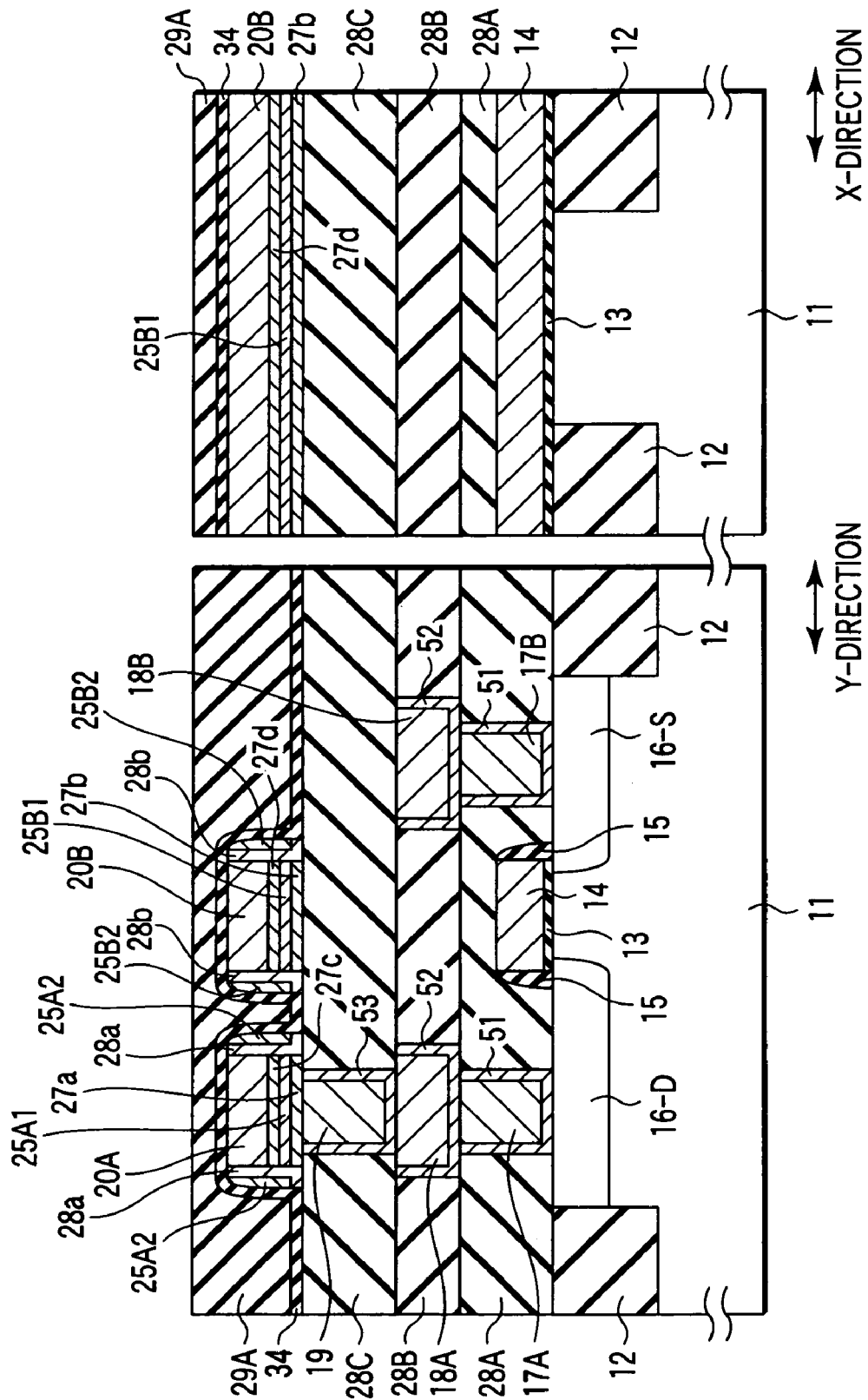
FIG. 21 is a sectional view showing one step of the manufacturing method of the memory according to the second embodiment.

Subsequently, as shown in FIG. 21, by the sputter method, the barrier metals (e.g., the lamination of Ti (10 nm) and TiN (10 nm)) 27a, 27b are formed on the insulating layer 28C. Subsequently, the sputter method is used to form the yoke materials (e.g., NiFe) 25A1, 25B1 which have the high permeability in a thickness of about 50 nm on the barrier metals 27a, 27b. Moreover, the sputter method is used to form the barrier metals (e.g., the lamination of Ti (10 nm) and TiN (10 nm)) 27c, 27d on the yoke materials 25A1, 25B1.

Furthermore, the sputter method is continuously used to form the conductive material (e.g., AlCu) in a thickness of about 250 nm on the barrier metals 27c, 27d. Thereafter, the PEP and RIE methods are used to etch the conductive materials, yoke materials 25A1, 25B1, and barrier metals 27a, 27b, 27c, 27d, so that the intermediate layer 20A and write word line 20B are formed.

Additionally, the sputter method is used to form the barrier layers (e.g., the lamination of Ta (10 nm) and TaN (10 nm)) 28a, 28b with which the intermediate layer 20A and write word line 20B are coated. The sputter method is continuously used to form the yoke materials (e.g., NiFe) 25A2, 25B2 which have the high permeability in a thickness of about 50 nm on the barrier layers 28a, 28b.

Moreover, by the RIE method, the yoke materials 25A2, 25B2 and barrier layers 28a, 28b are etched, so that the yoke materials 25A2, 25B2 and barrier layers 28a, 28b remain only on the side wall portions of the intermediate layer 20A and write word line 20B.

Thereafter, the CVD method is used to form the barrier layer (such as SiN) 34 with which the yoke materials 25A1, 25B1, 25A2, 25B2 are coated in a thickness of about 20 nm. The CVD method is continuously used to form the insulating layer 29A with which the intermediate layer 20A and write word line 20B are completely coated on the barrier layer 34. Moreover, for example, by the CMP method, the surface of the insulating layer 29A is flatted.

Figure 22:
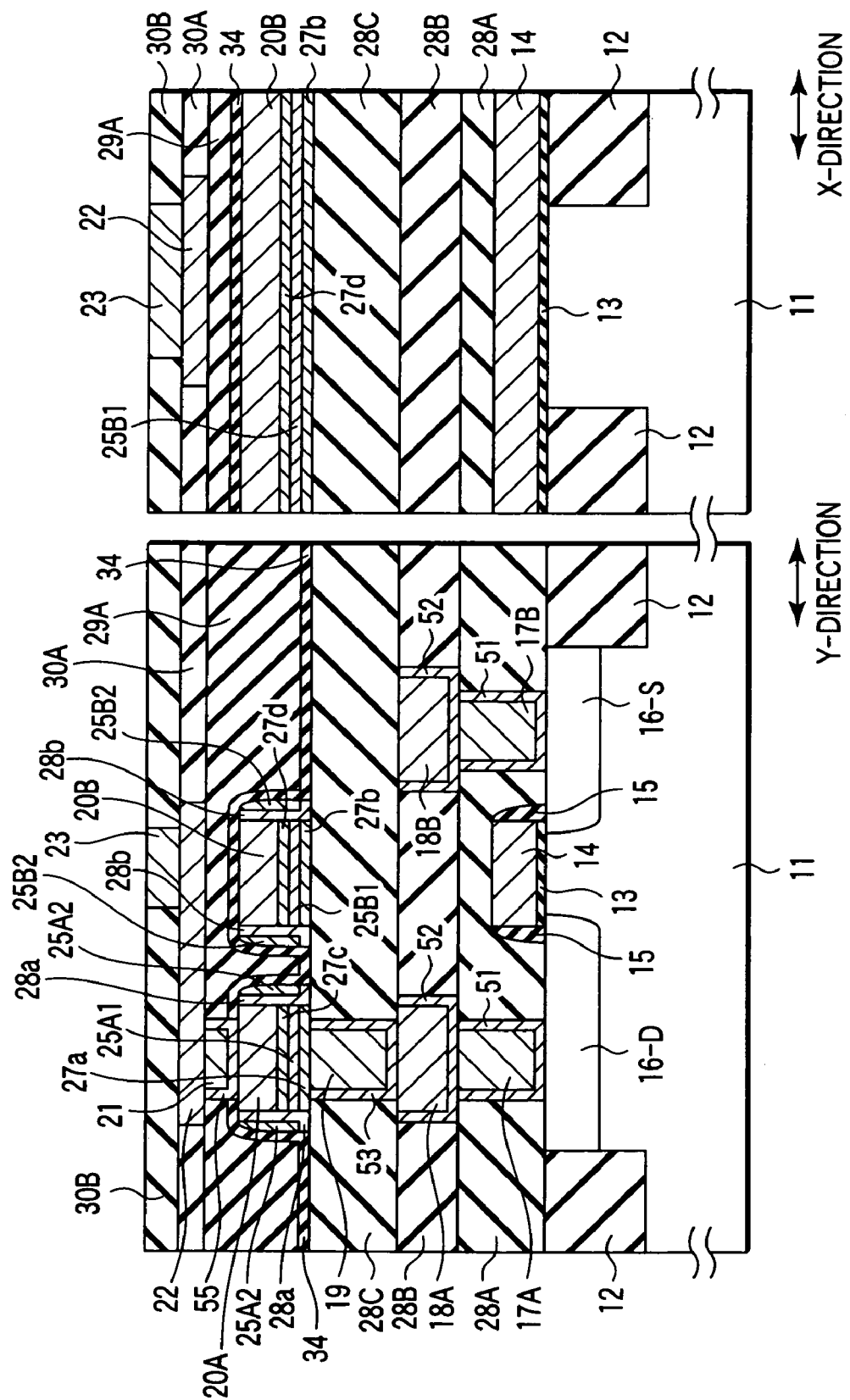
FIG. 22 is a sectional view showing one step of the manufacturing method of the memory according to the second embodiment.

Subsequently, as shown in FIG. 22, the PEP and RIE methods are used to form the via holes which reach the intermediate layer 20A in the insulating layer 29A. By the sputter method, the barrier metals (e.g., Ti, TiN, or the lamination of these) 55 are formed on the insulating layer 29A and on the inner surfaces of the via holes in a thickness of about 10 nm. Continuously, the conductive materials (e.g., the metal film such as tungsten) with which the via holes are completely filled are formed on the insulating layer 29A by the CVD method. Thereafter, by the CMP method, the conductive materials and barrier metals 55 are polished, and the via plug 21 is formed.

The CVD method is used to form the insulating layer 30A on the insulating layer 29A. The PEP and RIE methods are used to form the wiring trenches in the insulating layer 30A. By the sputter method, the conductive materials (e.g., the metal films such as Ta) with which the wiring trenches are completely filled are formed in a thickness of about 50 nm on the insulating layer 30A. Thereafter, by the CMP, the conductive materials are polished, and the local interconnect line (lower electrode of the MTJ element) 22 is formed.

The CVD method is used to successively deposit a plurality of layers on the local interconnect line 22, and these plurality of layers are further patterned to form the MTJ elements 23.

The CVD method is used to form the insulating layer 30B with which the MTJ element 23 is coated, and subsequently, the insulating layer 30B on the MTJ element 23 is removed, for example, by the CMP method. As a result, the topmost layer of the MTJ element 23 is exposed, and only the side surfaces of the MTJ element 23 are coated with the insulating layer 30B.

It is to be noted that to constitute the topmost layer of the MTJ element 23 by Ta or W, the topmost layer of the MTJ element 23 is exposed, and subsequently the data selection line described later can directly be formed.

Figure 23:
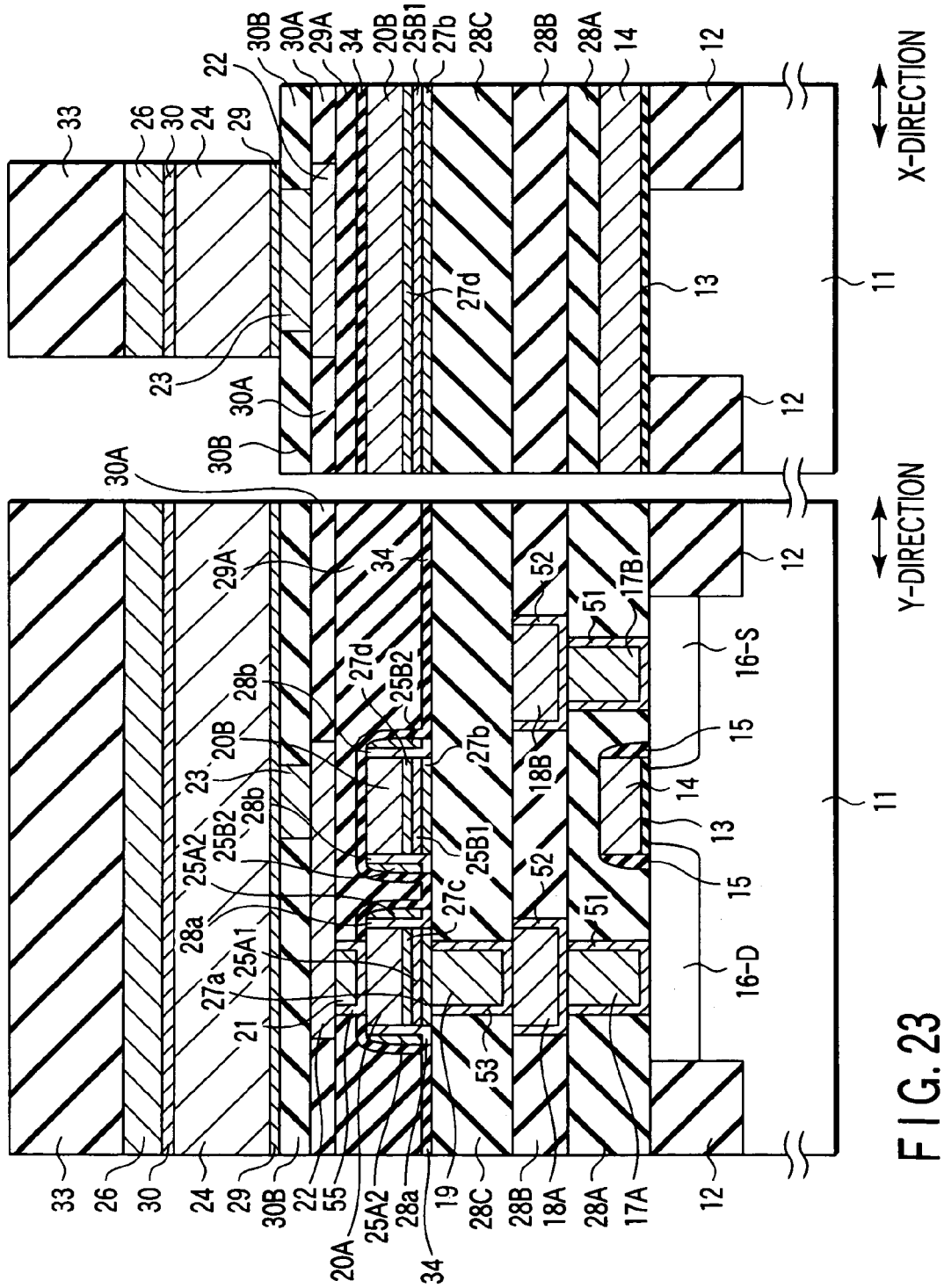
FIG. 23 is a sectional view showing one step of the manufacturing method of the memory according to the second embodiment.

Subsequently, as shown in FIG. 23, the barrier metal (e.g., the lamination of Ti (10 nm) and TiN (10 nm)) 29 is formed on the insulating layer 30B by the sputter method. Continuously, the conductive material (such as AlCu) is formed in a thickness of about 400 nm on the barrier metal 29 by the sputter method. Continuously, the barrier layer (e.g., the lamination of Ta (10 nm) and TaN (10 nm)) 30 is formed on the conductive material by the sputter method.

Furthermore, the yoke material (such as NiFe) 26 which has the high permeability is continuously formed in a thickness of about 50 nm on the barrier layer 30 by the sputter method. Thereafter, the PEP method is used to form the resist pattern 33.

Additionally, the RIE method is used, and the resist pattern 33 is used as the mask to etch the yoke material 26, barrier layer 30, conductive material, and barrier metal 29, so that the data selection line (read/write bit line) 24 is formed.

Thereafter, the resist pattern 33 is removed.

Figure 24:
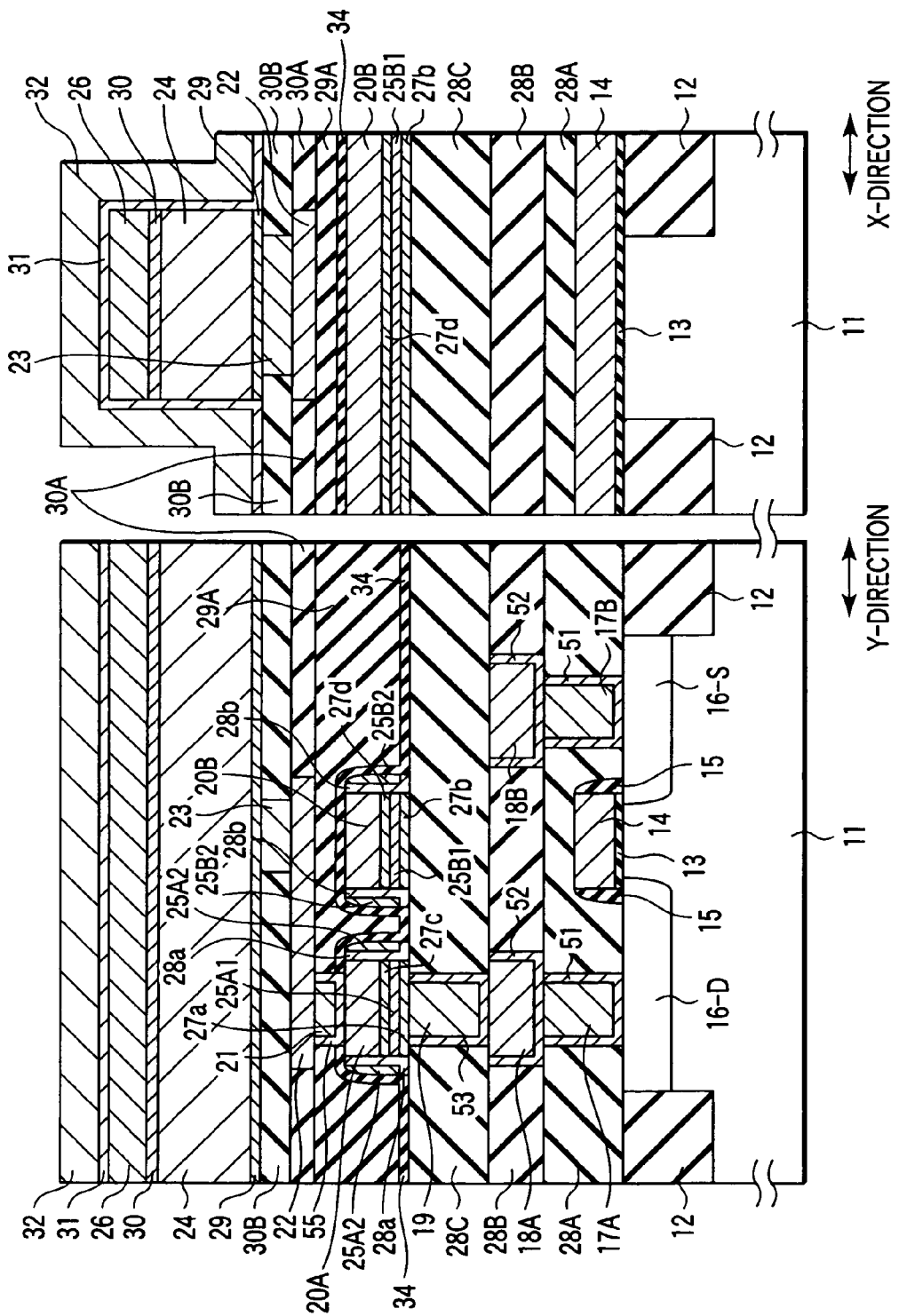
FIG. 24 is a sectional view showing one step of the manufacturing method of the memory according to the second embodiment.

Subsequently, as shown in FIG. 24, the barrier layer (e.g., the lamination of Ta (10 nm) and TaN (10 nm)) 31 with which the data selection line 24 is coated is formed on the insulating layer 30B by the sputter method. Continuously, the yoke material (such as NiFe) 32 which has the high permeability is formed in a thickness of about 50 nm on the barrier layer 31 by the sputter method.

Figure 25:
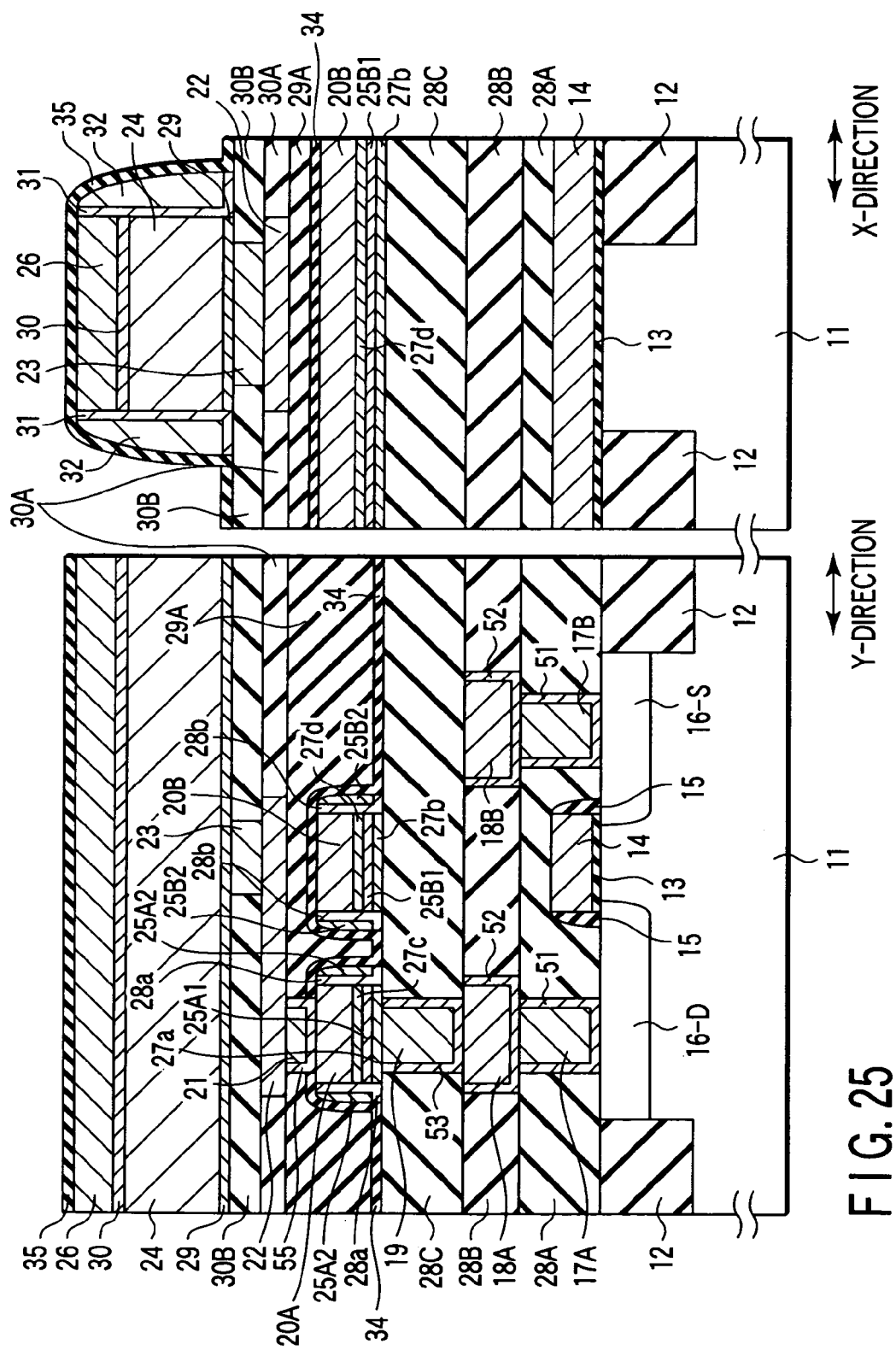
FIG. 25 is a sectional view showing one step of the manufacturing method of the memory according to the second embodiment.

Moreover, when the yoke material 32 and barrier layer 31 are etched by the RIE method, as shown in FIG. 25, the yoke material 32 and barrier layer 31 remain only on the side wall portions of the data selection line 24.

Furthermore, as shown in FIG. 25, the CVD method is used to form the barrier layer (such as SiN) with which the yoke materials 26, 32 are coated in a thickness of about 20 nm.

The magnetic random access memory of the second embodiment (FIGS. 18 and 19) is completed by the above-described steps.

(3) Conclusion

As described above, according to the second embodiment, the yoke materials 25A1, 25A2, 25B1, 25B2 with which the lower and side surfaces of the intermediate layer 20A and write word line 20B are coated are further coated with the barrier layer 34 which has the function of preventing the diffusion of atoms. Moreover, the yoke materials 26, 32 with which the upper and side surfaces of the data selection line 24 are coated are further coated with the barrier layer 35 which has the function of preventing the diffusion of atoms.

Therefore, the atoms of the materials constituting the yoke materials 25A1, 25A2, 25B1, 25B2, 26, 32 can be inhibited from being diffused in the semiconductor substrate 11, and the characteristics of the MOS transistor can be prevented from being deteriorated.

5. THIRD EMBODIMENT

Figure 26:
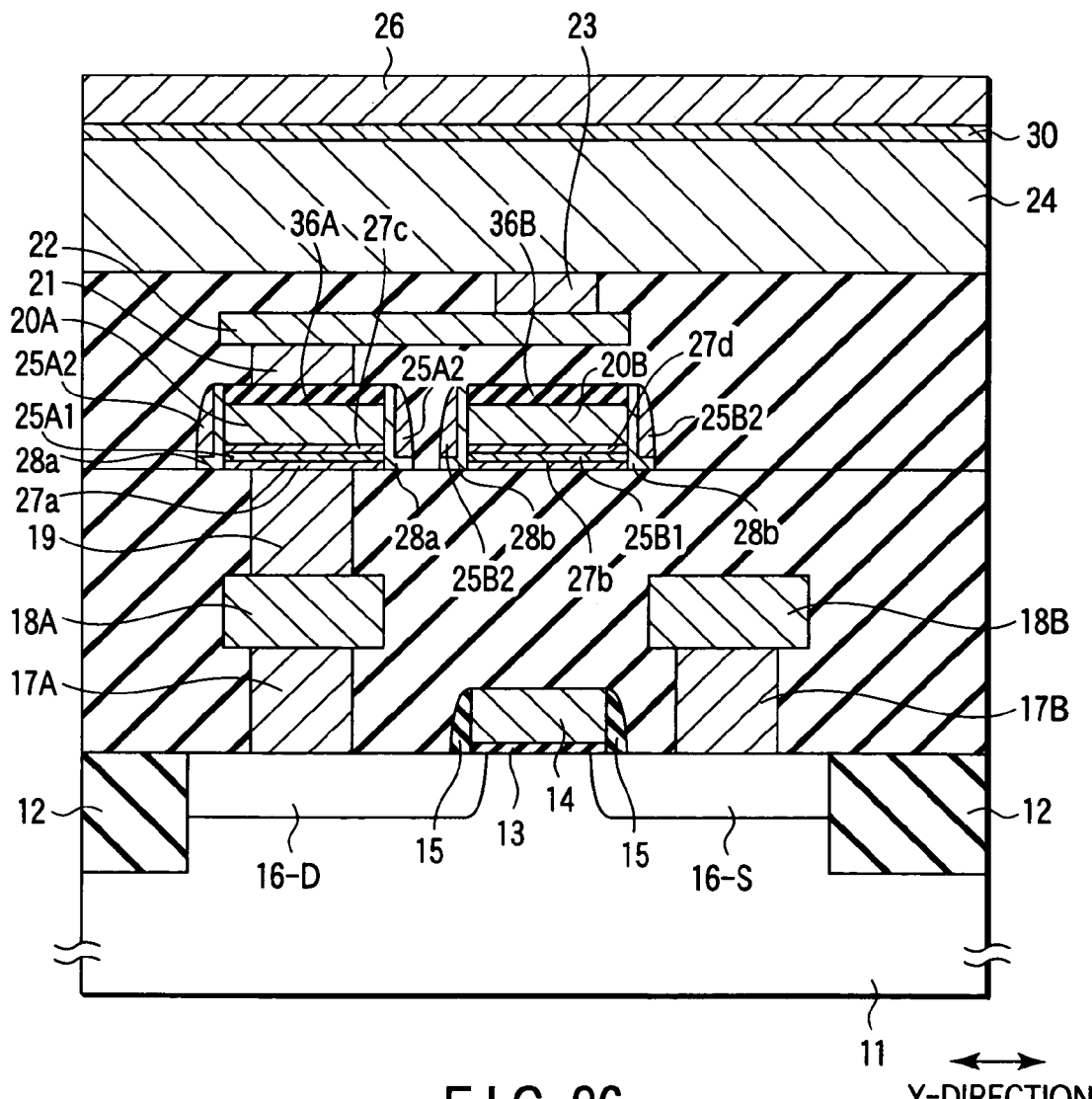
FIG. 26 is a sectional view of the magnetic random access memory according to a third embodiment.
Figure 27:
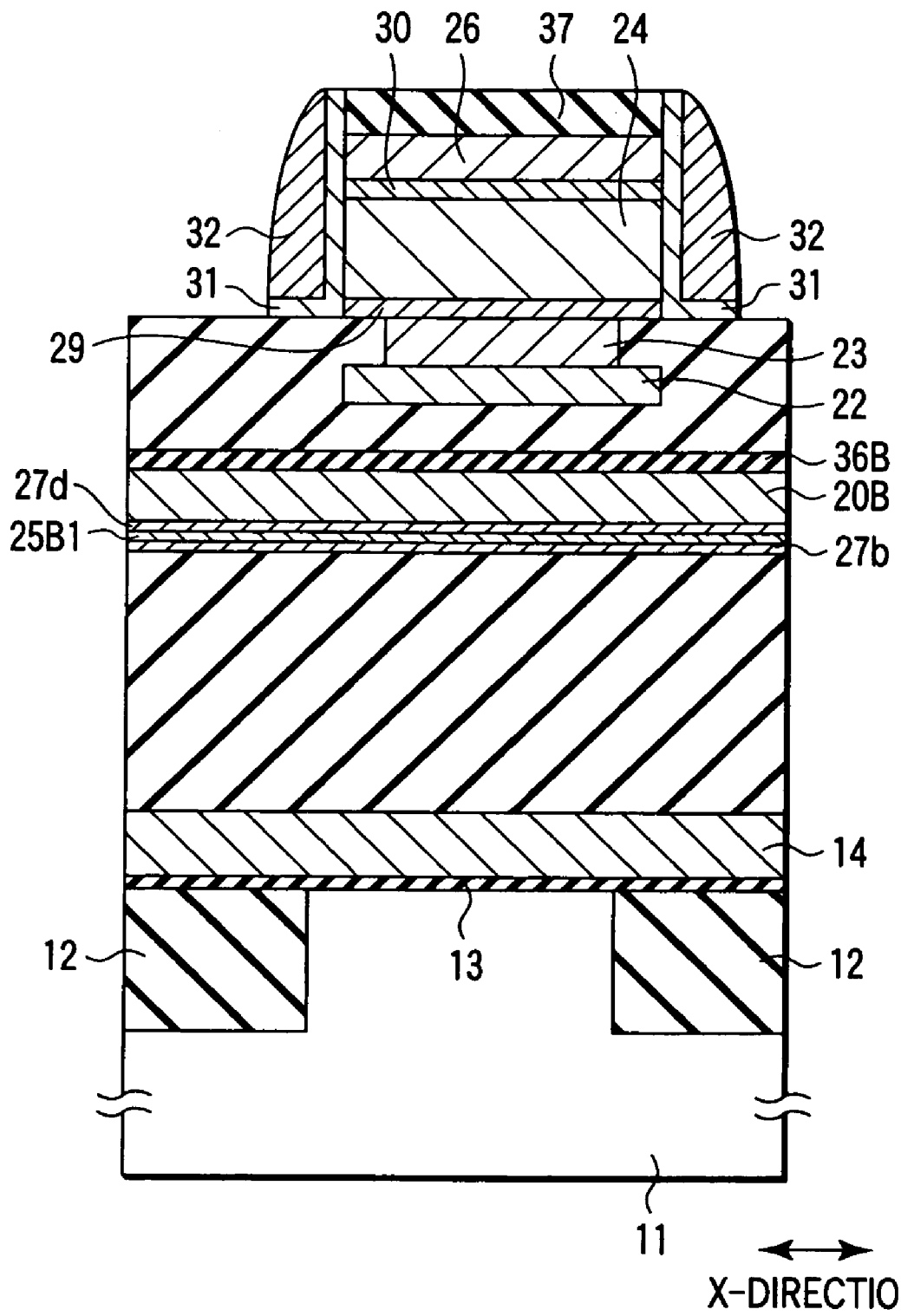
FIG. 27 is a sectional view of the magnetic random access memory according to the third embodiment.

FIGS. 26 and 27 show the device structure of the magnetic random access memory according to a third embodiment of the present invention. It is to be noted that FIG. 26 shows the section of the Y-direction, and FIG. 27 shows the section of the X-direction of the MTJ element portion of FIG. 26. The X-direction crosses at right angles to the Y-direction.

The device structure of the present embodiment is characterized in that hard masks (such as $SiO_2$) are formed as masks at a wiring processing time right on the write word line and data selection line.

The element separation insulating layers 12 including the STI structure are formed in the semiconductor substrate (such as the p-type silicon substrate and p-type well region) 11. The region surrounded with the element separation insulating layers 12 is the element region in which the read selection switch is formed.

The read selection switch is constituted of the MOS transistor (n-channel type MOS transistor). The gate insulating layer 13, gate electrode 14, and side wall insulating layers 15 are formed on the semiconductor substrate 11. The gate electrode 14 extends in the X-direction, and functions as the read word line for selecting the read cell (MTJ element) at the read operation time.

The source region (e.g., n-type diffusion layer) 16-S and drain region (e.g., n-type diffusion layer) 16-D are formed in the semiconductor substrate 11. The gate electrode (read word line) 14 is disposed on the channel region between the source region 16-S and drain region 16-D.

One of the metal layers constituting the first metal wiring layer functions as the intermediate layer 18A for vertically stacking a plurality of contact plugs, and another layer functions as the source line 18B.

The intermediate layer 18A is electrically connected to the drain region 16-D of the read selection switch (MOS transistor) by the contact plug 17A. The source line 18B is electrically connected to the source region 16-S of the read selection switch via the contact plug 17B. The source line 18B extends in the X-direction, for example, similarly as the gate electrode (read word line) 14.

One of the metal layers constituting the second metal wiring layer functions as the intermediate layer 20A for vertically stacking a plurality of contact plugs, and another layer functions as the write word line 20B. The intermediate layer 20A is electrically connected to the intermediate layer 18A by the contact plug 19. The write word line 20B extends, for example, in the X-direction similarly as the gate electrode (read word line) 14.

The lower surfaces of the intermediate layer 20A and write word line 20B are coated with the material having the high permeability, that is, yoke materials 25A1, 25B1.

The barrier metals (e.g., Ti, TiN, or the lamination of these) 27a, 27b are formed right under the yoke materials 25A1, 25B1, and the barrier metals (e.g., Ti, TiN, or the lamination of these) 27c, 27d are formed right on the barrier metals. That is, the yoke materials 25A1, 25B1 are held between the barrier metals 27a, 27b, 27c, 27d.

Moreover, the side surfaces of the intermediate layer 20A and write word line 20B are also coated with the materials which have high permeability, that is, yoke materials 25A2, 25B2.

When the yoke materials 25A1, 25B1, 25A2, 25B2 are used as the traction material of the magnetic force line, the magnetic field Hy generated by the write current flowing through the write word line 20B can efficiently be concentrated on the MTJ element 23.

The barrier layers 28a, 28b (e.g., Ti, TiN, or the lamination of these, or Ta, TaN, or the lamination of these) are formed on the side surfaces of the intermediate layer 20A and write word line 20B. The barrier layers 28a, 28b separate the yoke materials 25A1, 25B1 with which the lower surfaces of the intermediate layer 20A and write word line 20B are coated from the yoke materials 25A2, 25B2 with which the side surfaces are coated.

The barrier layers 28a, 28b may have either the conductivity or insulation property. Moreover, the barrier layers 28a, 28b may have the same functions as those of the barrier metals 27a, 27b.

Hard masks (such as $SiO_2$) 36A, 36B constituting the masks at the wiring processing time (RIE time) are formed right on the intermediate layer 20A and write word line 20B.

One of the metal layers constituting the third metal wiring layer functions as the lower electrode 22 of the MTJ element 23. The lower electrode 22 is electrically connected to the intermediate layer 20A by the contact plug 21. The MTJ element 23 is mounted on the lower electrode 22. Here, the MTJ element 23 is disposed right on the write word line 20B, and formed in the rectangular shape long in the X-direction (magnetization easy axis is the X-direction).

One of the metal layers constituting the fourth metal wiring layer functions as the data selection line (read/write bit line) 24. The data selection line 24 is electrically connected to the MTJ element 23, and extends in the Y-direction.

The upper surface of the data selection line 24 is coated with the material having the high permeability, that is, the yoke material 26. The barrier metal (e.g., Ti, TiN, or the lamination of these) 29 is formed on the lower surface of the data selection line 24, and the barrier layer (e.g., Ti, TiN, or the lamination of these, or Ta, TaN, or the lamination of these) 30 is formed on the upper surface of the data selection line.

Moreover, the side surface of the data selection line 24 is also coated with the material which has the high permeability, that is, the yoke materials 32.

When the yoke materials 26, 32 are used as the traction material of the magnetic force line, the magnetic field Hx generated by the write current flowing through the data selection line 24 can efficiently be concentrated on the MTJ element 23.

The barrier layers 31 (e.g., Ti, TiN, or the lamination of these, or Ta, TaN, or the lamination of these) are formed on the side surfaces of the data selection line 24. The barrier layers 31 separate the yoke material 26 with which the upper surface of the data selection line 24 is coated from the yoke materials 32 with which the side surfaces of the data selection line are coated.

The barrier layers 30, 31 may have either the conductivity or insulation property. Moreover, the barrier layers 30, 31 may have the same functions as those of the barrier metal 29.

A hard mask (such as $SiO_2$) 37 is formed as the mask at the wiring processing time (RIE time) right on the data selection line 24.

(2) Manufacturing Method

The manufacturing method of the magnetic random access memory according to the third embodiment of the present invention will next be described.

Figure 28:
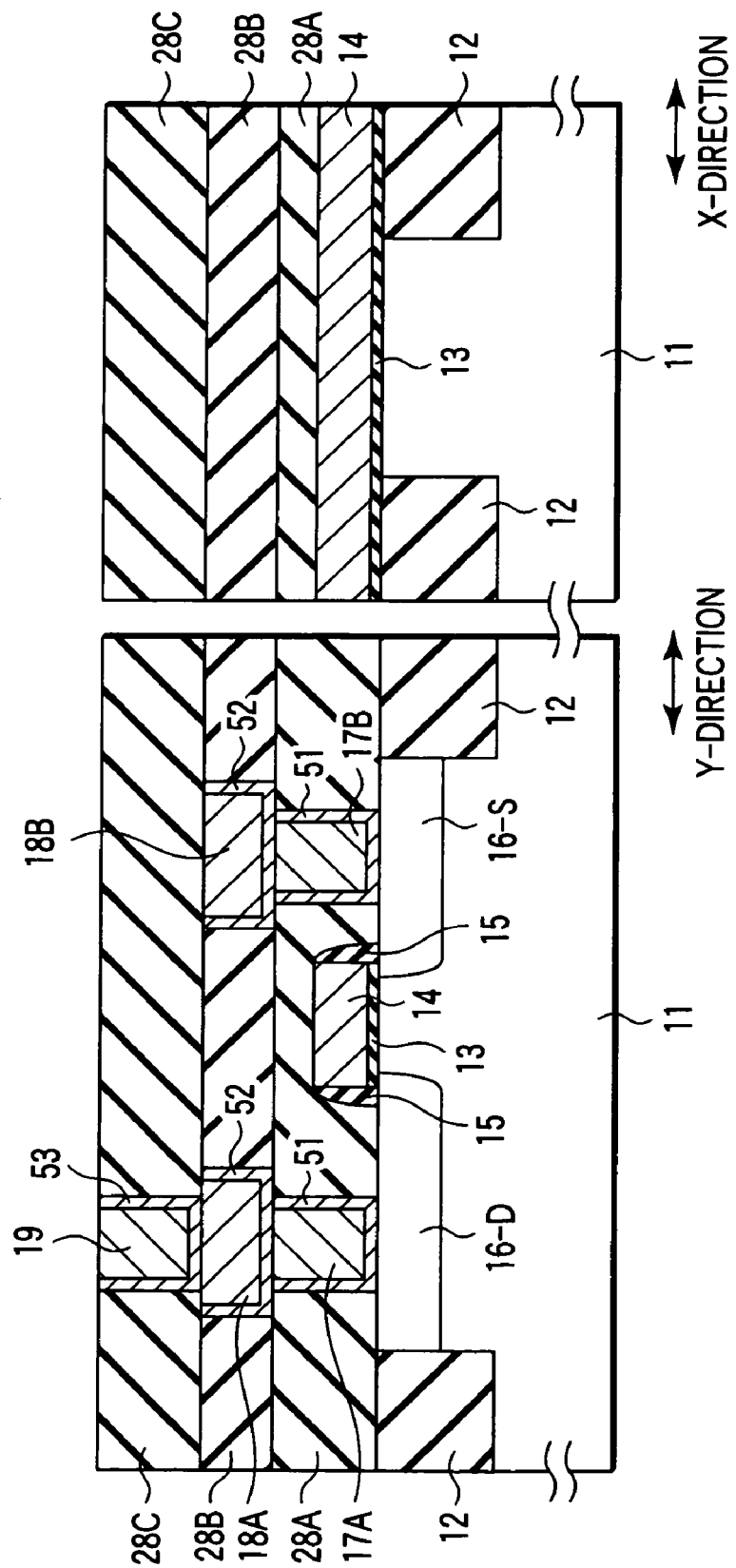
FIG. 28 is a sectional view showing one step of the manufacturing method of the memory according to the third embodiment.

First, as shown in FIG. 28, the methods such as the PEP, CVD, and CMP methods are used to form the element separation insulating layer 12 including the STI structure in the semiconductor substrate 11.

Moreover, the MOS transistor as the read selection switch is formed in the element region surrounded with the element separation insulating layer 12.

After forming the gate insulating layer 13 and gate electrode (read word line) 14 by the CVD, PEP, and RIE methods, the source region 16-S and drain region 16-D are formed by the ion implantation method, so that the MOS transistor can easily be formed. The side wall insulating layers 15 may also be formed on side wall portions of the gate electrode 14 by the CVD and RIE methods.

Thereafter, the insulating layer 28A with which the MOS transistor is completely coated is formed by the CVD method. Moreover, the surface of the insulating layer 28A is flatted using the CMP method. The contact holes reaching the source region 16-S and drain region 16-D of the MOS transistor are formed in the insulating layer 28A using the PEP and RIE methods.

The barrier metals (e.g., Ti, TiN, or the lamination of these) 51 are formed on the insulating layer 28A and on the inner surfaces of the contact holes by the sputter method. Continuously, the conductive materials (e.g., the conductive polysilicon film including the impurities, metal film, and the like) with which the contact holes are completely filled are formed on the insulating layer 28A by the sputter method. Moreover, by the CMP method, the conductive materials and barrier metals 51 are polished, and the contact plugs 17A, 17B are formed.

The insulating layer 28B is formed on the insulating layer 28A using the CVD method. The PEP and RIE methods are used to form the wiring trenches in the insulating layer 28B. The sputter method is used to form the barrier metals (e.g., Ti, TiN, or the lamination of these) 52 on the insulating layer 28B and on the inner surfaces of the wiring trenches. Continuously, the conductive materials (e.g., the metal films such as aluminum and copper) with which the wiring trenches are completely filled are formed on the insulating layer 28B by the sputter method. Thereafter, by the CMP, the conductive materials and barrier metals 52 are polished, and the intermediate layer 18A and source line 18B are formed.

Subsequently, the CVD method is used to form the insulating layer 28C on the insulating layer 28B. The PEP and RIE methods are used to form the via holes in the insulating layer 28C. By the sputter method, the barrier metals (e.g., Ti, TiN, or the lamination of these) 53 are formed on the insulating layer 28C and on the inner surfaces of the via holes. Continuously, by the sputter method, the conductive materials (e.g., the metal films such as aluminum and copper) with which the via holes are completely filled are formed on the insulating layer 28C. Thereafter, by the CMP method, the conductive materials and barrier metals 53 are polished, and the via plug 19 is formed.

Figure 29:
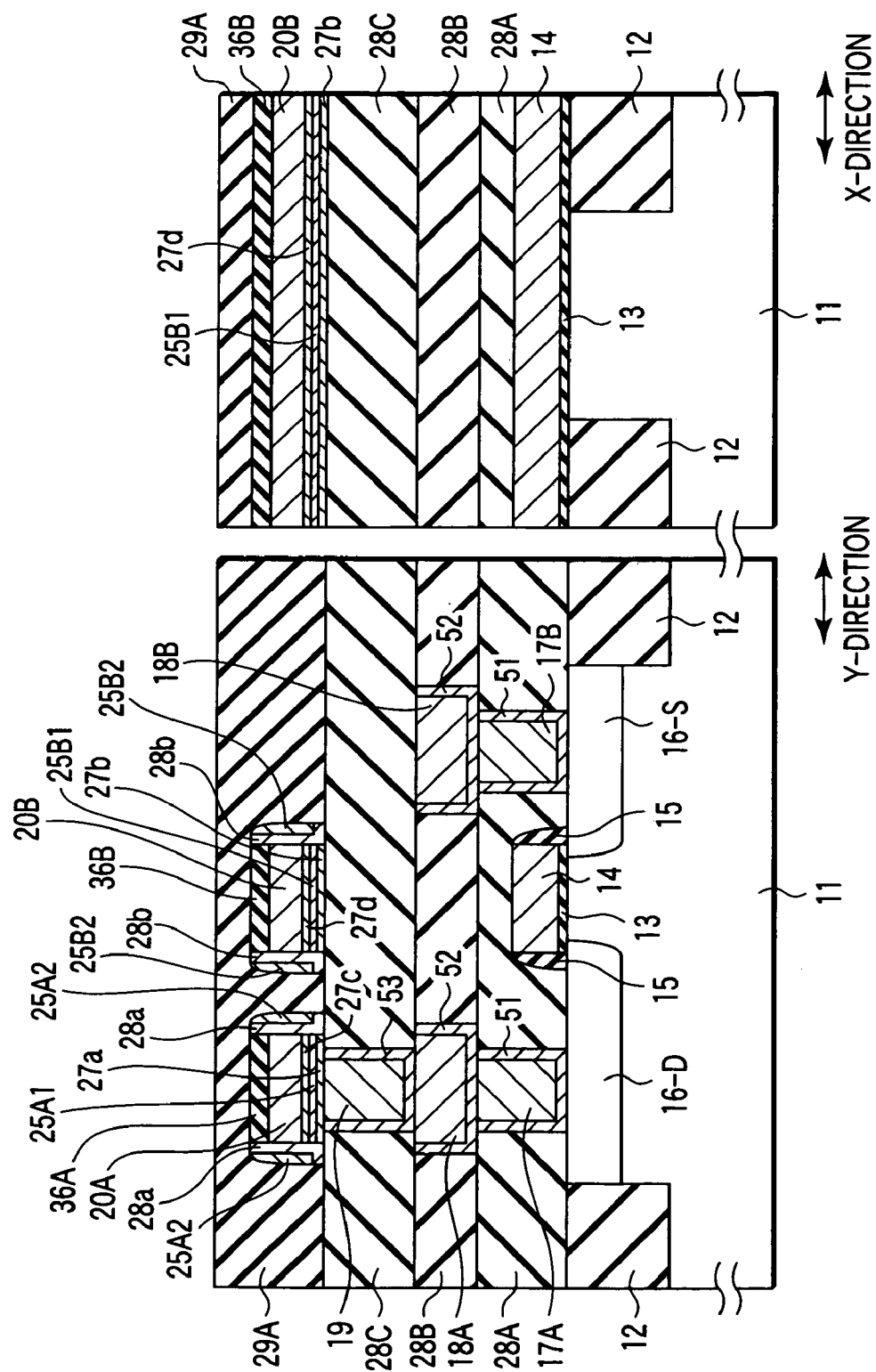
FIG. 29 is a sectional view showing one step of the manufacturing method of the memory according to the third embodiment.

Subsequently, as shown in FIG. 29, by the sputter method, the barrier metals (e.g., the lamination of Ti (10 nm) and TiN (10 nm)) 27a, 27b are formed on the insulating layer 28C. Subsequently, the sputter method is used to form the yoke materials (e.g., NiFe) 25A1, 25B1 which have the high permeability in a thickness of about 50 nm on the barrier metals 27a, 27b. Moreover, the sputter method is used to form the barrier metals (e.g., the lamination of Ti (10 nm) and TiN (10 nm)) 27c, 27d on the yoke materials 25A1, 25B1.

Furthermore, the sputter method is continuously used to form the conductive material (e.g., AlCu) in a thickness of about 250 nm on the barrier metals 27c, 27d. Moreover, the sputter method is used to form insulating layers (such as $SiO_2$) 36A, 36B as the hard masks in a thickness of about 100 nm on the conductive material.

Thereafter, the resist pattern is formed by the PEP method. Moreover, the resist pattern is used as the mask to pattern the insulating layers 36A, 36B as the hard masks by the RIE method. Thereafter, the resist pattern is removed.

Subsequently, this time the insulating layers 36A, 36B are used as the masks to successively etch the conductive materials, yoke materials 25A1, 25B1, and barrier metals 27a, 27b, 27c, 27d by the RIE method, so that the intermediate layer 20A and write word line 20B are formed.

Additionally, the sputter method is used to form the barrier layers (e.g., the lamination of Ta (10 nm) and TaN (10 nm)) 28a, 28b with which the intermediate layer 20A and write word line 20B are coated. The sputter method is continuously used to form the yoke materials (e.g., NiFe) 25A2, 25B2 which have the high permeability in a thickness of about 50 nm on the barrier layers 28a, 28b.

Moreover, by the RIE method, the yoke materials 25A2, 25B2 and barrier layers 28a, 28b are etched, so that the yoke materials 25A2, 25B2 and barrier layers 28a, 28b remain only on the side wall portions of the intermediate layer 20A and write word line 20B.

Thereafter, the CVD method is used to form the insulating layer 29A with which the intermediate layer 20A and write word line 20B are completely coated on the barrier layer 34. Moreover, for example, by the CMP method, the surface of the insulating layer 29A is flatted.

Figure 30:
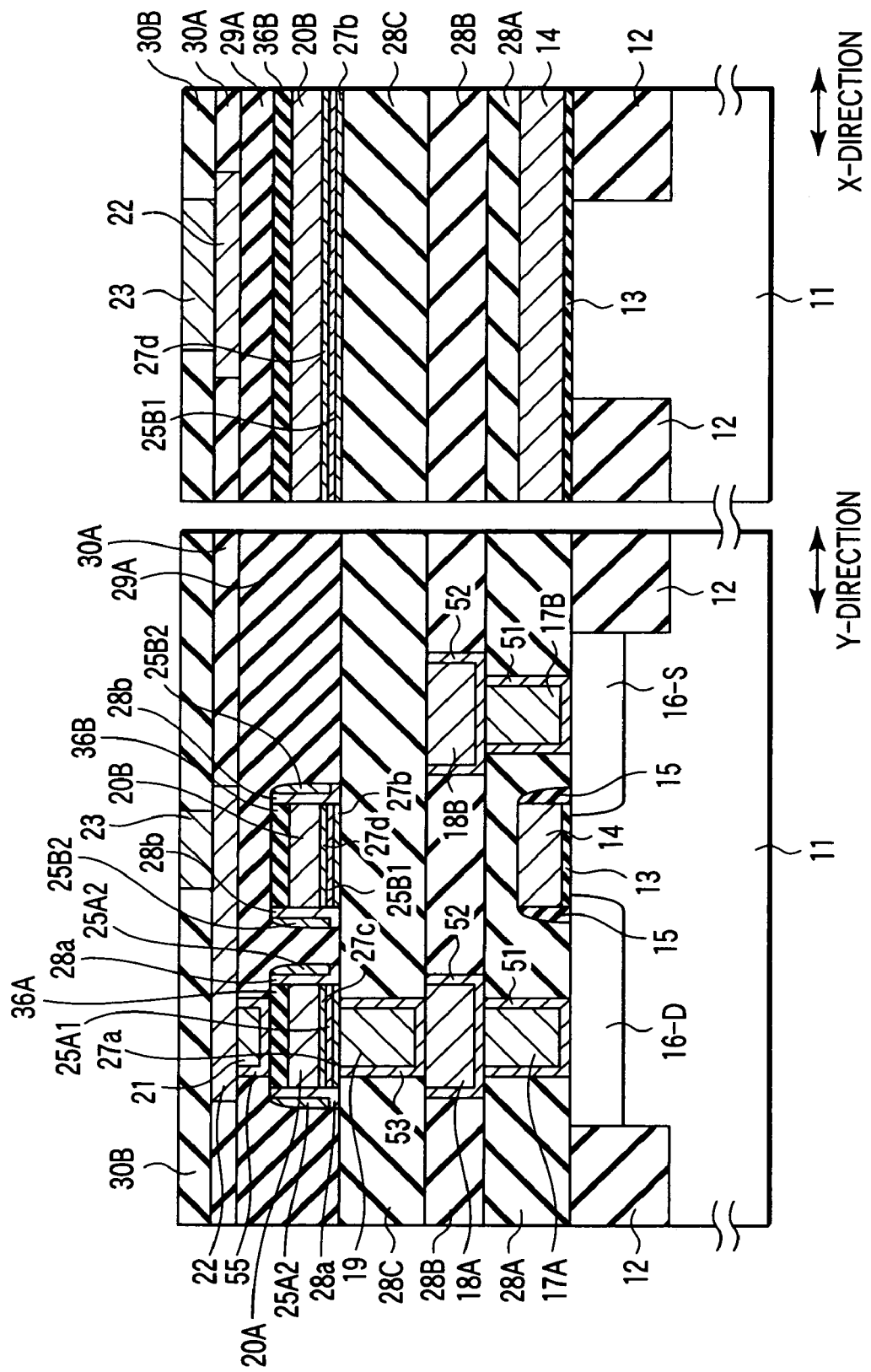
FIG. 30 is a sectional view showing one step of the manufacturing method of the memory according to the third embodiment.

Subsequently, as shown in FIG. 30, the PEP and RIE methods are used to form the via holes which reach the intermediate layer 20A in the insulating layer 29A. By the sputter method, the barrier metals (e.g., Ti, TiN, or the lamination of these) 55 are formed on the insulating layer 29A and on the inner surfaces of the via holes in a thickness of about 10 nm. Continuously, the conductive materials (e.g., the metal film such as tungsten) with which the via holes are completely filled are formed on the insulating layer 29A by the CVD method. Thereafter, by the CMP method, the conductive materials and barrier metals 55 are polished, and the via plug 21 is formed.

The CVD method is used to form the insulating layer 30A on the insulating layer 29A. The PEP and RIE methods are used to form the wiring trenches in the insulating layer 30A. By the sputter method, the conductive materials (e.g., the metal films such as Ta) with which the wiring trenches are completely filled are formed in a thickness of about 50 nm on the insulating layer 30A. Thereafter, by the CMP, the conductive materials are polished, and the local interconnect line (lower electrode of the MTJ element) 22 is formed.

The CVD method is used to successively deposit a plurality of layers on the local interconnect line 22, and these plurality of layers are further patterned to form the MTJ elements 23.

The CVD method is used to form the insulating layer 30B with which the MTJ element 23 is coated, and subsequently, the insulating layer 30B on the MTJ element 23 is removed, for example, by the CMP method. As a result, the topmost layer of the MTJ element 23 is exposed, and only the side surfaces of the MTJ element 23 are coated with the insulating layer 30B.

It is to be noted that to constitute the topmost layer of the MTJ element 23 by Ta or W, the topmost layer of the MTJ element 23 is exposed, and subsequently the data selection line described later can directly be formed.

Figure 31:
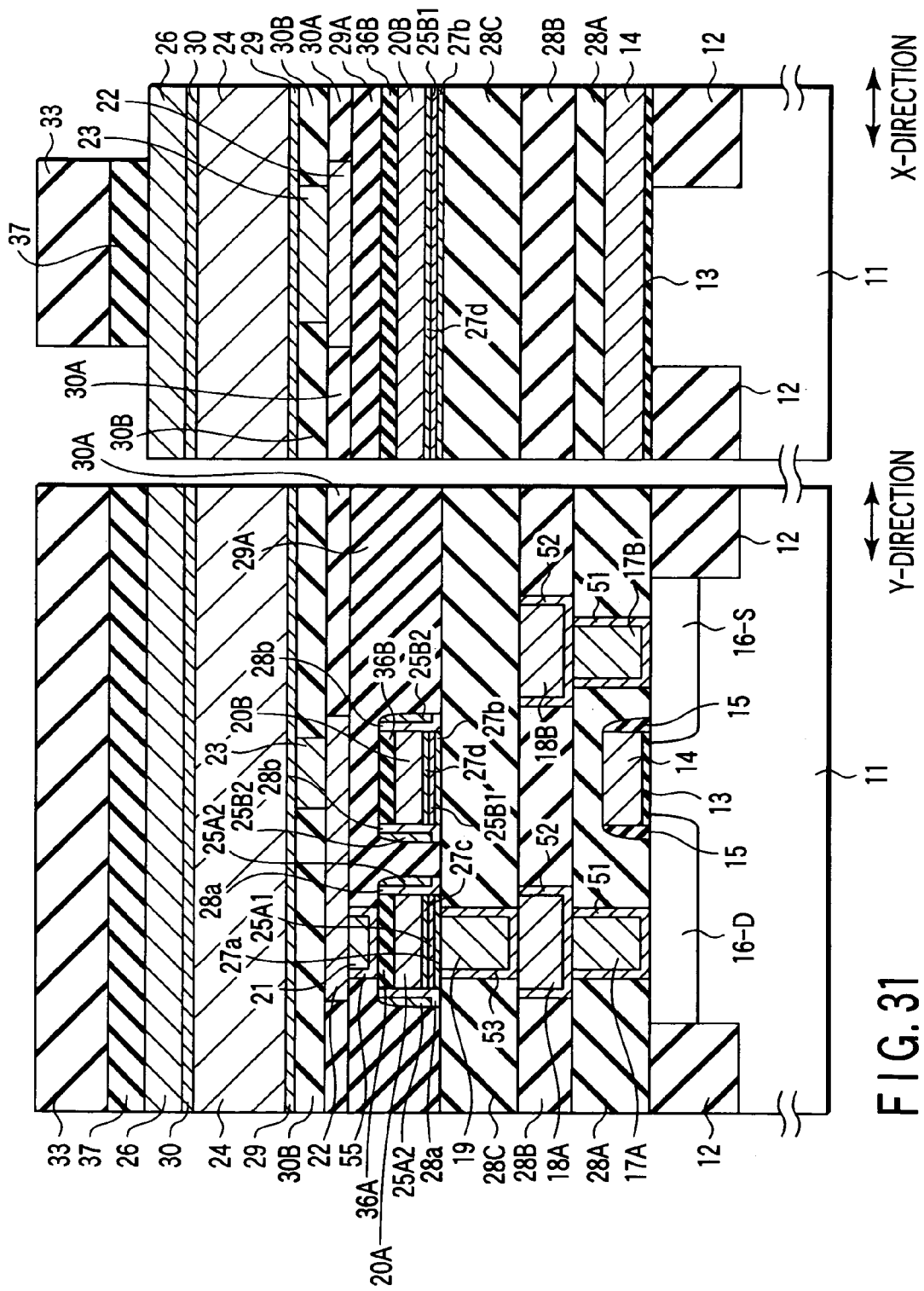
FIG. 31 is a sectional view showing one step of the manufacturing method of the memory according to the third embodiment.

Subsequently, as shown in FIG. 31, the barrier metal (e.g., the lamination of Ti (10 nm) and TiN (10 nm)) 29 is formed on the insulating layer 30B by the sputter method. Continuously, the conductive material (such as AlCu) is formed in a thickness of about 400 nm on the barrier metal 29 by the sputter method. Continuously, the barrier layer (e.g., the lamination of Ta (10 nm) and TaN (10 nm)) 30 is formed on the conductive material by the sputter method.

Furthermore, the yoke material (such as NiFe) 26 which has the high permeability is continuously formed in a thickness of about 50 nm on the barrier layer 30 by the sputter method. Moreover, the insulating layer (such as $SiO_2$) 37 which functions as the hard mask at the wiring processing time is formed on the yoke material 26 by the sputter method. Thereafter, the PEP method is used to form the resist pattern 33.

Additionally, the resist pattern 33 is used as the mask to pattern the insulating layer 37 as the hard mask by the RIE method. Thereafter, the resist pattern 33 is removed.

Figure 32:
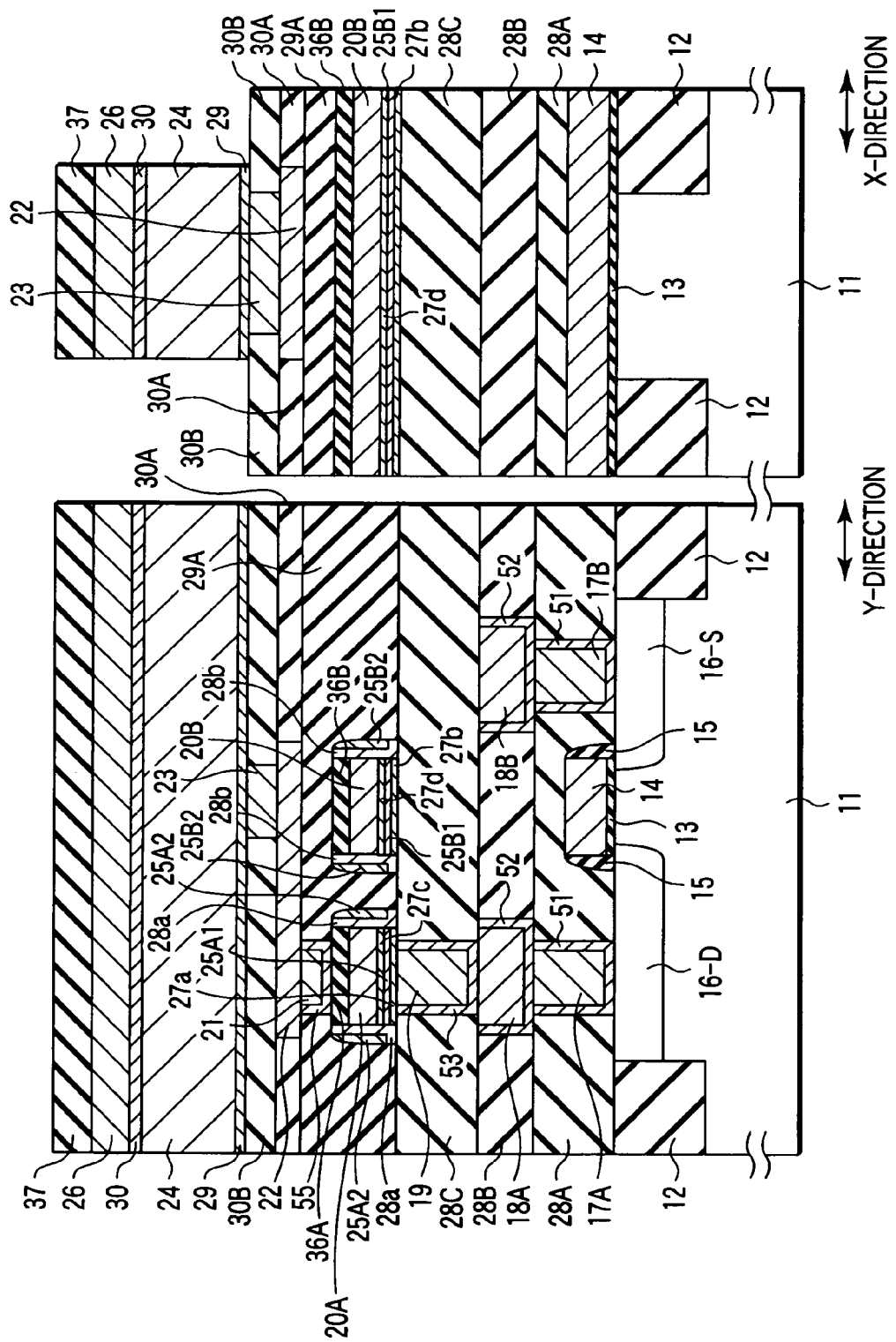
FIG. 32 is a sectional view showing one step of the manufacturing method of the memory according to the third embodiment.

Subsequently, as shown in FIG. 32, this time the insulating layer 37 is used as the mask to successively etch the yoke material 26, barrier layer 30, conductive material, and barrier metal 29 by the RIE method, so that the data selection line (read/write bit line) 24 is formed.

Figure 33:
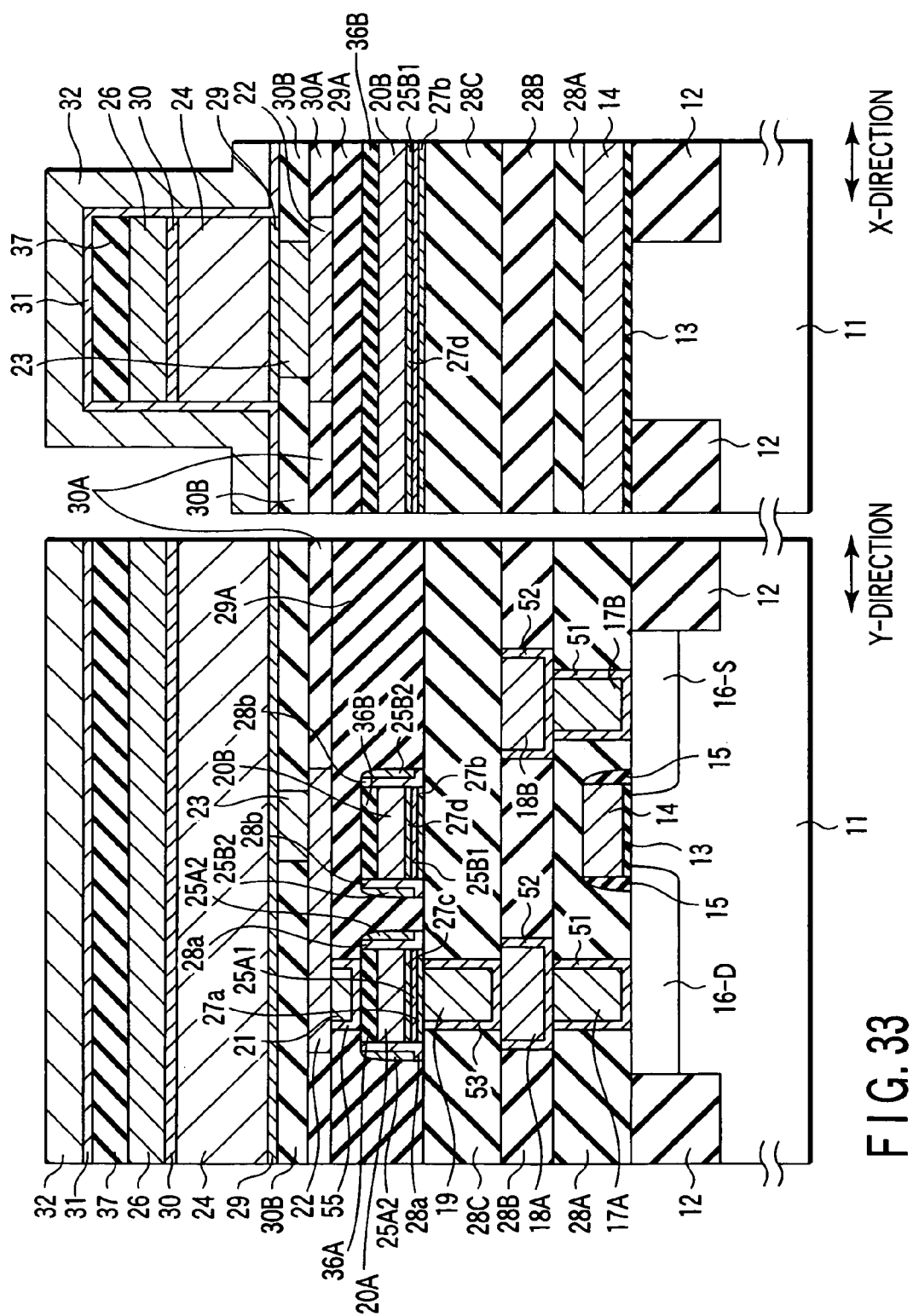
FIG. 33 is a sectional view showing one step of the manufacturing method of the memory according to the third embodiment.

Subsequently, as shown in FIG. 33, the barrier layer (e.g., the lamination of Ta (10 nm) and TaN (10 nm)) 31 with which the data selection line 24 is coated is formed on the insulating layer 30B by the sputter method. Continuously, the yoke material (such as NiFe) 32 which has the high permeability is formed in a thickness of about 50 nm on the barrier layer 31 by the sputter method.

Moreover, when the yoke material 32 and barrier layer 31 are etched by the RIE method, as shown in FIG. 34, the yoke material 32 and barrier layer 31 remain only on the side wall portions of the data selection line 24.

The magnetic random access memory of the third embodiment (FIGS. 26 and 27) is completed by the above-described steps.

(3) Conclusion

As described above, according to the third embodiment, to process the intermediate layer 20A and write word line 20B, the hard mask (such as $SiO_2$) is used as the mask of RIE, not a photoresist. Therefore, at the RIE time, an etching selection ratio can sufficiently be secured between the mask material, and the conductive material, yoke material, and barrier metal.

Similarly, also to process the data selection line 24, not the photoresist, but the hard mask (such as $SiO_2$) is used as the mask of RIE. Therefore, at the RIE time, the etching selection ratio can sufficiently be secured between the mask material, and the yoke material, barrier layer, conductive material, and barrier metal.

6. FOURTH EMBODIMENT

Figure 35:
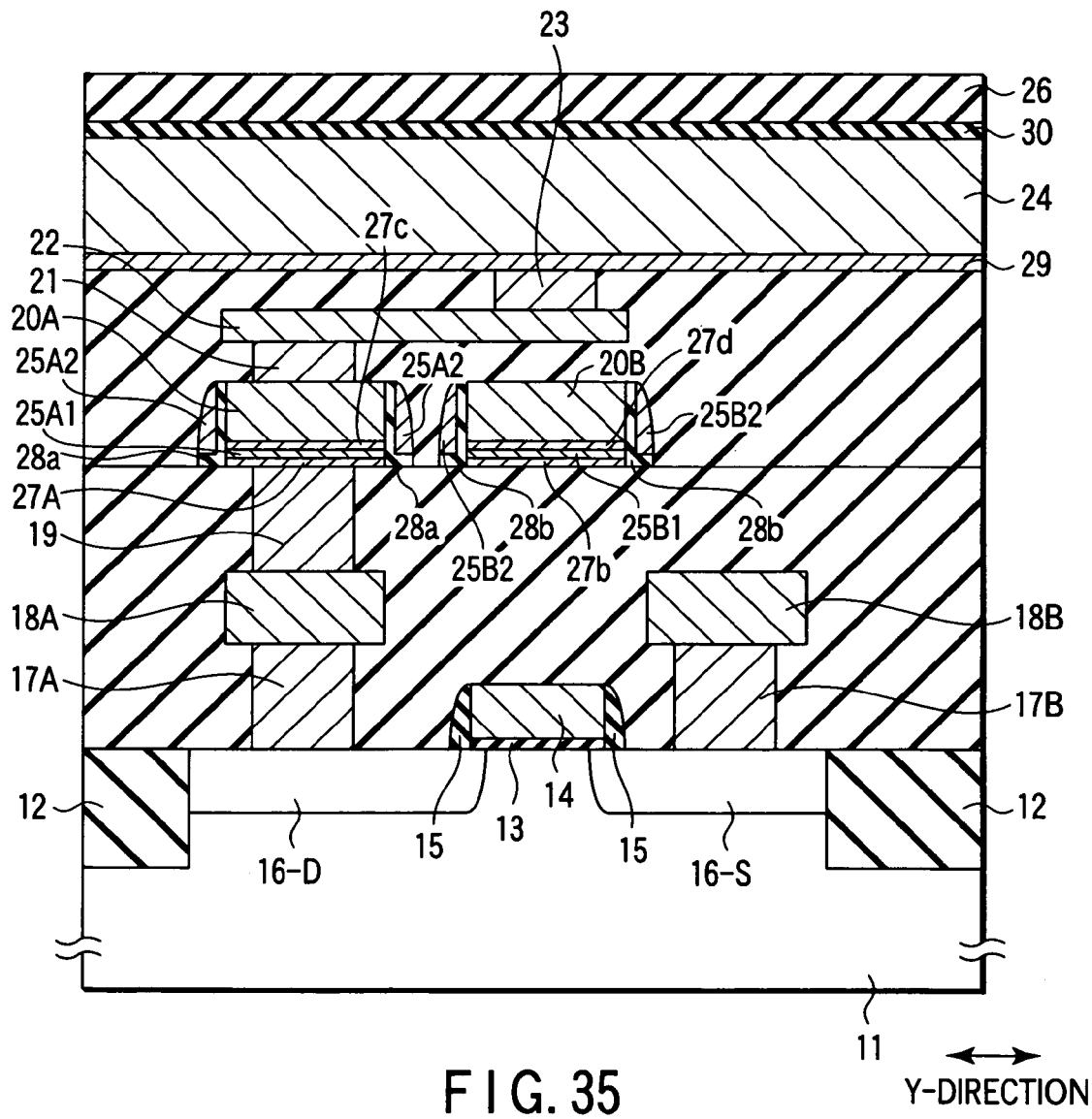
FIG. 35 is a sectional view of the magnetic random access memory according to a fourth embodiment.
Figure 36:
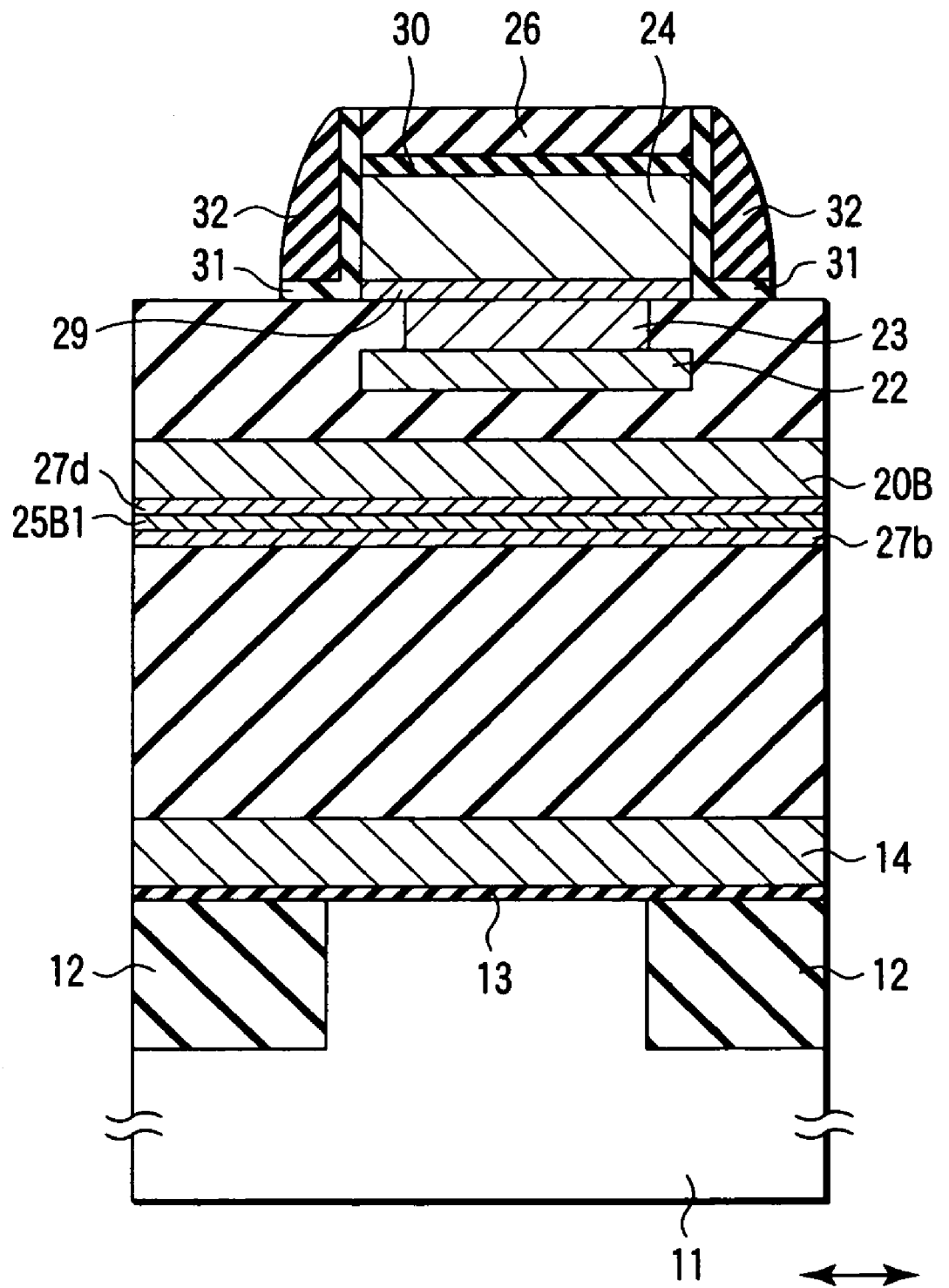
FIG. 36 is a sectional view of the magnetic random access memory according to the fourth embodiment.

FIGS. 35 and 36 show the device structure of the magnetic random access memory according to a fourth embodiment of the present invention. It is to be noted that FIG. 35 shows the section of the Y-direction, and FIG. 36 shows the section of the X-direction of the MTJ element portion of FIG. 35. The X-direction crosses at right angles to the Y-direction.

The device structure of the present embodiment is characterized in that the yoke materials 25A1, 25A2, 25B1, 25B2 are constituted of conductive materials, and the yoke materials 26, 32 and barrier layers 28a, 28b, 30, 31 are constituted of insulating materials in the device of the first embodiment.

That is, the yoke materials 25A1, 25A2, 25B1, 25B2, 26, 32 and barrier layers 28a, 28b, 30, 31 may also be constituted of the conductive or insulating materials.

7. FIFTH EMBODIMENT

Figure 37:
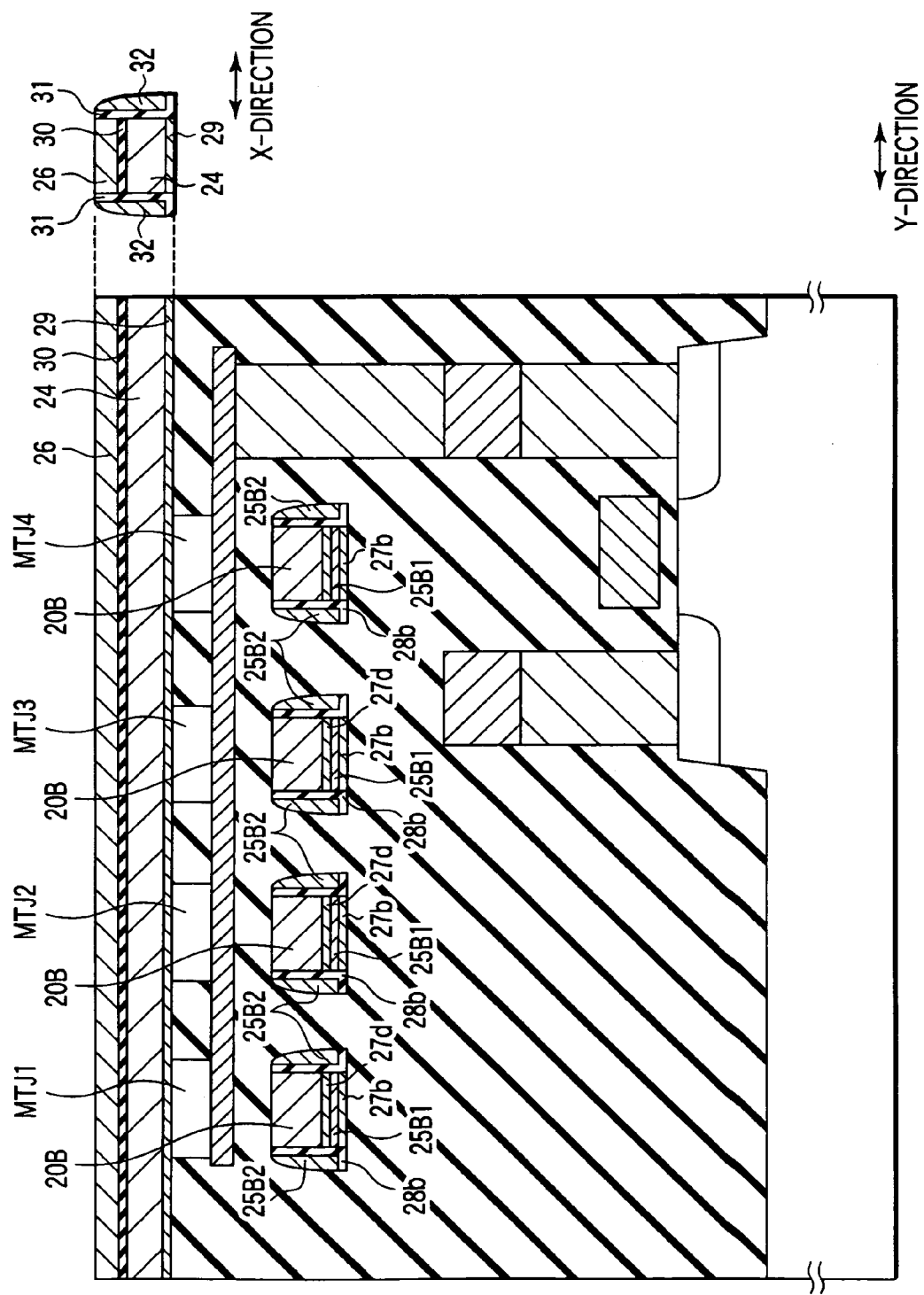
FIG. 37 is a sectional view of the magnetic random access memory according to a fifth embodiment.

FIG. 37 shows the device structure of the magnetic random access memory according to a fifth embodiment of the present invention.

The device structure of the present embodiment is characterized in that the structure of a write line in the first embodiment is applied to the magnetic random access memory having a so-called ladder type cell array structure.

In the ladder type cell array structure, a plurality of (four in the present embodiment) MTJ elements 23 are arranged in a lateral direction (direction parallel to the surface of the semiconductor substrate) on the semiconductor substrate 11. These MTJ elements 23 are connected in parallel between the data selection line (read/write bit line) 24 and lower electrode.

One end of the MTJ element 23 is directly connected to the data selection line 24, and the other end of the element is connected in common to a read selection switch RSW via the lower electrode. A plurality of MTJ elements 23 share one data selection line 24.

The data selection line 24 is disposed right on the plurality of MTJ elements 23, and extends in the Y-direction. The upper surface of the data selection line 24 is coated with the yoke material 26 having the high permeability, and the side surfaces of the line are coated with the yoke materials 32 having the high permeability.

The barrier layer 30 is disposed between the data selection line 24 and yoke material 26, and the barrier layer 31 is disposed between the data selection line 24 and yoke material 32. The barrier layer 31 separates the yoke material 26 with which the upper surface of the data selection line 24 is coated from the yoke materials 32 with which the side surfaces of the data selection line 24 are coated.

The barrier layers 30, 31 may have either the conductivity or insulation property. Moreover, the barrier layers 30, 31 may have the same functions as those of the barrier metal 29.

The write word line 20B is disposed right under the MTJ element 23, and extends in the X-direction crossing at right angles to the Y-direction. The lower surface of the write word line 20B is coated with the yoke material 25B1 having the high permeability, and the side surfaces of the line are coated with the yoke material 25B2 having the high permeability.

The barrier layer 28b is disposed between the write word line 20B and yoke material 25B2. The barrier layer 28b separates the yoke material 25B1 with which the lower surface of the write word line 20B is coated from the yoke materials 25B2 with which the side surfaces of the write word line 20B are coated.

The barrier layer 28b may have either the conductivity or insulation property. Moreover, the barrier layer 28b may have the same function as that of the barrier metal 27b.

It is to be noted that in the fifth embodiment the yoke materials 25B1, 25B2, 26, 32, barrier metals 27b, 27d, and barrier layers 28b, 30, 31 may also be constituted of the conductive or insulating materials.

8. SIXTH EMBODIMENT

Figure 38:
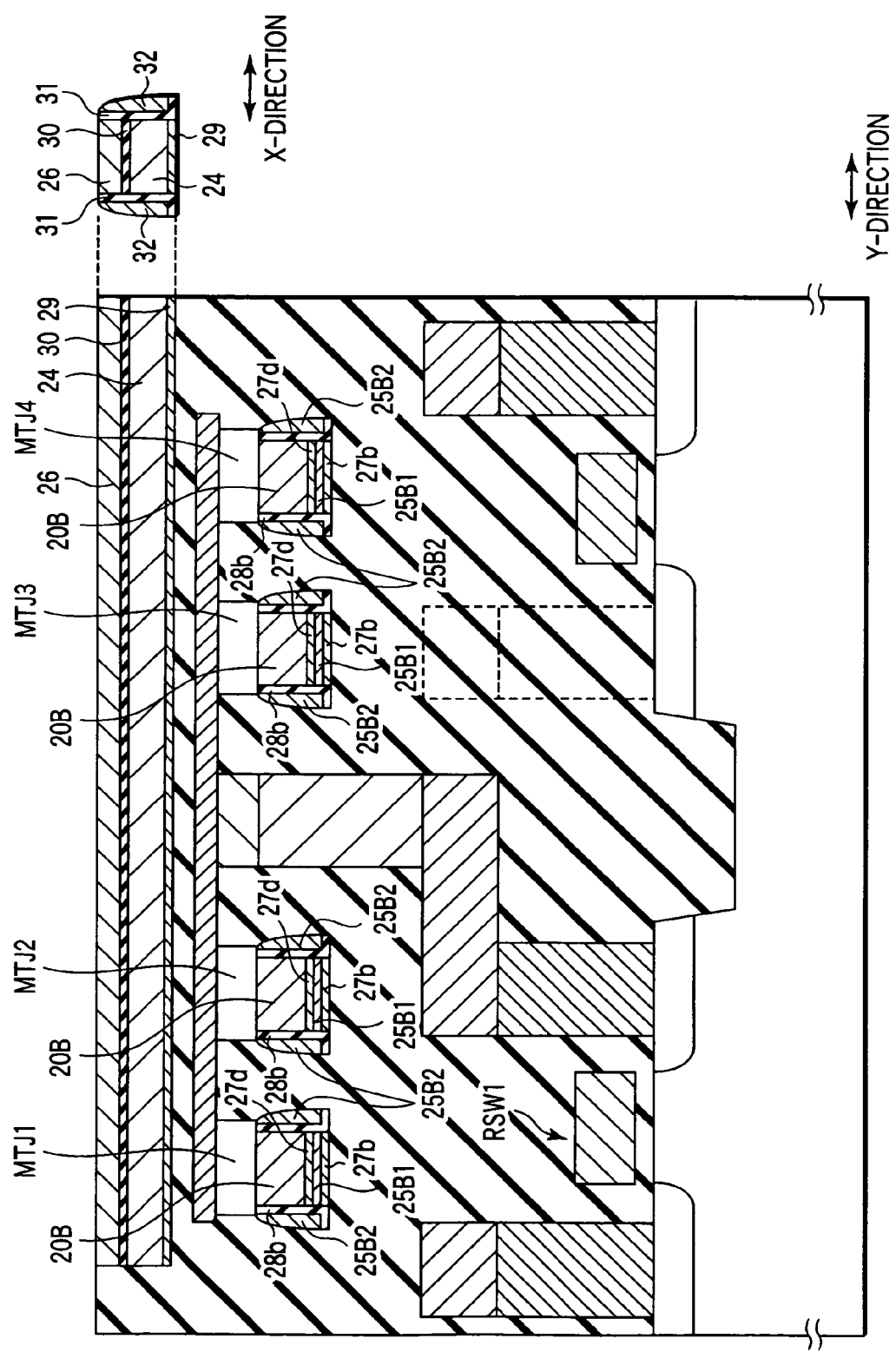
FIG. 38 is a sectional view of the magnetic random access memory according to a sixth embodiment.

FIG. 38 shows the device structure of the magnetic random access memory according to a sixth embodiment of the present invention.

The device structure of the present embodiment is characterized in that the structure of the write line in the first embodiment is applied to the magnetic random access memory having another type of cell array structure.

In the cell array structure, a plurality of (four in the present embodiment) MTJ elements 23 are arranged in the Y-direction (direction parallel to the surface of the semiconductor substrate) on the semiconductor substrate 11. These MTJ elements 23 are connected between the write word line 20B extending in the X-direction and the upper electrode.

One end of the MTJ element 23 is directly connected to the write word line 20B, and the other end of the element is connected in common to the read selection switch RSW via the upper electrode. A plurality of MTJ elements 23 share one data selection line 24.

The data selection line 24 is disposed right on the plurality of MTJ elements 23, and extends in the Y-direction. The upper surface of the data selection line 24 is coated with the yoke material 26 having the high permeability, and the side surfaces of the line are coated with the yoke materials 32 having the high permeability.

The barrier layer 30 is disposed between the data selection line 24 and yoke material 26, and the barrier layer 31 is disposed between the data selection line 24 and yoke material 32. The barrier layer 31 separates the yoke material 26 with which the upper surface of the data selection line 24 is coated from the yoke materials 32 with which the side surfaces of the data selection line 24 are coated.

The barrier layers 30, 31 may have either the conductivity or insulation property. Moreover, the barrier layers 30, 31 may have the same functions as those of the barrier metal 29.

The write word line 20B is disposed right under the MTJ element 23. The lower surface of the write word line 20B is coated with the yoke material 25B1 having the high permeability, and the side surfaces of the line are coated with the yoke material 25B2.

The barrier layer 28b is disposed between the write word line 20B and yoke material 25B2. The barrier layer 28b separates the yoke material 25B1 with which the lower surface of the write word line 20B is coated from the yoke materials 25B2 with which the side surfaces of the write word line 20B are coated.

The barrier layer 28b may have either the conductivity or insulation property. Moreover, the barrier layer 28b may have the same function as that of the barrier metal 27b.

It is to be noted that in the sixth embodiment the yoke materials 25B1, 25B2, 26, 32, barrier metals 27b, 27d, 29 and barrier layers 28b, 30, 31 may also be constituted of the conductive or insulating materials.

9. SEVENTH EMBODIMENT

Figure 39:
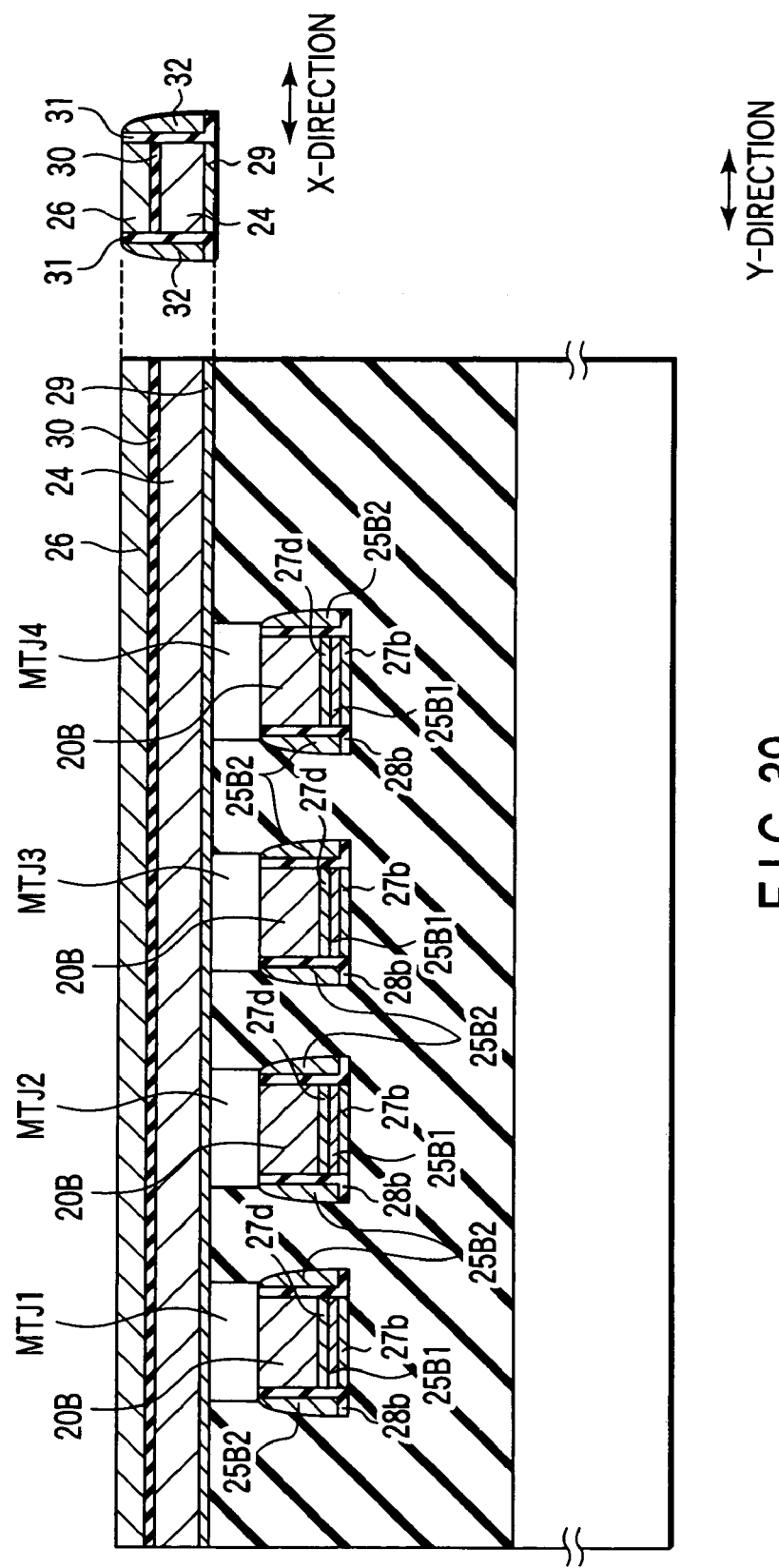
FIG. 39 is a sectional view of the magnetic random access memory according to a seventh embodiment.

FIG. 39 shows the device structure of the magnetic random access memory according to a seventh embodiment of the present invention.

The device structure of the present embodiment is characterized in that the structure of the write line in the first embodiment is applied to the magnetic random access memory having a so-called cross point type cell array structure.

In the cross point type cell array structure, a plurality of (four in the present embodiment) MTJ elements 23 are arranged in the Y lateral direction (direction parallel to the surface of the semiconductor substrate) on the semiconductor substrate 11. These MTJ elements 23 are connected between the data selection line (read/write bit line) 24 extending in the Y-direction and the write word line 20B extending in the X-direction intersecting with the Y-direction.

One end of the MTJ element 23 is directly connected to the data selection line 24, and the other end of the element is directly connected to the write word line 20B.

The data selection line 24 is disposed right on the plurality of MTJ elements 23. The upper surface of the data selection line 24 is coated with the yoke material 26 having the high permeability, and the side surfaces of the line are coated with the yoke materials 32 having the high permeability.

The barrier layer 30 is disposed between the data selection line 24 and yoke material 26, and the barrier layer 31 is disposed between the data selection line 24 and yoke material 32. The barrier layer 31 separates the yoke material 26 with which the upper surface of the data selection line 24 is coated from the yoke materials 32 with which the side surfaces of the data selection line 24 are coated.

The barrier layers 30, 31 may have either the conductivity or insulation property. Moreover, the barrier layers 30, 31 may have the same functions as those of the barrier metal 29.

The write word line 20B is disposed right under the MTJ element 23. The lower surface of the write word line 20B is coated with the yoke material 25B1 having the high permeability, and the side surfaces of the line are coated with the yoke material 25B2 having the high permeability.

The barrier layer 28b is disposed between the write word line 20B and yoke material 25B2. The barrier layer 28b separates the yoke material 25B1 with which the lower surface of the write word line 20B is coated from the yoke materials 25B2 with which the side surfaces of the write word line 20B are coated.

The barrier layer 28b may have either the conductivity or insulation property. Moreover, the barrier layer 28b may have the same function as that of the barrier metal 27b.

It is to be noted that in the seventh embodiment the yoke materials 25B1, 25B2, 26, 32, barrier metals 27b, 27d, and barrier layers 28b, 30, 31 may also be constituted of the conductive or insulating materials.

10. Others

In the description of the first, second reference examples, first to seventh embodiments, and manufacturing method, the present invention has been described in terms of the examples of the cell array structure in which the memory cell is constituted of one MTJ element and one read selection switch, ladder type cell array structure, and cross point type cell array structure.

However, the present invention is not limited to the magnetic random access memory of the cell array structure, and can be applied to all the magnetic random access memories including the device structures shown in the first, second reference examples and first to seventh embodiments.

Moreover, the yoke materials on the upper or lower surface of the write line may be separated from the yoke materials on the side surfaces of the write line by the barrier layer. With the yoke material, all or some of the surfaces of the write line excluding the surface on the MTJ element side may also be coated.

As described above, according to the magnetic random access memory of the embodiment of the present invention, since the yoke material on the upper or lower surface of the write line is separated from the yoke material on the side surface by the barrier layer, the film thickness and magnetic domain of the yoke material can easily be controlled. At the write operation time, the synthetic magnetic field can efficiently be exerted to the MTJ element.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A magnetic random access memory comprising: a memory cell which uses a magneto resistive effect; a write line which flows a current for writing data to the memory cell unit, said write line having a first surface and a second surface adjacent to the first surface; a first yoke material which coats the first surface of the write line; and a second yoke material which coats the second surface of the write line; and a barrier layer which separates the first yoke material from the second yoke material, wherein the second surface of the write line is a side surface of the write line and the barrier layer is continuously provided from a portion between the first yoke material and the second yoke material to a portion under the second yoke material.

2. The magnetic random access memory according to claim 1, wherein the memory cell unit comprises a magneto resistive element and a read selection switch connected to the magneto resistive element.

3. The magnetic random access memory according to claim 2, wherein the read switch is one of a MOS transistor and a diode.

4. The magnetic random access memory according to claim 1, wherein the memory cell unit comprises a plurality of magneto resistive elements and a read selection switch connected to the magneto resistive elements.

5. The magnetic random access memory according to claim 4, wherein the read selection switch is one of a MOS transistor and a diode.

6. The magnetic random access memory according to claim 1, wherein the memory cell unit comprises a plurality of magneto resistive elements connected in parallel and a read selection switch connected to the magneto resistive elements, and the magnetic random access memory is a ladder type.

7. The magnetic random access memory according to claim 6, wherein the read selection switch is one of a MOS transistor and a diode.

8. The magnetic random access memory according to claim 1, wherein the memory cell unit comprises a magneto resistive element connected to the write line, and the magnetic random access memory is a cross point type.

9. A magnetic random access memory according to claim 1, wherein the barrier layer is disposed between the first yoke material and the write line and between the second yoke material and the write line.

10. A magnetic random access memory according to claim 1, wherein the barrier layer sandwiches the first and second yoke materials.

11. A magnetic random access memory according to claim 1, wherein the barrier layer is constituted of a conductive material.

12. A magnetic random access memory according to claim 1, wherein the barrier layer comprises an insulating material.

13. A magnetic random access memory according to claim 1, wherein the barrier layer has a function of preventing diffusion of atoms constituting the first and second yoke materials.

14. A magnetic random access memory according to claim 1, wherein the barrier layer comprises a metal including one of Ti and Ta.

15. A magnetic random access memory according to claim 1, wherein the barrier layer comprises SiN.

16. A magnetic random access memory according to claim 1, wherein the barrier layer has a thickness of at least 20 nm.

17. A magnetic random access memory according to claim 1, wherein the first surface is an upper surface of the write line.

18. A magnetic random access memory according to claim 1, wherein the first surface is a lower surface of the write line.

19. A magnetic random access memory according to claim 1, wherein the write line has a function of reading data from the memory cell unit.

20. A magnetic random access memory according to claim 1, further comprising an intermediate layer having a same structure as that of the write line.

* * * * *